(12) United States Patent
Oohata et al.

(10) Patent No.: US 7,564,064 B2
(45) Date of Patent: Jul. 21, 2009

(54) SEMICONDUCTOR LIGHT EMITTING DEVICE, AN INTEGRATED SEMICONDUCTOR LIGHT EMITTING APPARATUS, AN IMAGE DISPLAY APPARATUS, AND AN ILLUMINATING APPARATUS HAVING A SEMICONDUCTOR LAYER WITH CONICAL CRYSTAL PORTION

(75) Inventors: Toyoharu Oohata, Tokyo (JP); Hiroyuki Okuyama, Kanagawa (JP); Masato Doi, Kanagawa (JP); Goshi Biwa, Kanagawa (JP); Jun Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/682,770

(22) Filed: Mar. 6, 2007

(65) Prior Publication Data
US 2007/0147453 A1   Jun. 28, 2007

Related U.S. Application Data

(62) Division of application No. 10/494,972, filed on May 4, 2004, now Pat. No. 7,205,168.

(51) Int. Cl.
*H01L 27/15* (2006.01)

(52) U.S. Cl. ............... 257/79; 257/94; 257/190; 257/103

(58) Field of Classification Search ............ 257/79, 257/94, 190, 103, 82, E21.664, E21.208, 257/E27.104, E29.164; 438/479
See application file for complete search history.

(56) References Cited

U.S. PATENT DOCUMENTS 5,981,977 A * 11/1999 Furukawa et al. ............ 257/94
6,252,261 B1 * 6/2001 Usui et al. ................... 257/190
6,320,209 B1 * 11/2001 Hata et al. ................... 257/190
6,403,451 B1 * 6/2002 Linthicum et al. .......... 438/479
6,520,820 B2 * 2/2003 Kubota et al. ................ 445/24
6,545,738 B2 * 4/2003 Park et al. ................... 349/172

(Continued)

FOREIGN PATENT DOCUMENTS

JP        06-045650        2/1994

(Continued)

OTHER PUBLICATIONS

Japanese Office Action dated Feb. 13, 2007 (3 pages).

(Continued)

*Primary Examiner*—Thao P. Le
(74) *Attorney, Agent, or Firm*—K&L Gates LLP

(57) ABSTRACT

An n-type GaN layer is grown onto a sapphire substrate and a hexagonal etching mask is formed onto the n-type GaN layer as provided. The n-type GaN layer is etched to a predetermined depth by using the etching mask by the RIE method. A hexagonal prism portion whose upper surface is a C plane is formed. After the etching mask was removed, an active layer and a p-type GaN layer are sequentially grown onto the whole surface of the substrate so as to cover the hexagonal prism portion, thereby forming a light emitting device structure. After that, a p-side electrode is formed onto the p-type GaN layer of the hexagonal prism portion and an n-side electrode is formed onto the n-type GaN layer.

10 Claims, 55 Drawing Sheets

U.S. PATENT DOCUMENTS

| | | | |
|---|---|---|---|
| 6,825,499 B2 * | 11/2004 | Nakajima et al. | 257/95 |
| 6,927,164 B2 * | 8/2005 | Biwa et al. | 438/674 |
| 7,072,096 B2 * | 7/2006 | Holman et al. | 359/298 |
| 7,161,652 B2 * | 1/2007 | Yoshihara et al. | 349/188 |
| 7,429,757 B2 * | 9/2008 | Oyama et al. | 257/98 |
| 2002/0046693 A1 * | 4/2002 | Kiyoku et al. | 117/8 |
| 2002/0104999 A1 * | 8/2002 | Nakajima et al. | 257/79 |
| 2002/0117677 A1 * | 8/2002 | Okuyama et al. | 257/94 |
| 2003/0067011 A1 * | 4/2003 | Ando et al. | 257/186 |
| 2003/0147112 A1 * | 8/2003 | Mukawa | 359/15 |

FOREIGN PATENT DOCUMENTS

| | | |
|---|---|---|
| JP | 2001-15811 | 1/2001 |
| JP | 2001-284724 | 10/2001 |
| JP | 2001-358401 | 12/2001 |
| WO | 02/072321 | 1/2002 |

OTHER PUBLICATIONS

Office Action issued by the Japanese Patent Office on May 29, 2007 for corresponding Japanese Application No. 2004-534189.

* cited by examiner

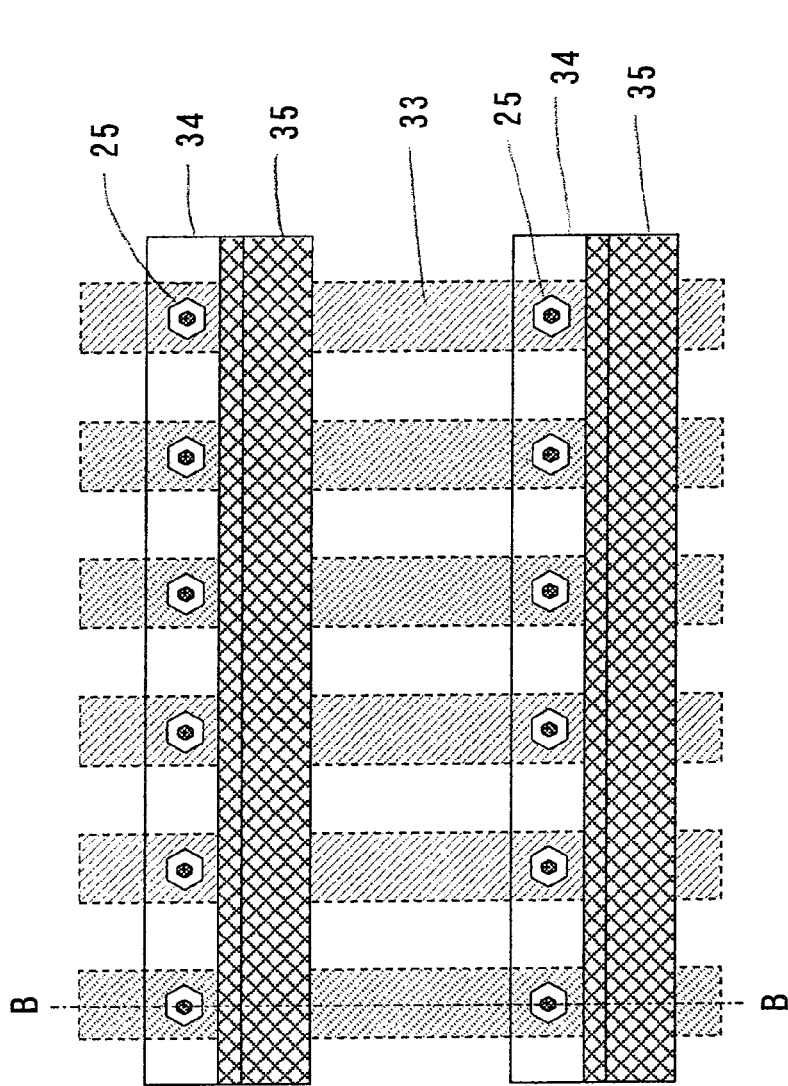
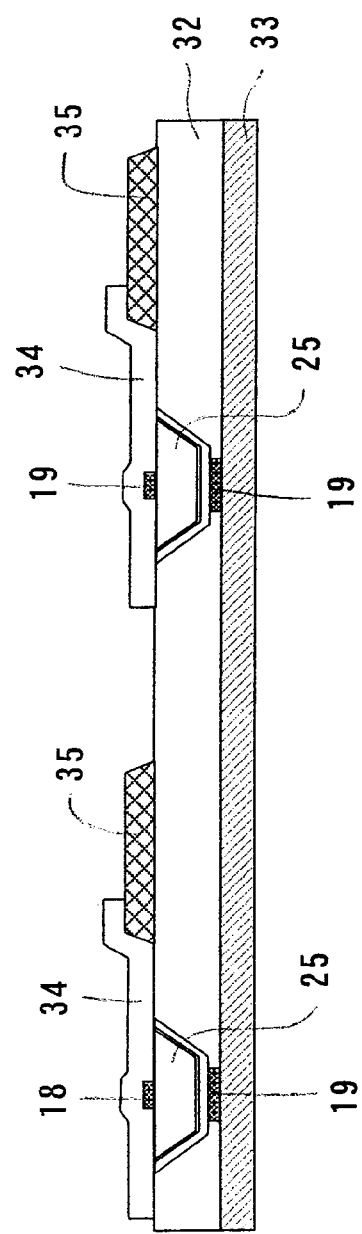
Fig. 61A
Fig. 61B

SEMICONDUCTOR LIGHT EMITTING DEVICE, AN INTEGRATED SEMICONDUCTOR LIGHT EMITTING APPARATUS, AN IMAGE DISPLAY APPARATUS, AND AN ILLUMINATING APPARATUS HAVING A SEMICONDUCTOR LAYER WITH CONICAL CRYSTAL PORTION

CROSS REFERENCES TO RELATED APPLICATIONS

This patent application is a divisional of U.S. patent application Ser. No. 10/494,972, filed on May 4, 2004, which claims priority to Japanese Patent Document No. P2002-261408 filed on Sep. 6, 2002, the disclosure of which is herein incorporated by reference.

BACKGROUND

The present invention relates to a semiconductor light emitting device, its manufacturing method, an integrated semiconductor light emitting apparatus, its manufacturing method, an image display apparatus, its manufacturing method, an illuminating apparatus, and its manufacturing method. More particularly, the present invention is suitable when it is applied to a light emitting diode using a compound semiconductor of a nitride III-V group.

A light emitting diode in which an n-type GaN layer is grown onto a sapphire substrate, a growing mask having a predetermined opening portion is formed onto the n-type GaN layer, a hexagonal conical n-type GaN layer having an inclined crystal plane which is inclined to a principal plane of the substrate is selectively grown onto the n-type GaN layer in the opening portion of the growing mask, and an active layer, a p-type GaN layer, and the like are grown onto the inclined crystal plane has been proposed as a semiconductor light emitting device (for example, refer to a brochure of International Publication No. 02/07231 (pages 47-50, FIGS. 3-9)). According to such a light emitting diode, propagation of through dislocation from the substrate side to the layers to form the device structure can be suppressed and crystalline performance of those layers can be improved, so that high light emitting efficiency can be obtained.

There has been known a technique such that a first thin nitride semiconductor film of an amorphous structure is formed onto a principal plane of a sapphire substrate whose principal plane is a (0001) plane, the film is monocrystallized by a solid phase epitaxial growth, a second thin nitride semiconductor film is vapor phase epitaxial grown onto the monocrystallized film, a mask which is made of a thin silicon dioxide film and in which a numerical aperture is equal to or larger than 50% and a shortest distance from an adjacent window is equal to or less than 100 □m, and which has a plurality of windows for exposing the surface of the second thin nitride semiconductor film is further formed onto the grown second thin nitride semiconductor film, and a microstructure of a nitride semiconductor is vapor phase epitaxial grown onto the second thin nitride semiconductor film exposed into the window portion (for example, JP-A-10-256151 (pages 3-4, FIGS. 1-7)).

However, the method of forming the light emitting device structure by growing the layers to form the device structure onto the inclined crystal plane as mentioned above has a problem such that steps are complicated because the creation of the growing mask, the selective growth, and the like are necessary.

SUMMARY

The present invention relates to a semiconductor light emitting device, its manufacturing method, an integrated semiconductor light emitting apparatus, its manufacturing method, an image display apparatus, its manufacturing method, an illuminating apparatus, and its manufacturing method. More particularly, the present invention is suitable when it is applied to a light emitting diode using a compound semiconductor of a nitride III-V group.

Applicants have discovered that also by growing the layers to form the device structure onto a plane which is parallel with the substrate principal plane instead of growing the layers to form the device structure onto the inclined crystal plane as mentioned above, a semiconductor light emitting device of high light emitting efficiency which is equivalent to that mentioned above can be obtained by simple steps.

In an embodiment, the present invention provides a semiconductor light emitting device and its manufacturing method, wherein light emitting efficiency can be remarkably improved by simple steps without using the crystal growth on the inclined crystal plane as in the conventional manner.

In an embodiment, the present invention provides an image display apparatus and its manufacturing method, wherein light emitting efficiency can be remarkably improved by simple steps without using the crystal growth on the inclined crystal plane as in the conventional manner.

In an embodiment, the present invention is to provide an illuminating apparatus and its manufacturing method, wherein light emitting efficiency can be remarkably improved by simple steps without using the crystal growth on the inclined crystal plane as in the conventional manner.

In an embodiment, the present invention provides a semiconductor light emitting device including:

a semiconductor layer of a first conductivity type in which one principal plane has a prismatic or conical crystal portion having an upper surface that is substantially parallel with the principal plane and a side surface that is substantially perpendicular or inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

It should be appreciated that any semiconductor can be used as materials of the semiconductor layer of the first conductivity type, the active layer, and the semiconductor layer of the second conductivity type. Typically, a semiconductor having a crystal structure of a wurtzite type is used pursuant to an embodiment. As such a semiconductor having the wurtzite crystal structure, besides the nitride III-V group compound semiconductor, a II-VI group compound semiconductor such as BeMgZnCdS compound semiconductor, BeMgZnCdO compound semiconductor, or the like can be mentioned. Most generally, the nitride III-V group compound semiconductor $Al_xB_yGa_{1-x-y-z}In_zAs_uN_{1-u-v}P_v$ (where, $0 \leq x \leq 1$, $0 \leq y \leq 1$, $0 \leq z \leq 1$, $0 \leq u \leq 1$, $0 \leq v \leq 1$, $0 \leq x+y+z<1$, $0 \leq u+v<1$), more specifically, $Al_xB_yGa_{1-x-y-z}In_zN$ (where, $0 \leq x \leq 1$, $0 \leq y \leq 1$, $0 \leq z \leq 1$, $0 \leq x+y+z<1$), and typically, $Al_xGa_{1-x-z}In_zN$ (where, $0 \leq x \leq 1$, $0 \leq z \leq 1$) in an embodiment. As specific examples of the nitride III-V group compound semiconductor, GaN, InN, AlN, AlGaN, InGaN, AlGaInN, and the like can be utilized.

In an embodiment, the prismatic crystal portion of the semiconductor layer of the first conductivity type has a prismatic shape whose upper surface is a C plane, particularly, a hexagonal prism shape whose upper surface is a C plane. Typically, the conical crystal portion of the semiconductor layer of the first conductivity type has a conical shape whose upper surface is a C plane, particularly, a circular cone frustum shape or hexagonal cone frustum shape of a forward taper type or an inverse taper type whose upper surface is a C plane. Preferably, the electrode on the second conductivity type side which is formed onto the semiconductor layer of the second conductivity type is formed while avoiding an outer peripheral corner portion of the upper surface of the prismatic or conical crystal portion which is generally inferior in crystalline performance.

In another embodiment, the present invention provides a manufacturing method of a semiconductor light emitting device, including the steps of:

growing a semiconductor layer of a first conductivity type onto a substrate;

forming an etching mask in a predetermined shape onto the semiconductor layer of the first conductivity type;

forming a prismatic or conical crystal portion by etching the semiconductor layer of the first conductivity type to a predetermined depth by using the etching mask; and sequentially growing at least an active layer and a semiconductor layer of a second conductivity type onto at least the crystal portion.

In an embodiment, dry etching, particularly, a reactive ion etching (RIE) which can perform anisotropic etching is used as etching. Preferably, a metal film, for example, a Ti/Ni laminated film obtained by laminating an Ni film onto a Ti film is used as an etching mask at that time. In the case of performing taper etching, preferably, a mask that includes a resist is used as an etching mask.

As a substrate, in an embodiment, any material can be used so long as the semiconductor layer of the first conductivity type, the active layer, the semiconductor layer of the second conductivity type, and the like can be grown with excellent crystalline performance. For example, a substrate that includes sapphire ($Al_2O_3$) (including a C plane, an A plane, and an R plane), SiC (including 6H, 4H, and 3C), a nitride III-V group compound semiconductor (GaN, InAlGaN, AlN, etc.), Si, Zns, ZnO, LiMgO, GaAs, $MgAl_2O_4$, or the like can be used. Preferably, a hexagonal substrate or a cubic substrate that includes those materials, more preferably, the hexagonal substrate is used. For example, if the semiconductor layer of the first conductivity type, the active layer, and the semiconductor layer of the second conductivity type are made of the nitride III-V group compound semiconductor, the sapphire substrate whose C plane is a principal plane can be used. It is assumed that the C plane mentioned here also includes a crystal plane which is inclined at up to about 5° to 6° to the C plane and can be substantially regarded as a C plane.

In an embodiment, the crystal portion has the upper surface which is substantially parallel with the principal plane of the substrate. The upper surface is typically the C plane.

After the etching mask was removed, before the active layer is grown, preferably, just before the active layer is grown, a second semiconductor layer of the first conductivity type can be also grown onto the semiconductor layer of the first conductivity type. By this method, the following advantages can be obtained. First, if the active layer is directly grown after the etching mask was removed, since an oxide film or the like exists on an interface of the active layer and the semiconductor layer of the second conductivity type as an underlayer, an adverse influence is exerted on the light emitting characteristics or the like of the active layer. However, first, after the second semiconductor layer of the first conductivity type was grown, if the active layer is grown onto the second semiconductor layer, the active layer can be grown onto a clean surface where the oxide film or the like does not exist, and such a problem can be prevented. When the substrate is exposed into the atmosphere in order to remove the etching mask, the surface of the semiconductor layer of the first conductivity type is oxidized and the oxide film is uniformly formed. When the active layer is grown, it is difficult to grow in a portion where an amount of oxide film is large and the active layer in a portion where an amount of oxide film is small is grown first, so that unevenness is easily caused on the surface of the active layer. However, as mentioned above, if the active layer can be grown onto the semiconductor layer of the first conductivity type, the active layer can be grown onto the clean surface where the oxide film or the like does not exist, so that flatness of the surface of the active layer can be improved. For example, if the semiconductor layer of the first conductivity type, the active layer, and the semiconductor layer of the second conductivity type are made of the nitride III-V group compound semiconductor, for example, the nitride III-V group compound semiconductor such as GaN, InGaN, AlGaN, AlGaInN, or the like can be used as a material of the second semiconductor layer of the first conductivity type.

It is also possible to construct in a manner such that after the prismatic or conical crystal portion was formed by etching the semiconductor layer of the first conductivity type to the predetermined depth by using the etching mask, before at least the active layer and the semiconductor layer of the second conductivity type are grown, a growing mask is formed in the whole or a part of the surface of the etched portion.

It is also possible to construct in a manner such that after at least the active layer and the semiconductor layer of the second conductivity type were sequentially grown, by removing the substrate and, subsequently, etching the semiconductor layer of the first conductivity type from the back surface thereof, the crystal portion is separated. By this method, the device can be remarkably easily separated, microminiaturization of the device can be easily performed, and manufacturing costs can be reduced.

At least the active layer and the semiconductor layer of the second conductivity type can be also grown until they are closed at a vertex.

As a growing method of the semiconductor layer of the first conductivity type, the second semiconductor layer of the first conductivity type, the active layer, and the semiconductor layer of the second conductivity type, for example, an organometallic chemical vapor phase epitaxy (MOCVD), a hydride vapor phase epitaxial growth, or a halide vapor phase epitaxial growth (HVPE), or the like can be used.

In yet another embodiment, the present invention provides an integrated semiconductor light emitting apparatus obtained by integrating a plurality of semiconductor light emitting devices each comprising:

a semiconductor layer of a first conductivity type in which one principal plane has a prismatic or conical crystal portion having an upper surface that is substantially parallel with the principal plane and a side surface that is substantially perpendicular or inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

Although applications of the integrated semiconductor light emitting apparatus are not limited, an image display apparatus, an illuminating apparatus, and the like can be included as typical applications in an embodiment.

In still yet another embodiment, the present invention provides a manufacturing method of an integrated semiconductor light emitting apparatus, comprising the steps of:

growing a semiconductor layer of a first conductivity type onto a substrate;

forming an etching mask in a predetermined shape onto the semiconductor layer of the first conductivity type;

forming a prismatic or conical crystal portion by etching the semiconductor layer of the first conductivity type to a predetermined depth by using the etching mask; and sequentially growing at least an active layer and a semiconductor layer of a second conductivity type onto at least the crystal portion.

In a further embodiment, the present invention provides an image display apparatus obtained by integrating a plurality of semiconductor light emitting devices each comprising:

a semiconductor layer of a first conductivity type in which one principal plane has a prismatic or conical crystal portion having an upper surface that is substantially parallel with the principal plane and a side surface that is substantially perpendicular or inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

In yet a further embodiment, the present invention provides a manufacturing method of an image display apparatus, comprising the steps of:

growing a semiconductor layer of a first conductivity type onto a substrate;

forming an etching mask in a predetermined shape onto the semiconductor layer of the first conductivity type;

forming a prismatic or conical crystal portion by etching the semiconductor layer of the first conductivity type to a predetermined depth by using the etching mask; and sequentially growing at least an active layer and a semiconductor layer of a second conductivity type onto at least the crystal portion.

In still yet a further embodiment, the present invention provides an illuminating apparatus obtained by integrating a plurality of semiconductor light emitting devices each comprising:

a semiconductor layer of a first conductivity type in which one principal plane has a prismatic or conical crystal portion having an upper surface that is substantially parallel with the principal plane and a side surface that is substantially perpendicular or inclined to the principal plane;

at least an active layer and a semiconductor layer of a second conductivity type, which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

In another embodiment, the present invention provides a manufacturing method of an illuminating apparatus, comprising the steps of:

growing a semiconductor layer of a first conductivity type onto a substrate;

forming an etching mask in a predetermined shape onto the semiconductor layer of the first conductivity type;

forming a prismatic or conical crystal portion by etching the semiconductor layer of the first conductivity type to a predetermined depth by using the etching mask; and sequentially growing at least an active layer and a semiconductor layer of a second conductivity type onto at least the crystal portion.

In the second to eighth inventions of the invention, the contents described in association with the first invention are satisfied so long as they are not contrary to their nature.

According to various embodiments of the present invention constructed as mentioned above, the crystalline performance of each of the active layer and the semiconductor layer of the second conductivity type which are grown onto the upper surface, particularly, the C plane of the prismatic or conical crystal portion of the semiconductor layer of the first conductivity type is very good. Therefore, in the case where the electrode on the second conductivity type side is formed onto the semiconductor layer of the second conductivity type, when the device is driven by supplying a current to a portion between the electrode on the second conductivity type side and the electrode on the first conductivity type side, the light emission can be caused only from the active layer of the excellent crystalline performance.

Additional features and advantages of the present invention are described in, and will be apparent from, the following Detailed Description of the Invention and the figures.

BRIEF DESCRIPTION OF THE FIGURES

FIGS. 61A and 61B are a plan view and a cross sectional view for explaining a manufacturing method of a simple matrix driving type display according to the 32nd embodiment of the invention.

DETAILED DESCRIPTION

Figure 1A:
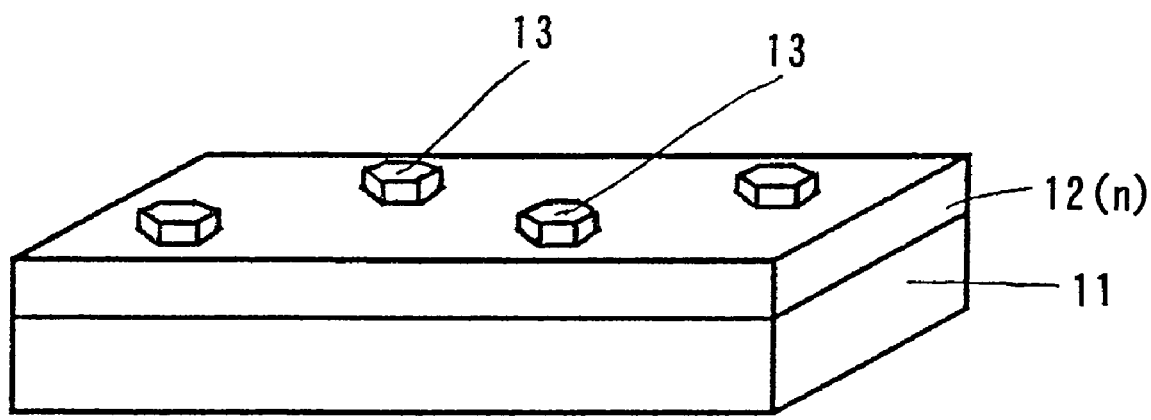
FIGS. 1A and 1B are a perspective view and a cross sectional view for explaining a manufacturing method of a GaN light emitting diode according to the first embodiment of the invention.

The present invention relates to a semiconductor light emitting device, its manufacturing method, an integrated semiconductor light emitting apparatus, its manufacturing method, an image display apparatus, its manufacturing method, an illuminating apparatus, and its manufacturing method. More particularly, the present invention is suitable when it is applied to a light emitting diode using a compound semiconductor of a nitride III-V group.

Embodiments of the present invention will now be described hereinbelow with reference to the drawings. In all diagrams of the embodiments, the same or corresponding portions are designated by the same reference numerals.

FIGS. 1A, 1B, 2A, 2B, 3A, 3B, 4A, 4B, 5A, 5B, 6A, and 6B show a manufacturing method of a GaN light emitting diode according to the first embodiment of the invention in order of steps. FIGS. 1A, 2A, 3A, 4A, 5A, and 6A are perspective views. FIGS. 1B, 2B, 3B, 4B, 5B, and 6B are cross sectional views. FIG. 7B is a cross sectional view showing a complete state of the GaN light emitting diode.

Figure 1B:
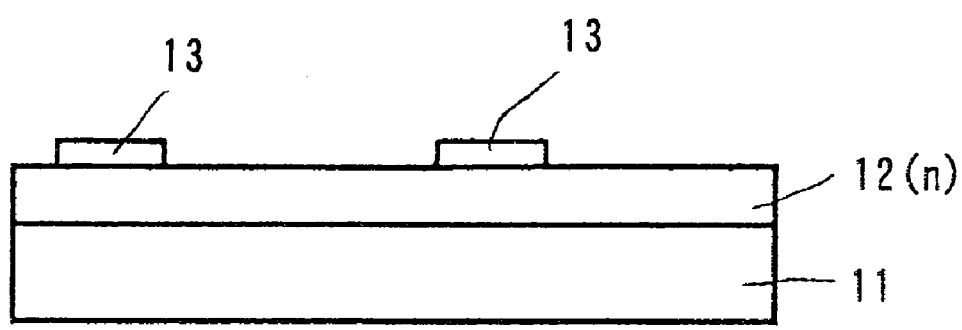

In the first embodiment, as shown in FIGS. 1A and 1B, first, for example, a sapphire substrate 11 whose principal plane is a C+ plane is prepared and its surface is cleaned by thermal cleaning or the like. After that, an n-type GaN layer 12 in which, for example, Si has been doped as n-type impurities is grown onto the sapphire substrate 11 by, for example, an organometallic chemical vapor phase epitaxy (MOCVD) method. Although the MOCVD can be executed at any of a normal pressure, a reduced pressure, and a high pressure, it can be easily performed at the normal pressure. As an n-type GaN layer 12, it is desirable to use a layer in which a crystal defect, particularly, through dislocation is small as possible. It is ordinarily sufficient that a thickness of the layer 12 is equal to or larger than, for example, about 2 μm. However, it is desirable to set the thickness to be slightly thicker by considering that etching is executed by RIE later. There are various methods of forming the n-type GaN layer 12 of a low defect. As a general method, there is a method whereby, first, a GaN buffer layer or an AlN buffer layer (not shown) is grown onto the sapphire substrate 11 at a low temperature of, for example, about 500° C., thereafter, the temperature is elevated to about 1000° C., the layer is crystallized, and subsequently, the n-type GaN layer 12 is grown thereon.

Subsequently, a Ti film and an Ni film each having a thickness of, for example, about 100 nm are sequentially formed onto the whole surface of the n-type GaN layer 12 by, for example, a vacuum evaporation depositing method, a sputtering method, or the like. After that, a resist pattern (not shown) in a predetermined shape is formed thereon by lithography. The Ti/Ni laminated film is etched by, for example, an RIE method by using the resist pattern as a mask. Etching masks 13 each that includes the hexagonal Ti/Ni laminated film are formed at device forming positions. It is desirable that one side of the etching mask 13 is parallel with the <11-20> direction. A diameter of the hexagonal etching mask 13 is determined as necessary. For example, it is set to about 10 μm.

Figure 2A:
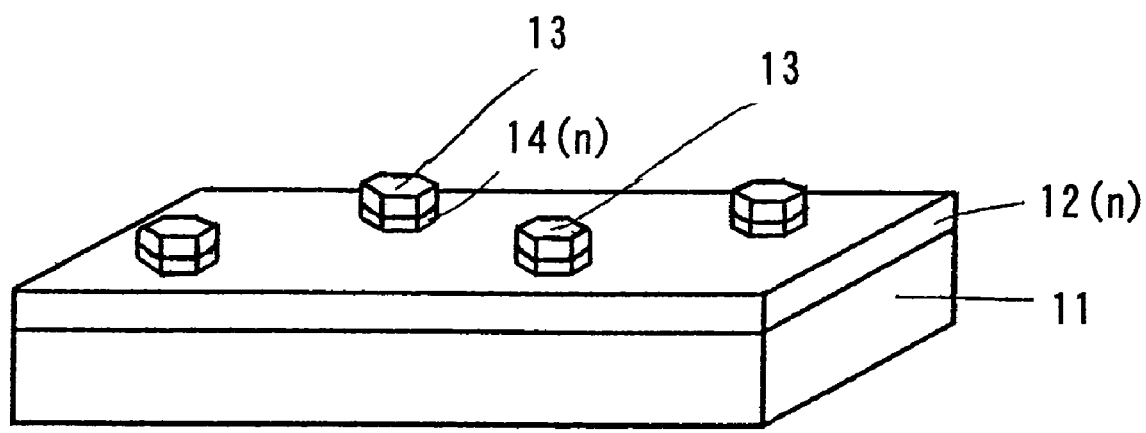
FIGS. 2A and 2B are a perspective view and a cross sectional view for explaining the manufacturing method of the GaN light emitting diode according to the first embodiment of the invention.
Figure 2B:
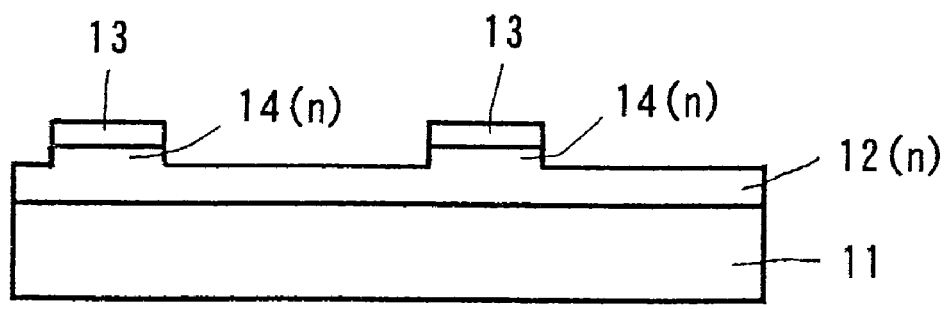

Subsequently, as shown in FIGS. 2A and 2B, the n-type GaN layer 12 is etched to a predetermined depth in the direction which is perpendicular to the substrate surface by the RIE method using, for example, a chlorine etching gas by using the etching mask 13, thereby forming hexagonal prism portions 14. The etching depth is selected in accordance with a value of an aspect ratio (=height/width) of the obtained hexagonal prism portion 14. Although it is inherently desirable to set the aspect ratio to a large value (for example, about 5) from a view point of raising light emitting efficiency or the like, if the diameter is large, since the thickness of the n-type GaN layer 12 also proportionally increases and a time and costs which are required for the epitaxial growth increase, it is necessary to set the diameter in consideration of such drawbacks. For example, when considering the case where the diameter of the hexagonal etching mask 13 is equal to about 10 μm as mentioned above, preferably, the aspect ratio of the hexagonal prism portion 14 is selected so as to be a value in a range from about 0.2 to about 1.0. At this time, the etching depth is equal to about 2 to about 10 μm. Particularly, a relatively small aspect ratio is selected and set to about 0.2 to about 0.3 here. In this case, the etching depth is equal to about 2 to about 3 μm. It is necessary to set the thickness of n-type GaN layer 12 to be sufficiently thicker than the etching depth.

Figure 3A:
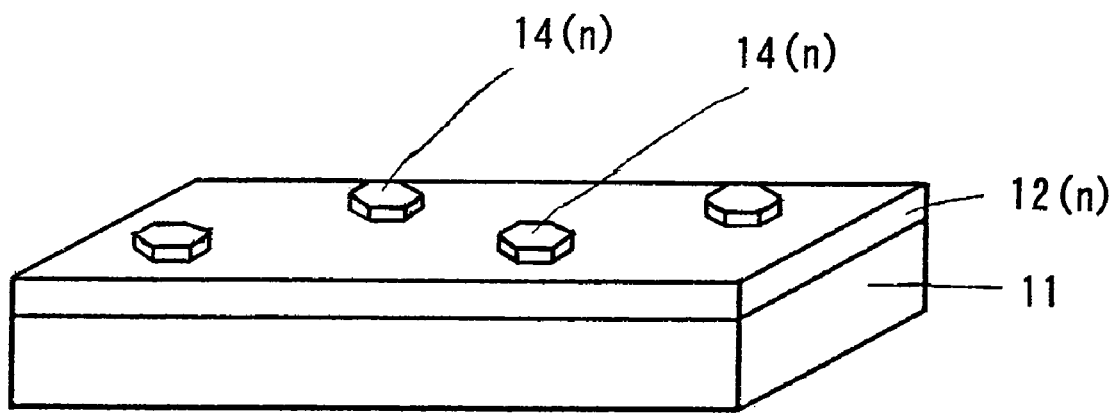
FIGS. 3A and 3B are a perspective view and a cross sectional view for explaining the manufacturing method of the GaN light emitting diode according to the first embodiment of the invention.
Figure 3B:
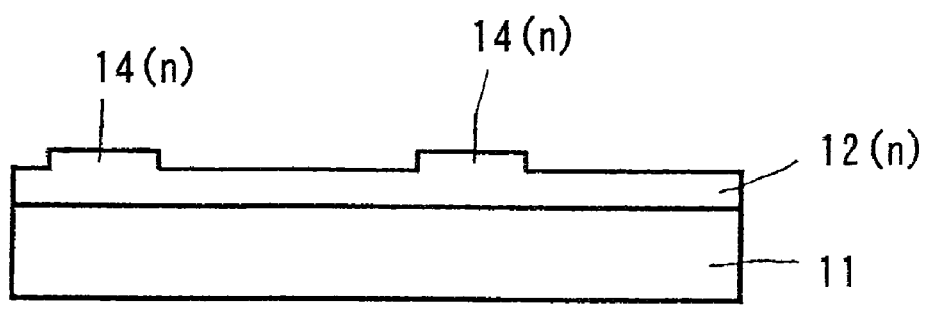

Subsequently, the etching mask 13 is etching-removed by, for example, the RIE method or the like. Thus, as shown in FIGS. 3A and 3B, a GaN processed substrate formed with the hexagonal prism portions 14 in each of which the upper surface is a C plane is obtained on the surface of the n-type GaN layer 12.

Figure 4A:
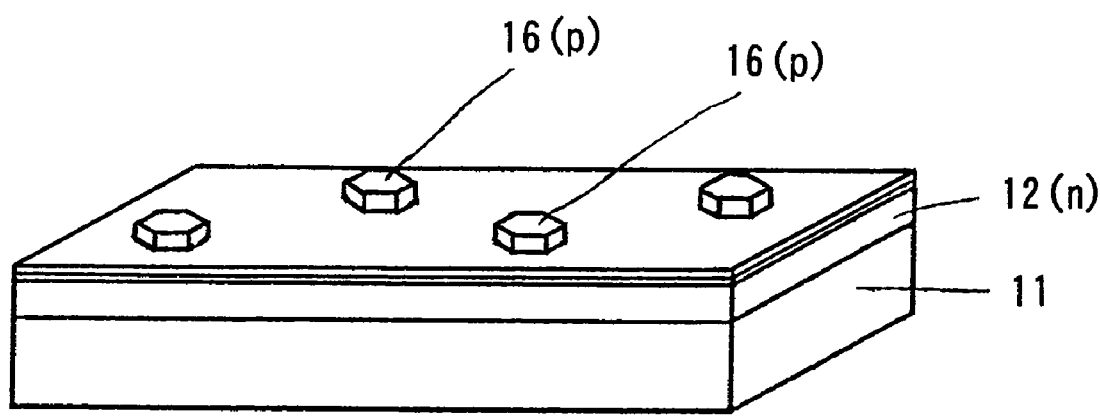
FIGS. 4A and 4B are a perspective view and a cross sectional view for explaining the manufacturing method of the GaN light emitting diode according to the first embodiment of the invention.
Figure 4:
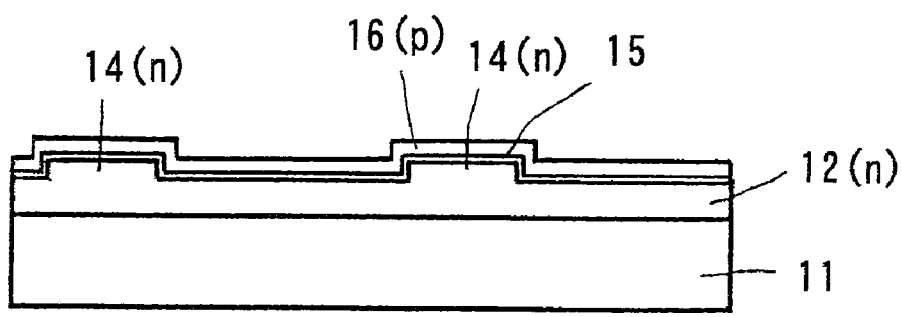

Subsequently, the GaN processed substrate is inserted into a reaction pipe of an MOCVD apparatus. Thermal cleaning is performed in the reaction pipe, for example, for 1 to 2 minutes, thereby cleaning the surface. Subsequently, as shown in FIGS. 4A and 4B, an active layer 15 of, for example, InGaN system and a p-type GaN layer 16 in which, for example, Mg has been doped as p-type impurities are sequentially grown onto the GaN processed substrate. Thus, a light emitting diode structure of a double hetero structure is formed by: the hexagonal prism portion 14 of the n-type GaN layer 12; and the active layer 15 and the p-type GaN layer 16 which were grown on the upper surface that includes the C plane of the hexagonal prism portion 14. A thickness of each the active layer 15 and the p-type GaN layer 16 is determined as necessary. The thickness of the active layer 15 is set to, for example, about 3 nm. The thickness of the p-type GaN layer 16 is set to, for example, 0.2 µm. Growing temperatures of those GaN semiconductor layers are as follows. The growing temperature of the active layer 15 is set to, for example, about 650 to about 800° C., typically, set to, for example, about 700° C. The growing temperature of the p-type GaN layer 16 is set to about 800 to about 1050° C., preferably, set to about 850 to about 900° C. The active layer 15 can be made of, for example, a single InGaN layer or can be also made of, for example, a multiple quantum well structure in which two InGaN layers whose In compositions are different are alternately laminated. Those In compositions are determined in accordance with a light emitting wavelength to be set. In the p-type GaN layer 16, preferably, an Mg concentration of the top layer is raised so that an excellent ohmic contact with a p-side electrode, which will be explained hereinafter, can be obtained. It is also possible that a p-type InGaN layer in which the ohmic contact can be more easily obtained and, for example, Mg has been doped as p-type impurities is grown as a p-type contact layer onto the p-type GaN layer 16 and a p-side electrode is formed on the p-type InGaN layer. It is also possible that, as necessary, just before the active layer 15 is grown, first, an n-type GaN layer in which, for example, Si has been doped as n-type impurities is thinly grown onto the GaN processed substrate and, subsequently, the active layer 15 is grown onto the n-type GaN layer. By this method, since the active layer 15 can be grown onto the clean surface of the n-type GaN layer, the active layer 15 having the excellent crystalline performance can be certainly obtained. When the hexagonal prism portion 14 is formed by the RIE method, even if the side surface becomes a rough state since the unevenness of the side surface is embedded and the side surface becomes a flat surface in association with the growth of the n-type GaN layer, the active layer 15 can be grown onto the flat surface of the n-type GaN layer. In this case, it has experimentally been found out that upon growing of the n-type GaN layer, it is preferable to first start the growth from a growing temperature of about 850° C., gradually elevate the growing temperature after that, and set it to about 950° C. As an easiest method, the n-type GaN layer can be grown at a temperature of, for example, about 1020° C.

When the growth of the GaN semiconductor layer is executed at the growing temperature of about 1000° C., it is generally necessary to remarkably increase a supply amount of raw materials of Ga (for example, 100 µmol/min or more).

As growing raw materials of the GaN semiconductor layer, for example, trimethylgallium ($(CH_3)_3Ga$, TMG) is used as a raw material of Ga, trimethylaluminum ($(CH_3)_3Al$, TMA) is used as a raw material of Al, trimethylindium ($(CH_3)_3$ in, TMI) is used as a raw material of In, and $NH_3$ is used as a raw material of N. With respect to a dopant, for example, silane ($SiH_4$) is used as an n-type dopant and, for example, bis=methylcyclopentadienyl magnesium ($(CH_3C_5H_4)_2Mg$) or bis=cyclopentadienyl magnesium ($(C_5H_5)_2Mg$) is used as a p-type dopant.

As a carrier gas atmosphere upon growing of the GaN semiconductor layer mentioned above, mixture gases of $N_2$ and $H_2$ are used for the n-type GaN layer 12, an $N_2$ gas atmosphere is used for the active layer 15, and mixture gases of $N_2$ and $H_2$ are used for the p-type GaN layer 16. In this case, since the $N_2$ atmosphere is used as a carrier gas atmosphere upon growing of the active layer 15 and $H_2$ is not contained in the carrier gas atmosphere, elimination of In can be suppressed and deterioration of the active layer 15 can be prevented. Since the carrier gas atmosphere is set to the mixture gases of $N_2$ and $H_2$ upon growing of the p-type GaN layer 16, the p-type GaN layer 16 can be grown with the excellent crystalline performance.

Subsequently, the sapphire substrate 11 in which the GaN semiconductor layer has been grown as mentioned above is taken out of the MOCVD apparatus.

Subsequently, a resist pattern (not shown) which covers the surfaces of the p-type GaN layers 16 in the area excluding the hexagonal prism portions 14 of the n-type GaN layer 12 and the n-side electrode forming area in another portion is formed by the lithography.

Figure 5A:
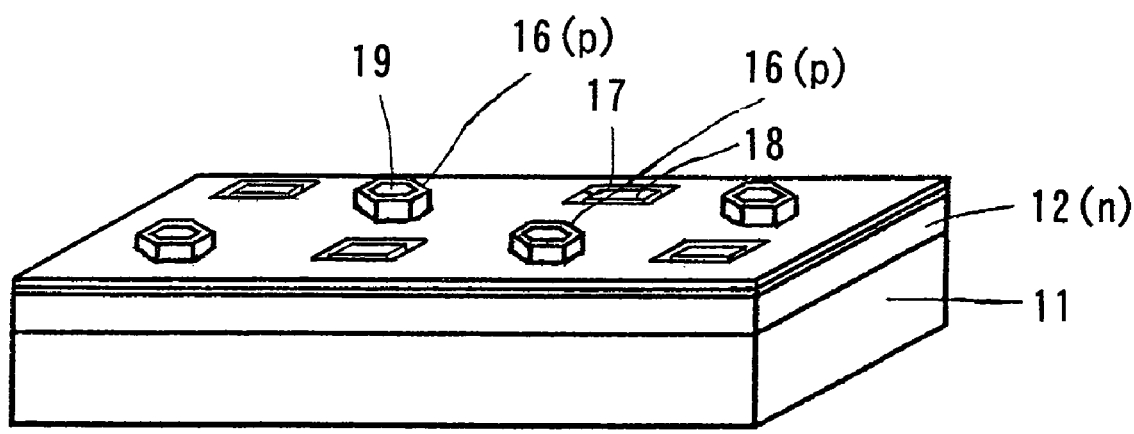
FIGS. 5A and 5B are a perspective view and a cross sectional view for explaining the manufacturing method of the GaN light emitting diode according to the first embodiment of the invention.
Figure 5B:
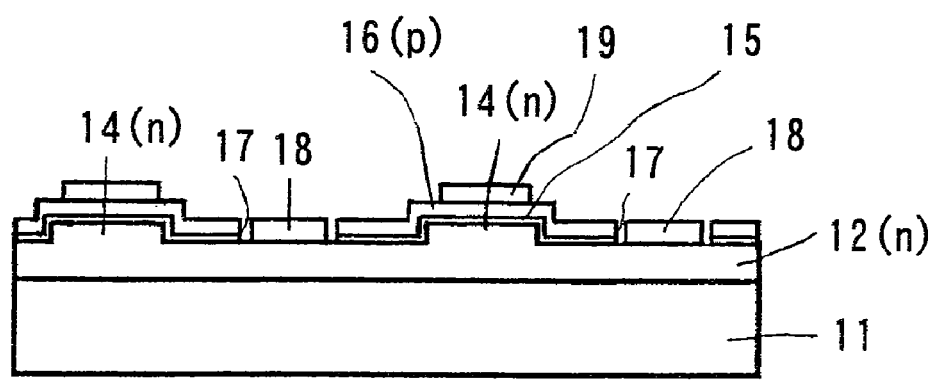

Subsequently, as shown in FIGS. 5A and 5B, opening portions 17 are formed by etching the p-type GaN layers 16 and the active layer 15 by, for example, the RIE method by using the resist pattern as a mask, and the n-type GaN layer 12 is exposed in the opening portions 17. After that, the resist pattern is removed.

Subsequently, after a Ti film, a Pt film, and an Au film were sequentially formed onto the whole surface of the substrate by, for example, the vacuum evaporation depositing method, a resist pattern in a predetermined shape is formed thereon by the lithography. The Ti film, the Pt film, and the Au film are etched by using the resist pattern as a mask. Thus, n-side electrodes 18 of a Ti/Pt/Au structure each of which is in contact with the n-type GaN layer 12 via the opening portion 17 of the p-type GaN layer 16 and the active layer 15 are formed.

Subsequently, similarly, a p-side electrode 19 of, for example, an Ni/Pt/Au structure is formed onto the upper surface of the active layer 15 and the p-type GaN layers 16 grown on the upper surface that includes the C plane of the hexagonal prism portions 14 of the n-type GaN layer 12. Preferably, the p-side electrode 19 is formed so as to avoid a portion over a corner portion between the upper surface and the side surface of the hexagonal prism portions 14. This is because the crystalline performance of each of the active layer 15 and the p-type GaN layers 16 near the corner portion is often inferior to that of the other portion.

Figure 6A:
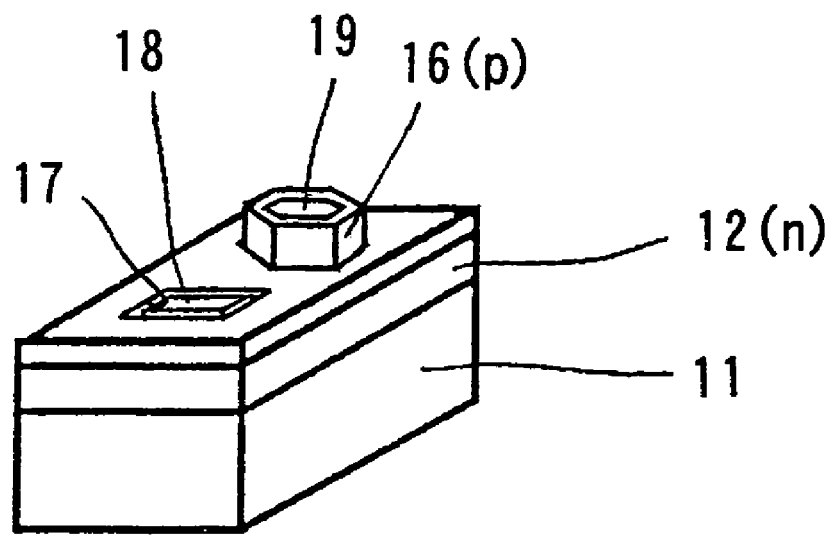
FIGS. 6A and 6B are a perspective view and a cross sectional view for explaining the manufacturing method of the GaN light emitting diode according to the first embodiment of the invention.
Figure 6B:
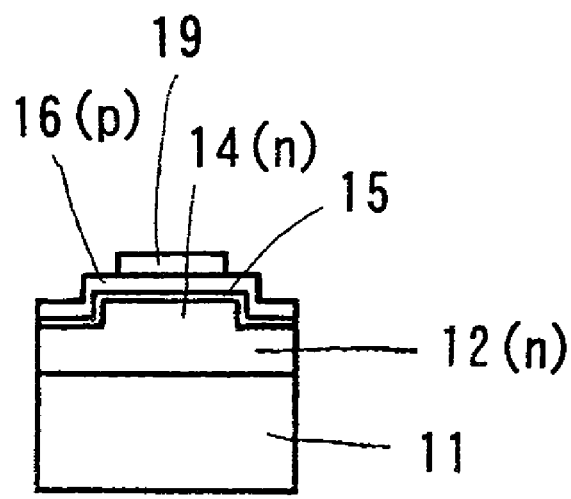
Figure 7:
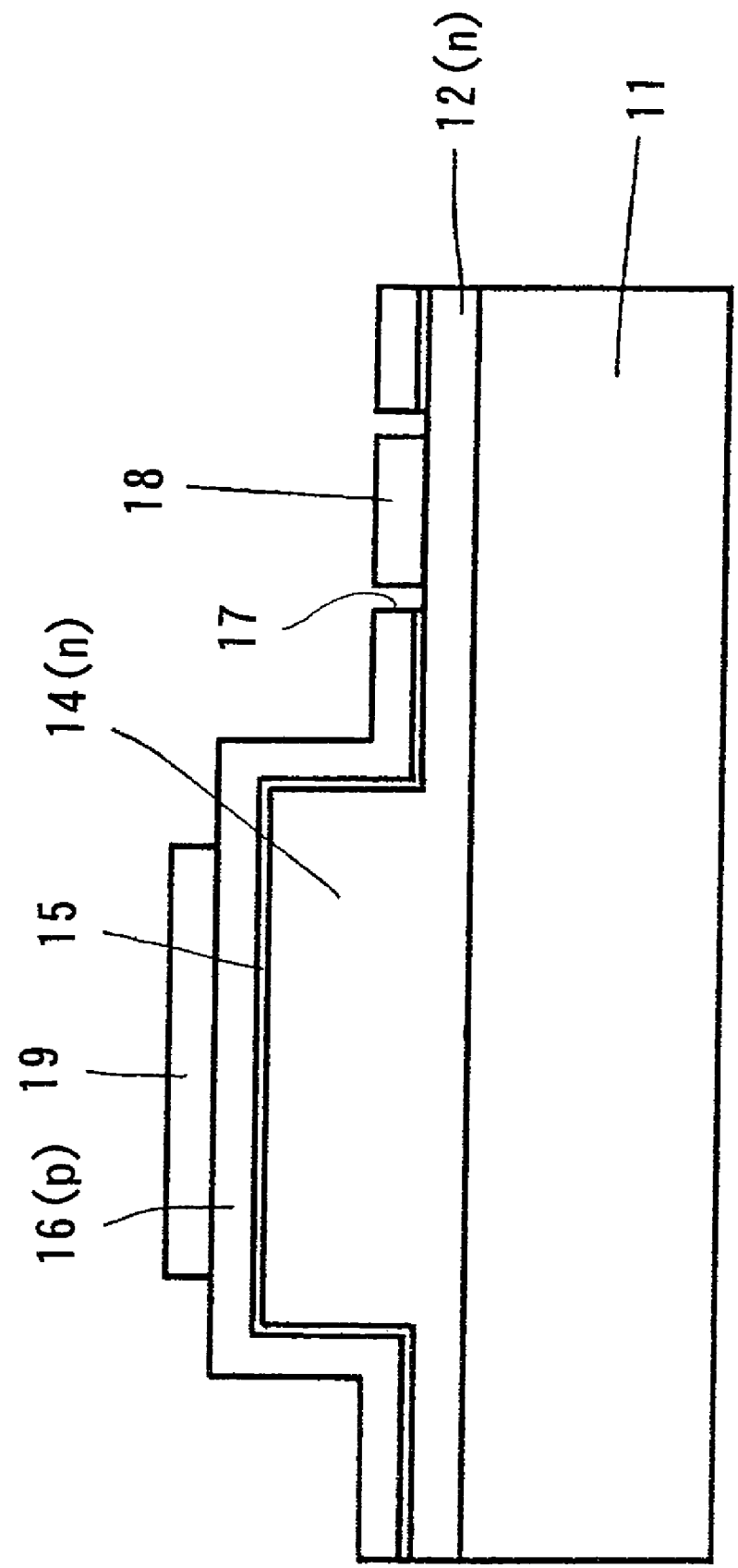
FIG. 7 is a cross sectional view of the GaN light emitting diode according to the first embodiment of the invention.

After that, the substrate on which the light emitting diode structure has been formed as mentioned above is constructed as a chip shape by the etching according to the RIE, a daisa, or the like. The chip-shaped GaN light emitting diode is shown in FIGS. 6A and 6B. FIG. 7 shows a cross sectional view of the GaN light emitting diode in a complete state.

A current was supplied between the p-side electrode 19 and the n-side electrodes 18 of the GaN light emitting diode manufactured as mentioned above and the diode was driven. Thus, the light emission via the sapphire substrate 11 could be confirmed in a range of the light emitting wavelength of 380 to 620 nm according to the In composition of the active layer 15.

According to the first embodiment as mentioned above, since the hexagonal prism portion 14 whose upper surface consists of the C plane is formed in the n-type GaN layer 12 and the active layer 15 and the p-type GaN layers 16 are grown on the upper surface that includes the C plane of the hexagonal prism portion 14, the very excellent crystalline performance of each of the active layer 15 and the p-type GaN layer 16 can be obtained. Since the p-side electrode 19 is formed onto the upper surface that includes the C plane of the p-type GaN layer 16 grown over the upper surface of the hexagonal prism portion 14 so as to be away from the peripheral corner portion, the light emission can be caused only from the active layer 15 of the very excellent crystalline performance. Thus, high light emitting efficiency can be obtained.

Further, if the opening portion 17 is formed in the p-type GaN layer 16 and the active layer 15 by dry etching such as RIE in order to form the n-side electrode 18 or if the p-type GaN layers 16 and the active layer 15 are etched by dry etching such as RIE in order to separate the devices in the case of manufacturing the integrated semiconductor light emitting apparatus, it is difficult to avoid the occurrence of a damage in the active layer 15 in such a portion. However, since the portion where the damage occurs is sufficiently away from the portion where the light emission occurs actually (the p-side electrode 19 and a range of 2 to 5 µm near it), no adverse influence is exerted on the light emitting characteristics.

By setting a height of step of the hexagonal prism portion 14 of the n-type GaN layer 12 to a certain value, the light emitted from the active layer 15 on the upper surface of the hexagonal prism portion 14 can be downwardly reflected by the side surface of the hexagonal prism portion 14. Extracting efficiency of the light can be raised and the light emitting efficiency can be raised. Further, by using a metal film having high reflectance, for example, a silver (Ag) film or the like as a p-side electrode 19 in place of using the film of the Ni/Pt/Au structure, the reflectance in the upper surface of the p-type GaN layer 17 over the hexagonal prism portion 14 can be raised, the extracting efficiency of the light can be raised, and the light emitting efficiency can be raised. Particularly, by increasing the aspect ratio of the hexagonal prism portion 14, the light emitting efficiency can be raised more.

In the conventional GaN light emitting diode which has already been mentioned, when the hexagonal-cone-shaped n-type GaN layer having the inclined crystal plane which is inclined to the principal plane of the substrate is selectively grown onto the n-type GaN layer in the opening portion of the growing mask made of silicon oxide ($SiO_2$) or silicon nitride (SiN) and the active layer, the p-type GaN layer, and the like are grown onto the inclined crystal plane while leaving the growing mask, the selective growth of the n-type GaN layer and the subsequent growth of the p-type GaN layer are executed at a high temperature of about 1000° C. Therefore, a phenomenon such that silicon (Si) and oxygen (O) are eliminated from the surface of the growing mask at the time of growing and fetched into the growing layer near the opening portion occurs. An influence which is exerted by such a phenomenon is particularly remarkable at the time of growing of the p-type GaN layer. It has been found that if Si which acts as n-type impurities on GaN is fetched into the growing layer at the time of growing of the p-type GaN layer, the layer is difficult to become the p-type, and even if it became the p-type, both hole concentration and mobility extremely decrease, and it becomes a cause of obstruction of the improvement of the light emitting efficiency of the light emitting diode. Further, although the photolithography step is needed when the opening portion of the growing mask is formed, at this time, a step of closely adhering the resist onto the mask surface and partially removing the resist is necessary. When it is removed, however, the resist easily remains in a microgap of the growing mask and it is extremely difficult to remove it. There is, consequently, a case where at the time of high-temperature growth which is executed later, the residual resist becomes an impurity source and deteriorates the characteristics of the p-type GaN layer or the like. On the other hand, in the first embodiment, since the selective growth using the growing mask is not executed, when the active layer 15 and the p-type GaN layer 16 are grown, the growing mask that includes $SiO_2$, SiN, or the like never exists. Therefore, the problem such that Si is eliminated from the growing mask and fetched into the growing layer upon growing of the p-type GaN layer 16 does not exist essentially. A problem of pollution due to the resist does not exist essentially either. Thus, the p-type GaN layer 16 in which Mg has sufficiently been doped can be obtained and, eventually, the light emitting efficiency of the GaN light emitting diode can be improved.

A manufacturing method of a GaN light emitting diode according to the second embodiment of the invention will now be described.

Figure 8:
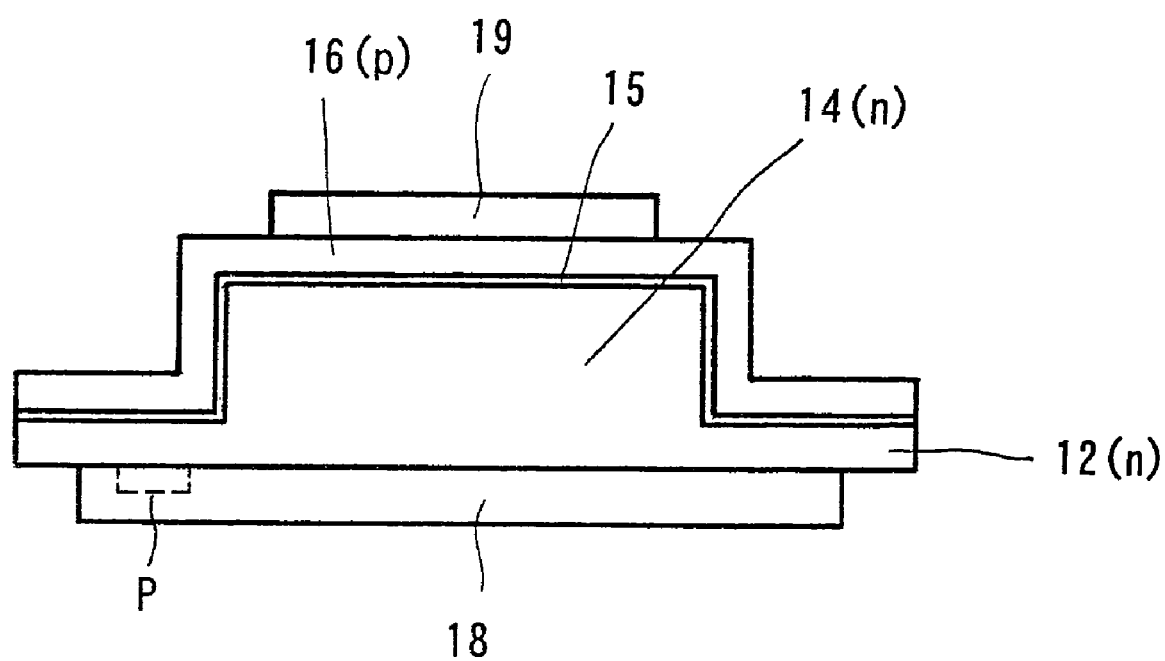
FIG. 8 is a cross sectional view of a GaN light emitting diode according to the second embodiment of the invention.
Figure 9:
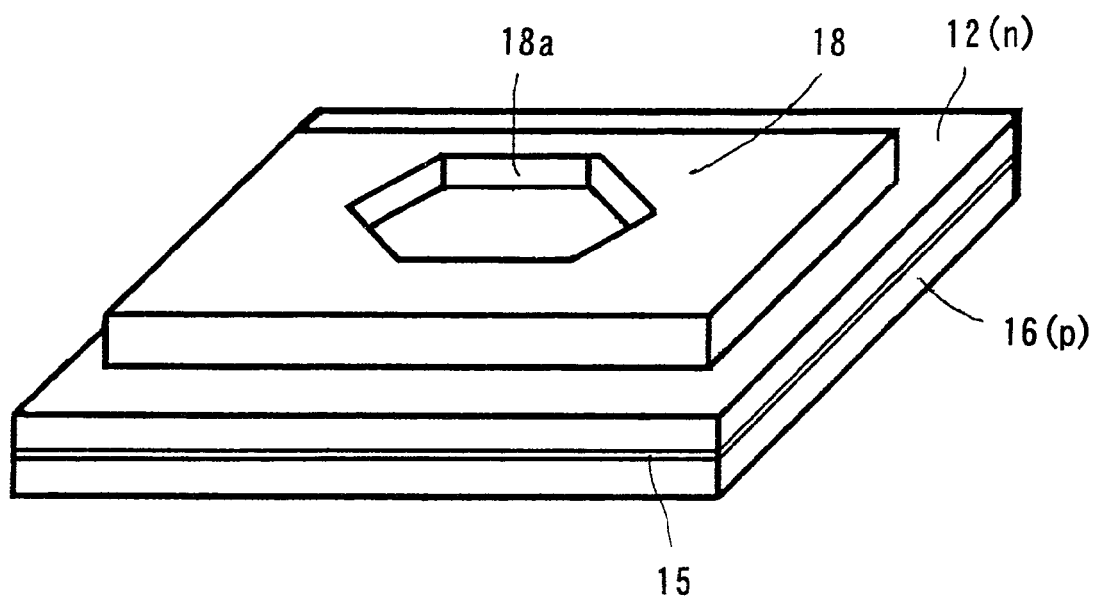
FIG. 9 is a perspective view of the GaN light emitting diode according to the second embodiment of the invention when it is seen from an n-side electrode.

In the second embodiment, the steps are progressed and up to the process to grow the p-type GaN layer 16 is executed in a manner similar to the first embodiment and, thereafter, the p-side electrode 19 is formed onto the p-type GaN layer 16. Subsequently, by irradiating a laser beam by, for example, an excimer laser or the like from the back surface side of the sapphire substrate 11, the n-type GaN layer 12 and the portions existing on/over it are peeled off from the sapphire substrate 11. After the back surface of the n-type GaN layer 12 peeled off as mentioned above was flattened by etching or the like, the n-side electrode 18 is formed onto the back surface of the n-type GaN layer 12 as shown in FIG. 8. A transparent electrode that includes, for example, ITO or the like can be used as an n-side electrode 18. In this case, the n-side electrode 18 can be formed onto the back surface of a wide area of the n-type GaN layer 12 including the portion corresponding to the portion in the hexagonal cone shape. In the case of using the transparent electrode that includes ITO or the like as an n-side electrode 18 as mentioned above, in order to enable the ohmic contact with the n-type GaN layer 12 to be more preferably obtained, desirably, a pad P of, for example, the Ti/Au structure is formed in a portion on the back surface of the n-type GaN layer 12 where no problem occurs when the light is extracted, and the transparent electrode is formed onto such a back surface so as to cover the pad P. In the pad P of the Ti/Au structure, a thickness of Ti film is set to, for example, about 10 nm and a thickness of Au film is set to, for example, about 100 nm. In the case of forming the n-side electrode 18 by a metal laminated film of a Ti/Pt/Au structure, in order to allow the light to be irradiated to the outside via the n-type GaN layer 12, an opening portion 18a is formed in the n-side electrode 18 in the portion corresponding to the hexagonal prism portion 14 as shown in FIG. 9.

A construction other than the above construction is similar to that of the first embodiment.

According to the second embodiment, advantages similar to those of the first embodiment can be obtained.

An image display apparatus according to the third embodiment of the present invention will now be described. The image display apparatus is shown in FIG. 10.

Figure 10:
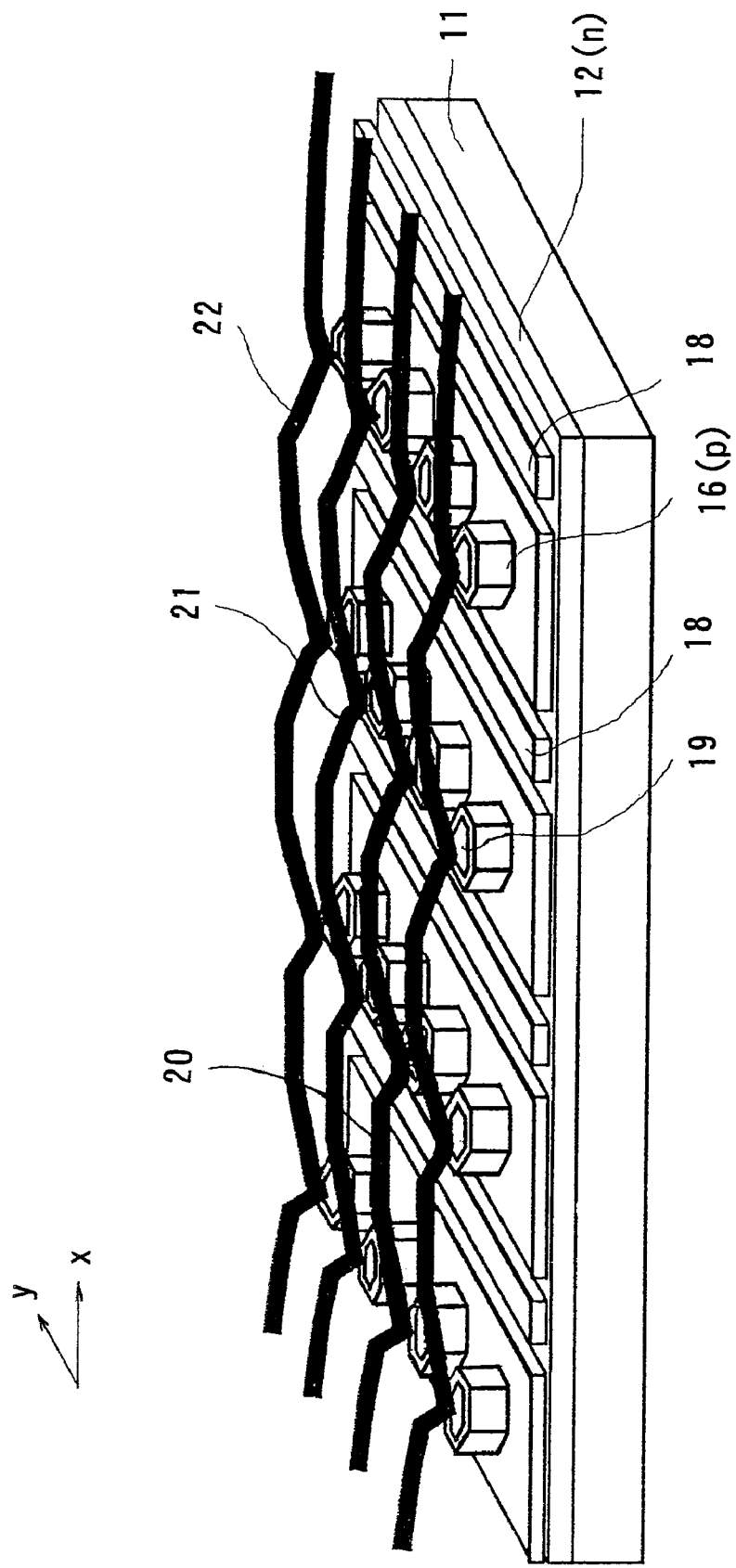
FIG. 10 is a perspective view showing an image display apparatus according to the third embodiment of the invention.
Figure 11:
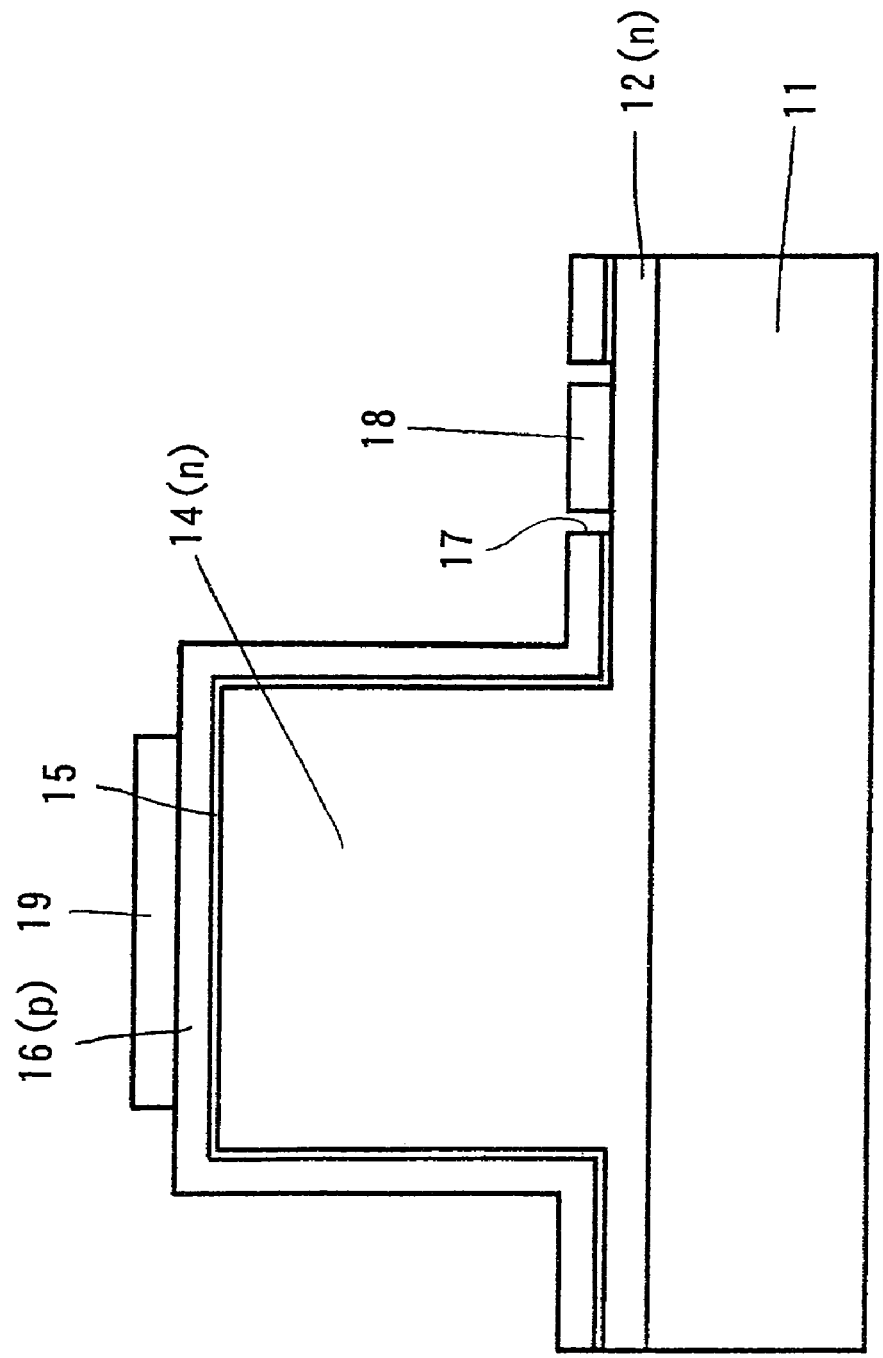
FIG. 11 is a cross sectional view of a GaN light emitting diode according to the fifth embodiment of the invention.

As shown in FIG. 10, in the image display apparatus, GaN light emitting diodes are regularly arranged in the x direction and the y direction which perpendicularly cross each other in the plane of the sapphire substrate 11, so that a 2-dimensional array of the GaN light emitting diodes is formed. A structure of each GaN light emitting diode is similar to that in, for example, the first embodiment.

The GaN light emitting diode for red (R) light emission, the GaN light emitting diode for green (G) light emission, and the GaN light emitting diode for blue (B) light emission are adjacently arranged in the y direction. One pixel is formed by those three GaN light emitting diodes. The p-side electrodes 19 of the GaN light emitting diodes for red light emission arranged in the x direction are mutually connected by a wiring 20. Similarly, the GaN light emitting diodes for green light emission arranged in the x direction are mutually connected by a wiring 21. The GaN light emitting diodes for blue light emission arranged in the x direction are mutually connected by a wiring 22. The n-side electrode 18 is extended in the y direction and becomes a common electrode of the GaN light emitting diodes arranged in the y direction.

In the image display apparatus of the simple matrix system constructed as mentioned above, the wirings 20 to 22 and the n-side electrode 18 are selected in accordance with a signal of an image to be displayed, a current is supplied to the selected GaN light emitting diodes of the selected pixel so as to drive the diodes and the light emission is caused, so that the image can be displayed.

According to the third embodiment, since each GaN light emitting diode has a construction similar to that of the GaN light emitting diode according to the first embodiment, the light emitting efficiency is high. Thus, the full color image display apparatus having high luminance can be realized.

An illuminating apparatus according to the fourth embodiment of the invention will now be described. The illuminating apparatus has a construction similar to that of the image display apparatus shown in FIG. 10.

In the illuminating apparatus, the wirings 20 to 22 and the n-side electrode 18 are selected in accordance with the color of the illuminating light, a current is supplied to the selected GaN light emitting diodes of the selected pixel so as to drive the diodes and the light emission is caused, so that the illuminating light can be emitted.

According to the fourth embodiment, since each GaN light emitting diode has a construction similar to that of the GaN light emitting diode according to the first embodiment, the light emitting efficiency is high. Thus, the illuminating apparatus having high luminance can be realized.

A GaN light emitting diode according to the fifth embodiment of the present invention will now be described.

An etching depth at the time of forming the hexagonal prism portion 14 by etching the n-type GaN layer 12 by using the etching mask 13 by the RIE method in the first embodiment is increased in the fifth embodiment. Specifically speaking, the etching depth is selected so that an aspect ratio of the obtained hexagonal prism portion 14 lies within a range, for example, from about 0.8 to about 1.0 and the etching depth is set to about 8 to about 10 µm when a diameter of the hexagonal etching mask 13 is equal to about 10 µm.

A construction other than the above construction is similar to that of the first embodiment.

According to the fifth embodiment, advantages similar to those in the first embodiment can be obtained.

A GaN light emitting diode according to the sixth embodiment of the invention will now be described.

The diameter of the etching mask 13 at the time of forming the hexagonal prism portion 14 by etching the n-type GaN layer 12 by using the etching mask 13 by the RIE method in the first embodiment is decreased in the sixth embodiment. For example, the diameter of the hexagonal etching mask 13 is set to about 5 µm and selected so that an aspect ratio of the hexagonal prism portion 14 which is obtained at this time is equal to, for example, about 2. At this time, the etching depth is equal to about 10 µm.

A construction other than the above construction is similar to that of the first embodiment.

According to the sixth embodiment, advantages similar to those in the first embodiment can be obtained.

The seventh embodiment of the invention will now be described.

Figure 12A:
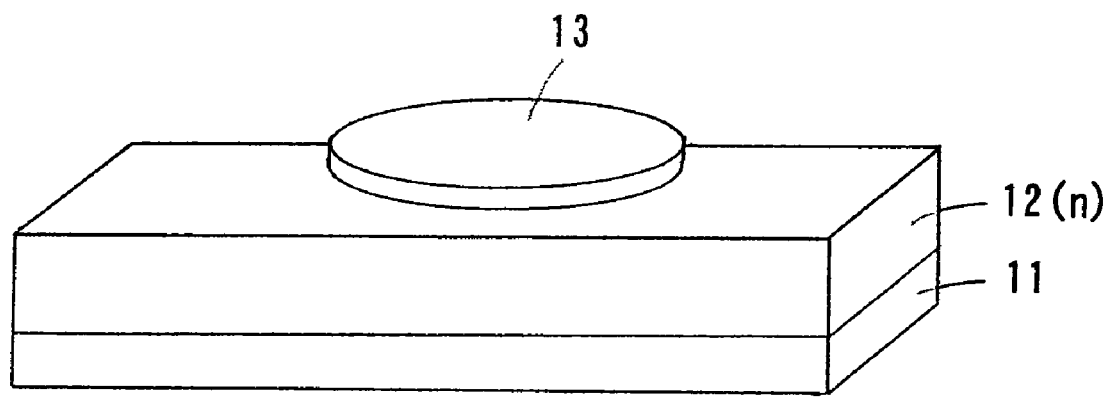
FIGS. 12A and 12B are a perspective view and a cross sectional view for explaining a manufacturing method of a GaN light emitting diode according to the seventh embodiment of the invention.
Figure 12B:
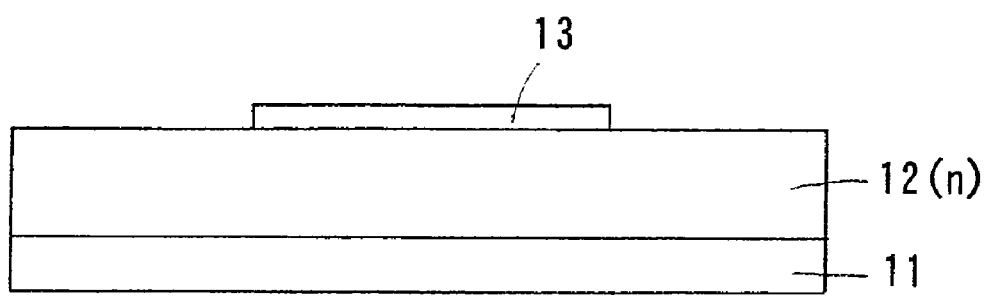

In the seventh embodiment, as shown in FIGS. 12A and 12B, after the steps were progressed and up to the process to grow the n-type GaN layer 12 was executed in a manner similar to the first embodiment, the etching mask 13 comprising a circular resist is formed onto the n-type GaN layer 12.

Figure 13A:
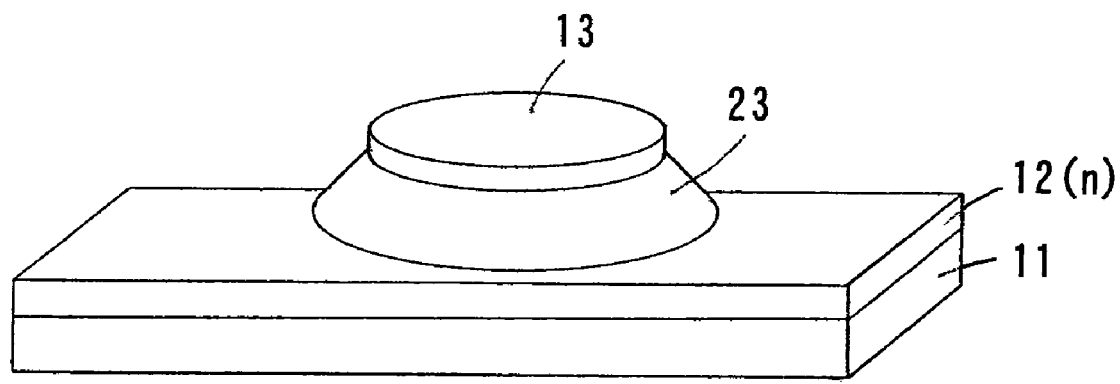
FIGS. 13A and 13B are a perspective view and a cross sectional view for explaining the manufacturing method of the GaN light emitting diode according to the seventh embodiment of the invention.
Figure 13B:
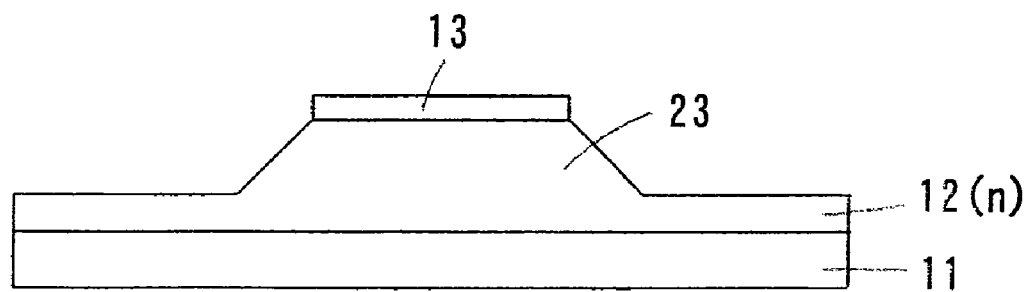

Subsequently, as shown in FIGS. 13A and 13B, by using the etching mask 13, the n-type GaN layer 12 is etched to a predetermined depth by the RIE method using an etching gas obtained by, for example, adding an argon gas to a chlorine gas. In this case, recession of the etching mask 13 occurs gradually and taper etching is executed, so that a circular cone frustum portion 23 in a forward taper shape having a side surface which is inclined to the substrate surface is formed. It is assumed that an angle of inclination of the side surface of the circular cone frustum portion 23 is equal to, for example, 45°±10°, a diameter of the upper surface lies within a range, for example, from about 10 to about 20 µm, more preferably, for example, about 15 µm, and a height (thickness) is equal to, for example, about 2 to about 7 µm (for example, about 5 µm).

Figure 14A:
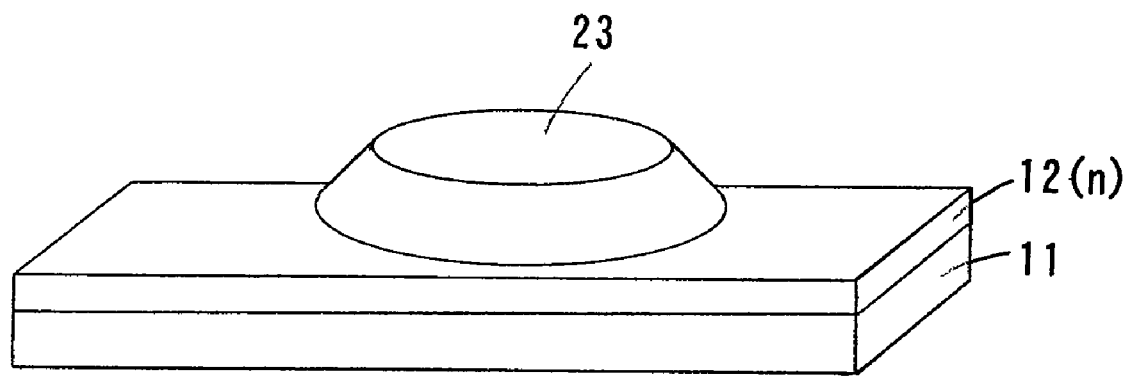
FIGS. 14A and 14B are a perspective view and a cross sectional view for explaining the manufacturing method of the GaN light emitting diode according to the seventh embodiment of the invention.
Figure 14:
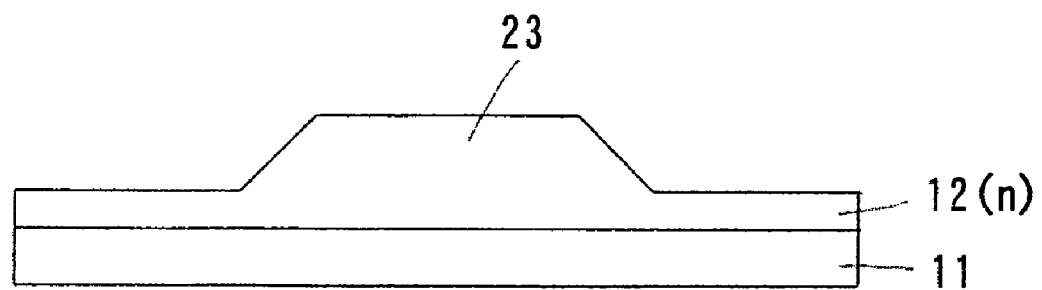

Subsequently, the etching mask 13 is removed by, for example, plasma ashing or the like. Thus, as shown in FIGS. 14A and 14B, a GaN processed substrate in which the circular cone frustum portion 23 whose upper surface is a C plane has been formed is obtained on the surface of the n-type GaN layer 12.

Figure 15A:
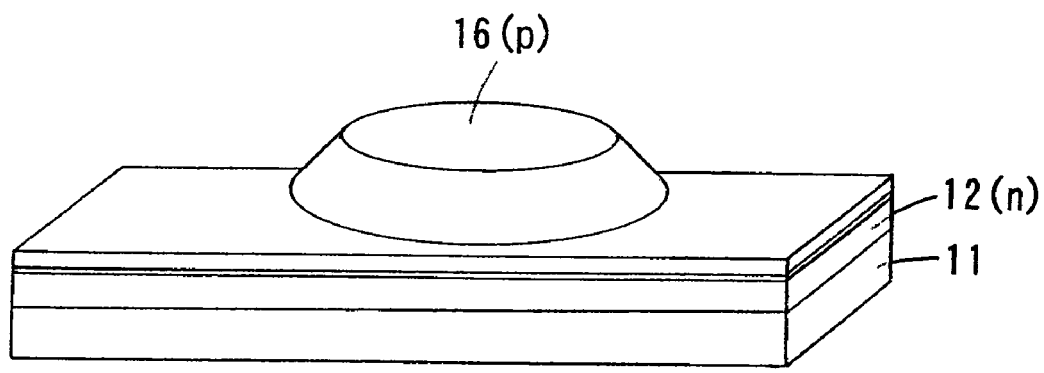
FIGS. 15A and 15B are a perspective view and a cross sectional view for explaining the manufacturing method of the GaN light emitting diode according to the seventh embodiment of the invention.
Figure 15:
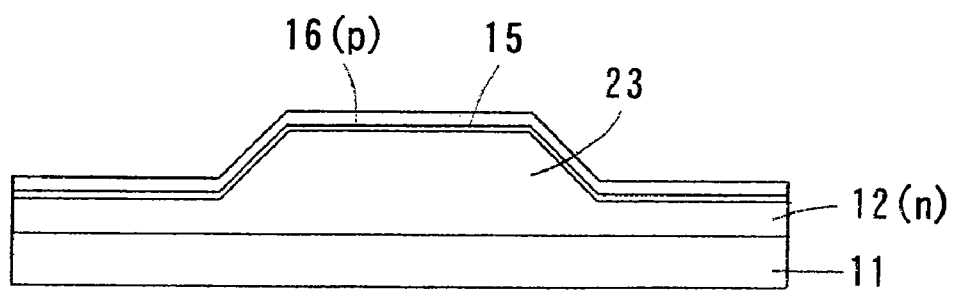

Subsequently, as shown in FIGS. 15A and 15B, the active layer 15 and the p-type GaN layer 16 are sequentially grown in a manner similar to the first embodiment. In this case, it is also possible to construct in a manner such that just before the active layer 15 is grown, first, a thin n-type GaN layer is grown onto the GaN processed substrate at a temperature of, for example, about 1020° C. and, subsequently, the active layer 15 is grown onto the n-type GaN layer.

Figure 16A:
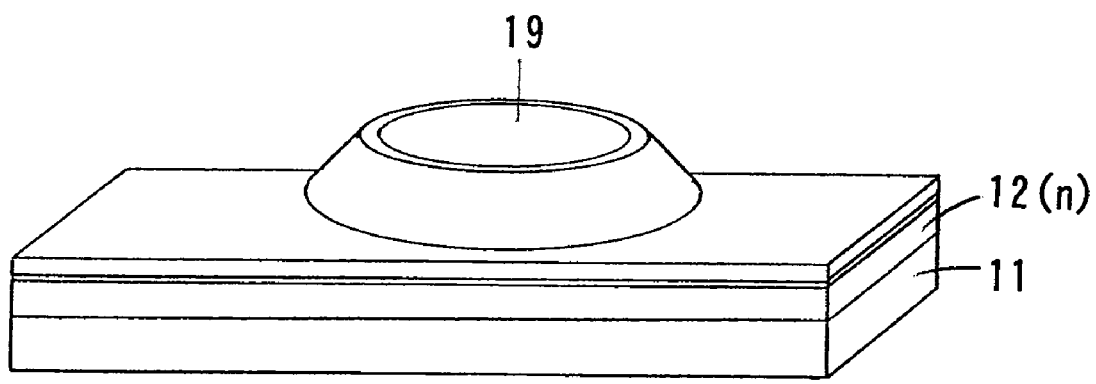
FIGS. 16A and 16B are a perspective view and a cross sectional view for explaining the manufacturing method of the GaN light emitting diode according to the seventh embodiment of the invention.
Figure 16:
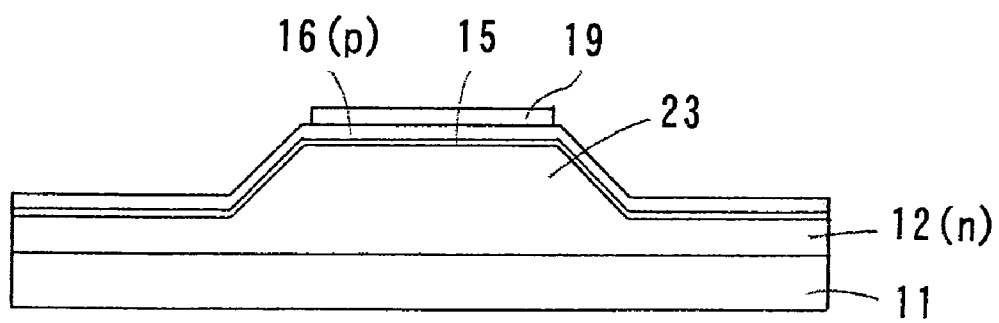

Subsequently, as shown in FIGS. 16A and 16B, the p-side electrode 19 of, for example, an Ni/Pt/Au structure or a Pd/Pt/Au structure is circularly formed onto the upper surface of the p-type GaN layer 16 grown over the upper surface serving as a C plane of the circular cone frustum portion 23 of the n-type GaN layer 12 in a manner similar to the first embodiment. As a p-side electrode 19, for example, a p-side electrode of an Ni/Ag/Au structure containing an Ag film whose reflectance is high or a p-side electrode of an Re/Au structure containing an Re film whose reflectance is similarly high can be also used. By using them, the reflectance on the upper surface of the p-type GaN layer 16 over the circular cone frustum portion 23 can be raised, the extracting efficiency of the light can be raised, and the light emitting efficiency can be raised. In the case where a p-side electrode of the Ni/Ag/Au structure is used as a p-side electrode 19, if the Ni film is too thick, an amount of light which reaches the Ag film decreases and the purpose in which the Ag film is included as a reflective film becomes meaningless. Therefore, the Ni film is formed as thin as possible so as to be equal to, for example, about 2 nm and it is sufficient that thickness of each the Ag film and the Au film is equal to, for example, about 100 nm. Preferably, the p-side electrode 19 is formed so as to avoid the portion over a corner portion between the upper surface and the side surface of the circular cone frustum portion 23. This is because the crystalline performance of each of the active layer 15 and the p-type GaN layers 16 near the corner portion is often inferior to that of the other portion.

Figure 17A:
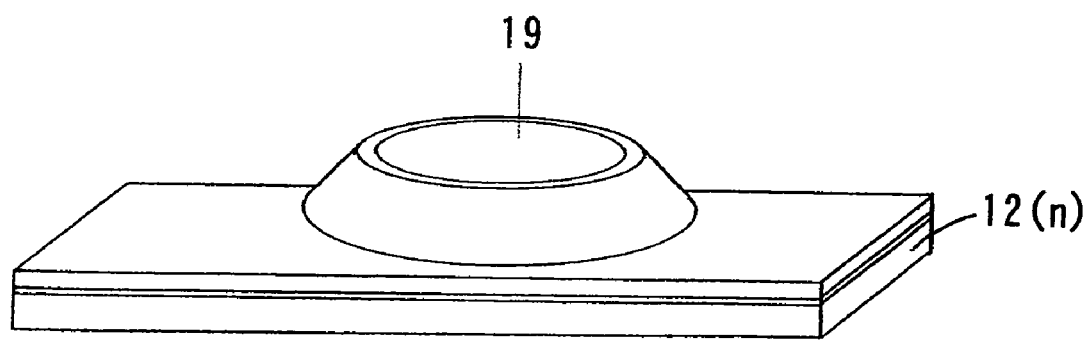
FIGS. 17A and 17B are a perspective view and a cross sectional view for explaining the manufacturing method of the GaN light emitting diode according to the seventh embodiment of the invention.
Figure 17:
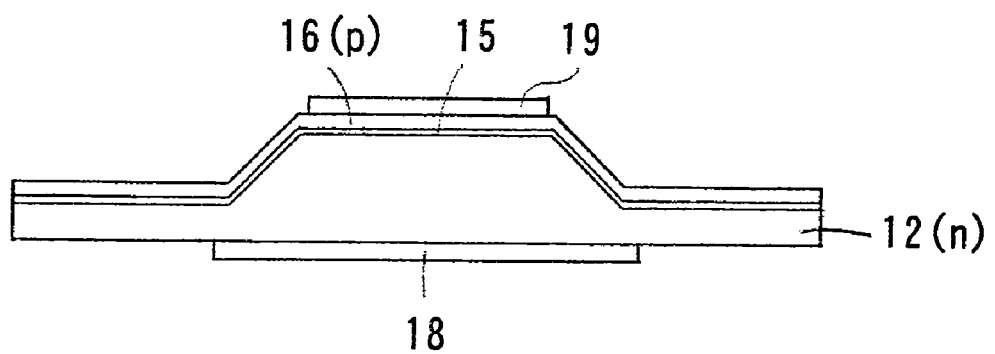

Subsequently, by irradiating a laser beam by, for example, an excimer laser or the like from the back surface side of the sapphire substrate 11, the n-type GaN layer 12 and the portions existing on/over it are peeled off from the sapphire substrate 11. Subsequently, the back surface of the n-type GaN layer 12 peeled off as mentioned above is flattened by etching or the like. After that, as shown in FIGS. 17A and 17B, the n-side electrode 18 is formed onto the back surface of the n-type GaN layer 12 in a manner similar to the second embodiment. In this case, a transparent electrode that includes, for example, ITO or the like is used as an n-side electrode 18 and, in order to enable the ohmic contact with the n-type GaN layer 12 to be more preferably obtained, a pad of, for example, the Ti/Au structure is formed into the portion of the back surface of the n-type GaN layer 12 where no problem occurs when the light is extracted. After that, the transparent electrode is formed.

Figure 18A:
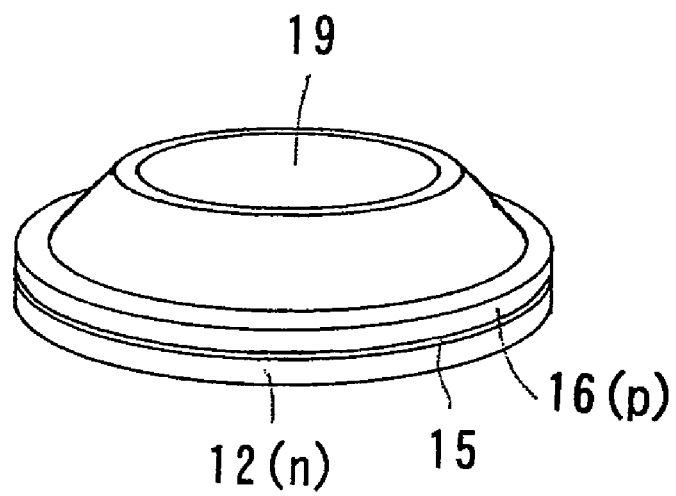
FIGS. 18A and 18B are a perspective view and a cross sectional view for explaining the manufacturing method of the GaN light emitting diode according to the seventh embodiment of the invention.
Figure 18:
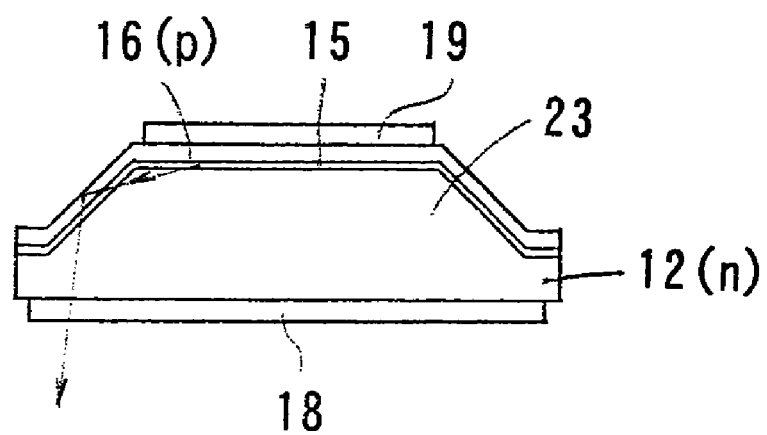

After that, the substrate on which the light emitting diode structure has been formed as mentioned above is formed in a chip shape by etching by the RIE, daisa, or the like. A GaN light emitting diode formed in a chip shape is shown in FIGS. 18A and 18B.

A construction other than the above construction is similar to those of the first and second embodiments.

According to the seventh embodiment, in addition to the advantages similar to those in the first and second embodiments, as shown in an arrow in FIG. 18B, the light emitted in the oblique downward direction from the active layer 15 formed in the upper surface portion of the circular cone frustum portion 23 can be reflected downward by the side surface of the p-type GaN layer 16 formed over the inclined side surface of the circular cone frustum portion 23. It is possible to obtain the advantages such that the extracting efficiency of the light can be raised and the light emitting efficiency can be further raised.

The eighth embodiment of the invention will now be described.

Figure 19A:
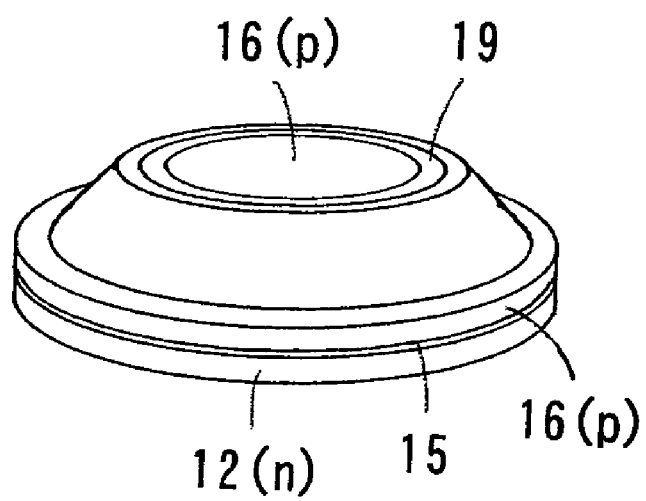
FIGS. 19A and 19B are a perspective view and a cross sectional view for explaining a manufacturing method of a GaN light emitting diode according to the eighth embodiment of the invention.
Figure 19:
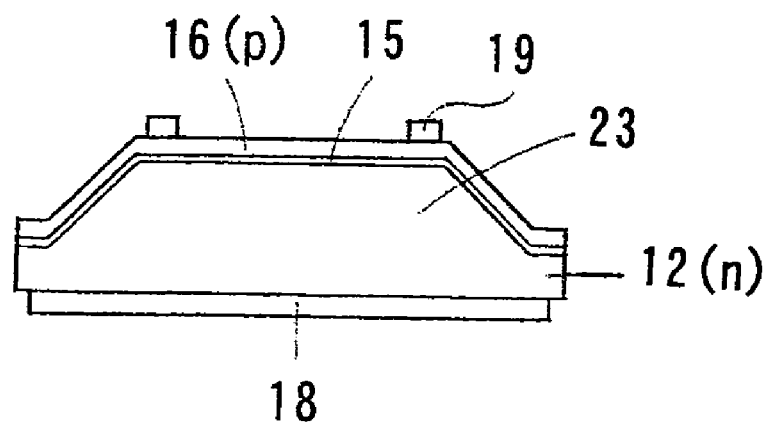

In the eighth embodiment, as shown in FIGS. 19A and 19B, the ring-shaped p-side electrode 19 is formed onto the upper surface of the p-type GaN layer 16 grown over the upper surface of the circular cone frustum portion 23 of the n-type GaN layer 12.

A construction other than the above construction is similar to that of the seventh embodiment.

According to the eighth embodiment, advantages similar to those in the seventh embodiment can be obtained.

The ninth embodiment of the invention will now be described.

Figure 20A:
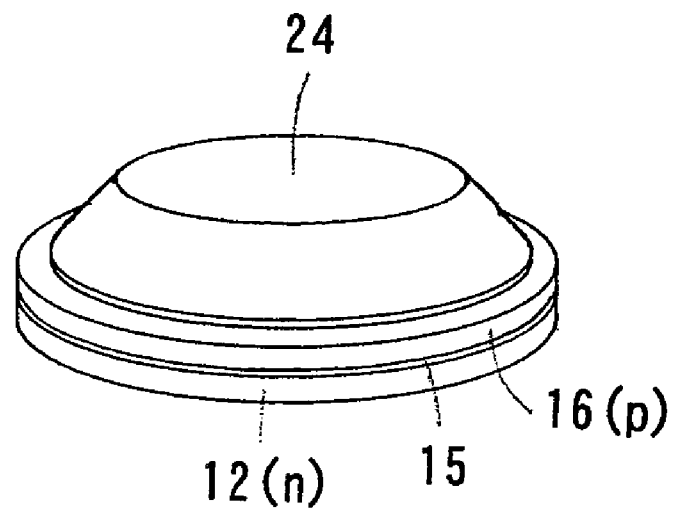
FIGS. 20A and 20B are a perspective view and a cross sectional view for explaining a manufacturing method of the GaN light emitting diode according to the ninth embodiment of the invention.
Figure 20B:
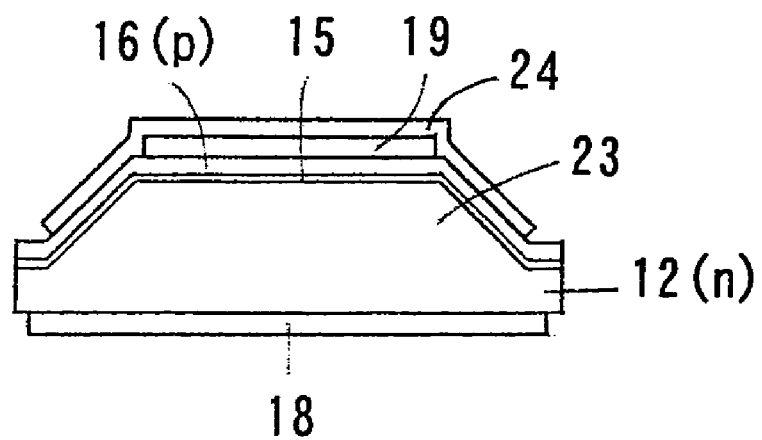

In the ninth embodiment, as shown in FIGS. 20A and 20B, an Ag film 24 is formed so as to cover the p-side electrode 19 formed over the upper surface of the circular cone frustum portion 23 of the n-type GaN layer 12 and the p-type GaN layer 16 grown over the side surface of the circular cone frustum portion 23. By the Ag film 24, the reflectance at the time when the light emitted in the oblique downward direction from the active layer 15 formed in the upper surface portion of the circular cone frustum portion 23 is reflected downwardly by the side surface of the p-type GaN layer 16 formed over the inclined side surface of the circular cone frustum portion 23 can be raised, the extracting efficiency of the light can be raised more, and the light emitting efficiency can be further raised. In this case, although the Ag film 24 is come into contact with the p-type GaN layer 16, since such a contact is a Schottky contact, an operating current flows only in the contact portion of the p-side electrode 19 and the p-type GaN layer 16.

A construction other than the above construction is similar to that of the seventh embodiment.

According to the ninth embodiment, advantages similar to those in the seventh embodiment can be obtained.

The 10th embodiment of the invention will now be described.

In the 10th embodiment, in the GaN light emitting diode shown in FIGS. 18A and 18B, for example, a transparent electrode such as ITO or the like is used as a p-side electrode 19 and an n-side electrode having, for example, the Ni/Pt/Au structure, Pd/Pt/Au structure, Ni/Ag/Au structure, Re/Au structure, or the like is used as an n-side electrode 18. In this case, the light is extracted to the outside via the p-side electrode 19.

A construction other than the above construction is similar to that of the seventh embodiment.

According to the 10th embodiment, advantages similar to those in the seventh embodiment can be obtained.

The 11th embodiment of the invention will now be described.

Figure 21A:
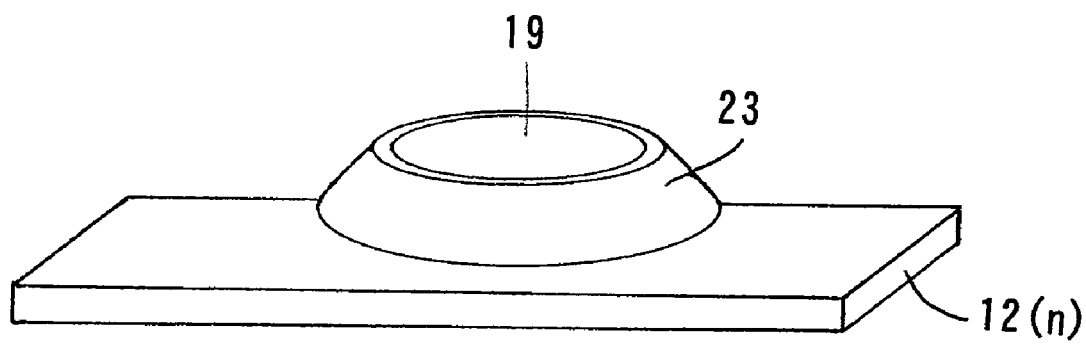
FIGS. 21A and 21B are a perspective view and a cross sectional view for explaining a manufacturing method of the GaN light emitting diode according to the 10th embodiment of the invention.
Figure 21B:
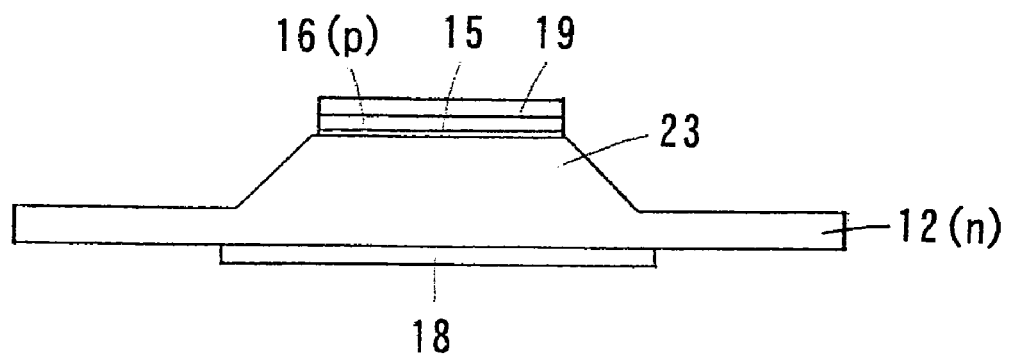

In the 11th embodiment, after the steps were progressed and up to the process to form the p-side electrode 19 was executed in a manner similar to the seventh embodiment, for example, the p-side electrode 19 is used as a mask and the p-type GaN layer 16 and the active layer 15 are sequentially etched by, for example, the RIE method, and the p-type GaN layer 16 is separated in the portion between the adjacent circular cone frustum portions 23. After that, the n-type GaN layer 12 and the portions existing on/over it are peeled off from the sapphire substrate 11 and the n-side electrode 18 is formed onto the back surface of the n-type GaN layer 12. This state is shown in FIGS. 21A and 21B.

Figure 22:
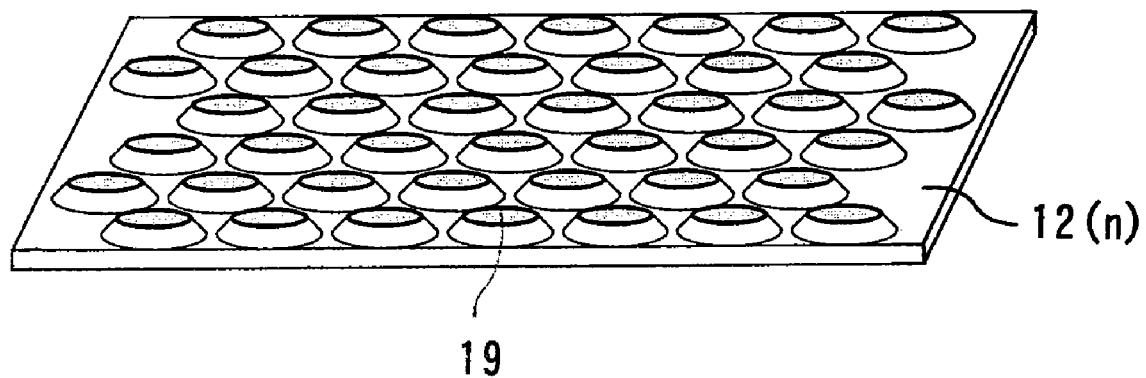
FIG. 22 is a perspective view for explaining a manufacturing method of a GaN light emitting diode according to the 11th embodiment of the invention.

FIG. 22 shows a whole structure of the n-type GaN layer 12 in which a number of circular cone frustum portions 23 are formed in an array shape in predetermined positions and at regular intervals. The n-type GaN layer 12 is separated in the portion between the adjacent circular cone frustum portions 23 and formed in a chip shape, so that the GaN light emitting diode is obtained.

A construction other than the above construction is similar to that of the seventh embodiment.

According to the 11th embodiment, advantages similar to those in the seventh embodiment can be obtained.

The 12th embodiment of the invention will now be described.

In the 12th embodiment, a diameter of the upper surface of the circular cone frustum portion 23 in the seventh embodiment is sufficiently set to be small, for example, about 5 μm or less (for example, about 2 to about 3 μm) and the p-side electrode 19 is also similarly miniaturized.

A construction other than the above construction is similar to that of the seventh embodiment.

A construction other than the above construction is similar to that of the seventh embodiment.

According to the 12th embodiment, advantages similar to those in the seventh embodiment can be obtained, and further, it is possible to obtain an advantage such that since the size of light emitting surface is sufficiently small, the area of the black portion other than the light emitting surface increases relatively and, in the case where the light emission is observed, the image can be displayed as if black became dark.

The 13th embodiment of the invention will now be described.

Figure 23A:
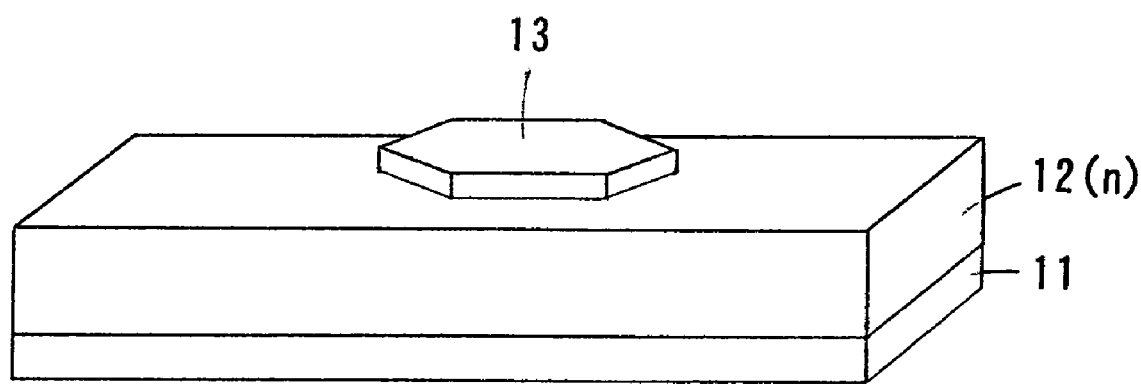
FIGS. 23A and 23B are a perspective view and a cross sectional view for explaining a manufacturing method of a GaN light emitting diode according to the 13th embodiment of the invention.
Figure 23B:
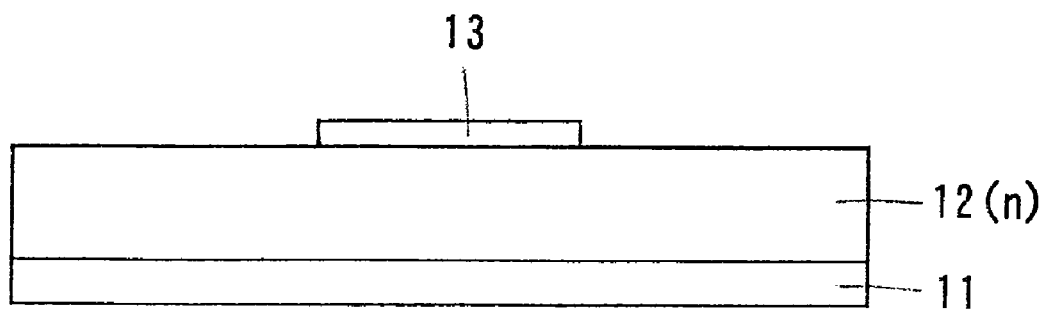

In the 13th embodiment, as shown in FIGS. 23A and 23B, after the steps were progressed and up to the process to grow the n-type GaN layer 12 was executed in a manner similar to the first embodiment, the etching mask 13 comprising a hexagonal resist is formed onto the n-type GaN layer 12. It is desirable that one side of the hexagonal etching mask 13 is parallel with the (11-20) direction.

Figure 24A:
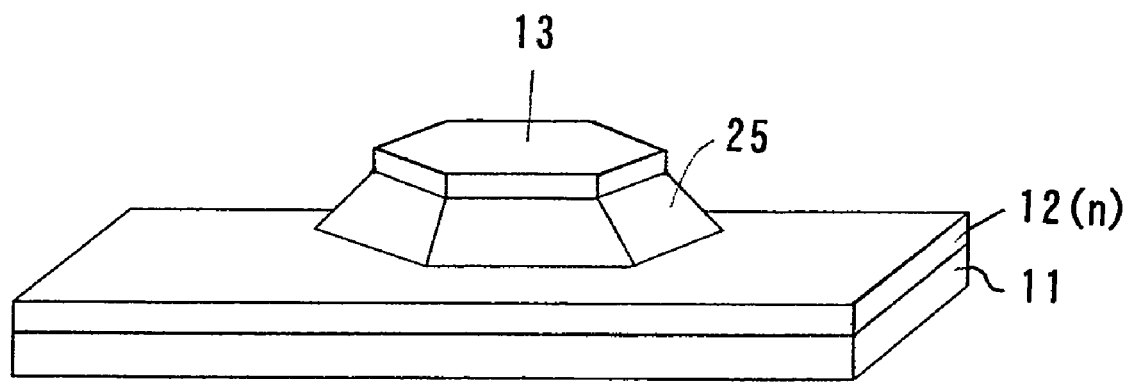
FIGS. 24A and 24B are a perspective view and a cross sectional view for explaining the manufacturing method of the GaN light emitting diode according to the 13th embodiment of the invention.
Figure 24B:
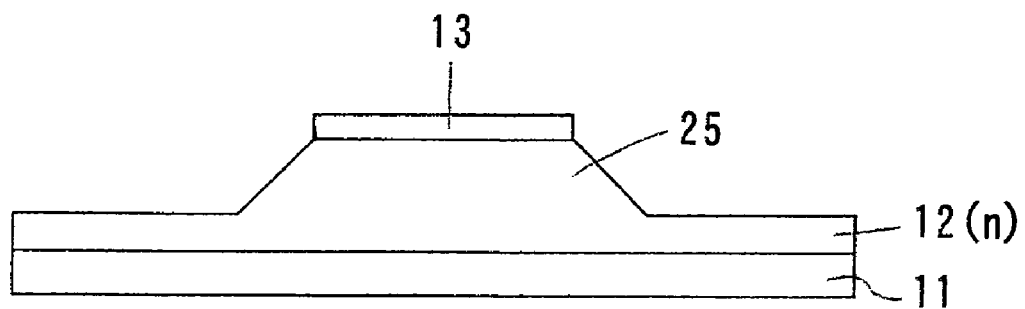

Subsequently, as shown in FIGS. 24A and 24B, the n-type GaN layer 12 is etched to a predetermined depth by using the etching mask 13 by the RIE method using an etching gas obtained by adding, for example, the argon gas to the chlorine gas. In this case, the recession of the etching mask 13 occurs gradually and the taper etching is executed, so that a hexagonal cone frustum portion 25 in a forward taper shape having side surfaces which are inclined to the substrate surface is formed.

Figure 25A:
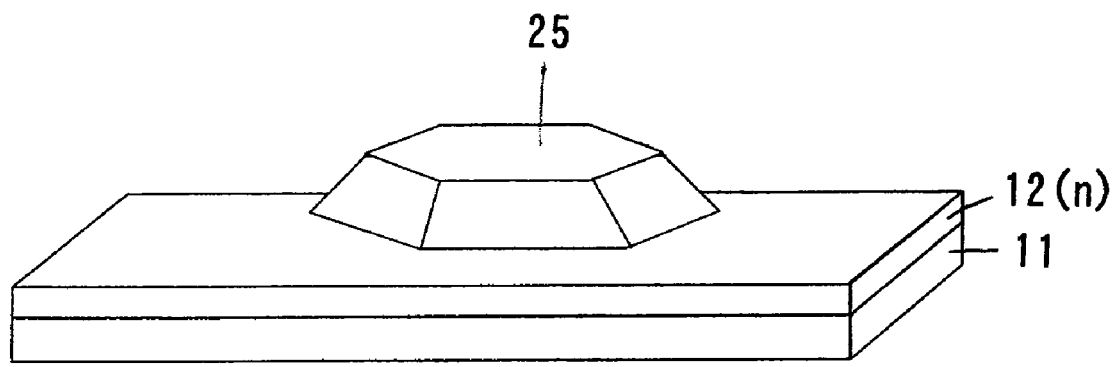
FIGS. 25A and 25B are a perspective view and a cross sectional view for explaining the manufacturing method of the GaN light emitting diode according to the 13th embodiment of the invention.
Figure 25B:
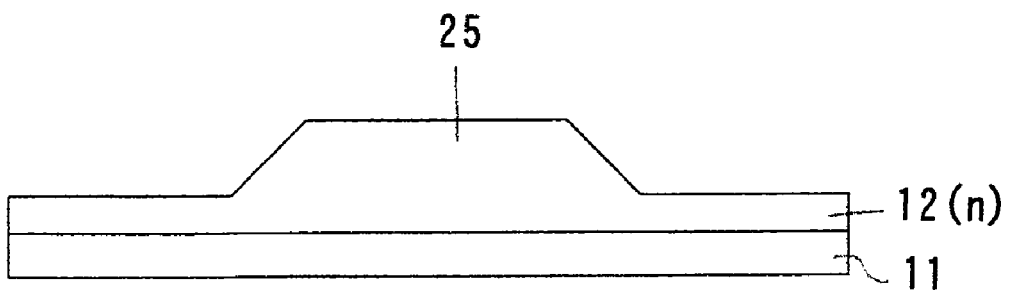

Subsequently, the etching mask 13 is removed by, for example, the plasma ashing or the like. Thus, as shown in FIGS. 25A and 25B, the GaN processed substrate in which the hexagonal cone frustum portion 25 whose upper surface consists of the C plane has been formed on the surface of the n-type GaN layer 12 is obtained. It is preferable that the direction which is perpendicular to the side of the hexagon on the hexagonal upper surface of the hexagonal cone frustum portion 25 is the <1-100> direction and the direction of the normal of the side surface of the hexagonal cone frustum portion 25 is set to the <1-101> direction.

Figure 26A:
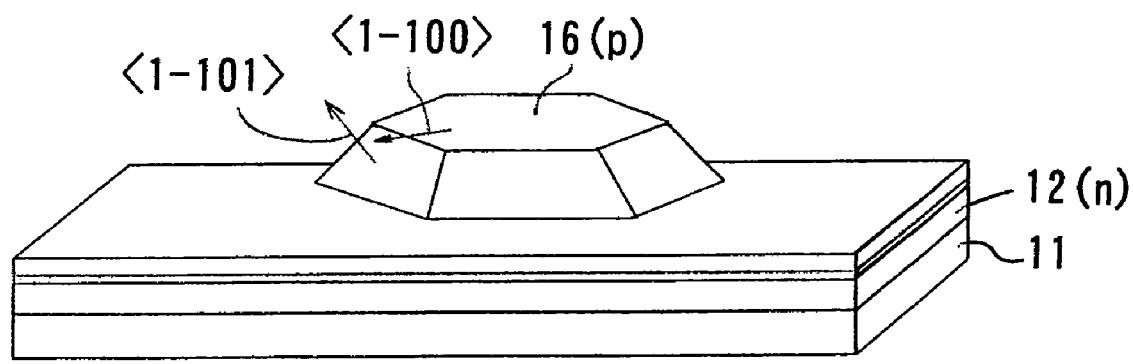
FIGS. 26A and 26B are a perspective view and a cross sectional view for explaining the manufacturing method of the GaN light emitting diode according to the 13th embodiment of the invention.
Figure 26B:
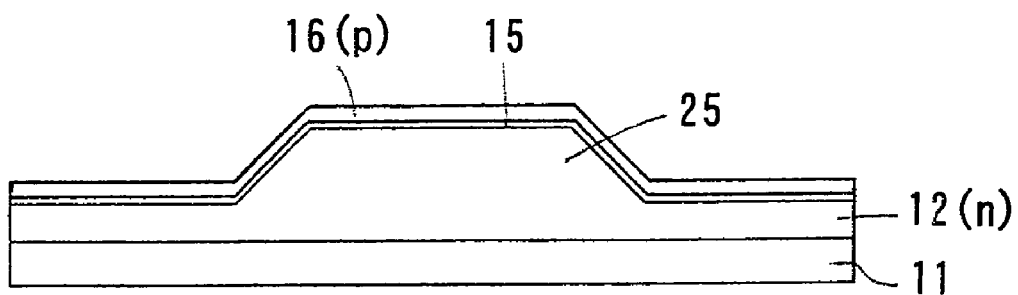

Subsequently, as shown in FIGS. 26A and 26B, the active layer 15 and the p-type GaN layer 16 are sequentially grown in a manner similar to the first embodiment. In this case, it is also possible that just before the active layer 15 is grown, first, an n-type GaN layer in which, for example, Si has been doped as n-type impurities is thinly grown onto the GaN processed substrate and, subsequently, the active layer 15 is grown thereon. By this method, since the active layer 15 can be grown onto the flat clean surface of the n-type GaN layer, the active layer 15 having excellent crystalline performance can be certainly obtained. When the hexagonal cone frustum portion 25 is formed by the RIE method or the like, even if it becomes a shape deviated from the accurate hexagonal cone frustum or the side surface becomes a rough state, since the shape is corrected and approaches the hexagonal cone frustum in a preferable shape or the unevenness of the surface is embedded and the surface becomes a flat surface in association with the growth of the n-type GaN layer, the hexagonal cone frustum portion 25 can be set into a preferable shape, the active layer 15 and the p-type GaN layer 16 can be preferably grown onto the portion 25.

Figure 27A:
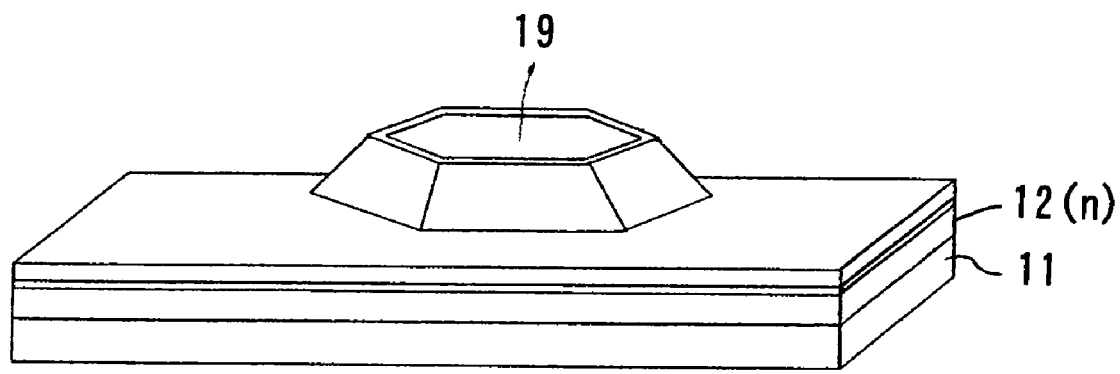
FIGS. 27A and 27B are a perspective view and a cross sectional view for explaining the manufacturing method of the GaN light emitting diode according to the 13th embodiment of the invention.
Figure 27B:
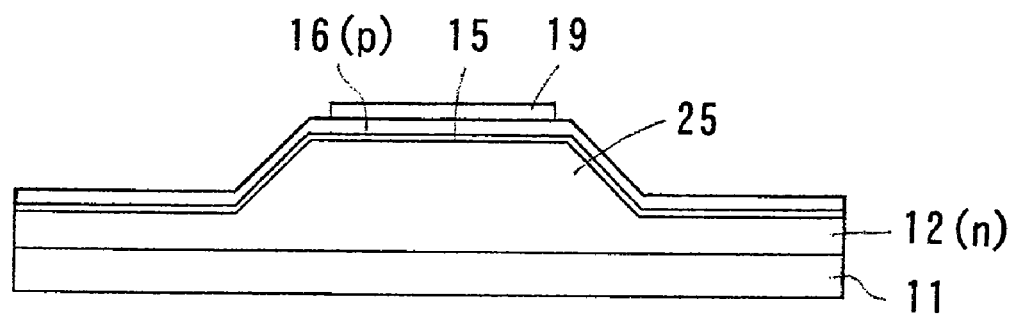

Subsequently, as shown in FIGS. 27A and 27B, the p-side electrode 19 having, for example, the Ni/Pt/Au structure or the Pd/Pt/Au structure is formed in a hexadecimal shape onto the upper surface of the p-type GaN layer 16 and active layer 15 grown on the upper surface that includes the C plane of the hexagonal cone frustum portion 25 of the n-type GaN layer 12 in a manner similar to the first embodiment. As a p-side electrode 19, for example, a p-side electrode of the Ni/Ag/Au structure including the Ag film whose reflectance is high or a p-side electrode of the Re/Au structure including the Re film whose reflectance is likewise high can be also used. By using those electrodes, the reflectance on the upper surface of the p-type GaN layer 16 over the hexagonal cone frustum portion 25 can be raised, the extracting efficiency of the light can be raised, and the light emitting efficiency can be raised. In the case where the p-type electrode of the Ni/Ag/Au structure is used as a p-type electrode 19, if the Ni film is too thick, an amount of light which reaches the Ag film decreases and the purpose in which the Ag film is included as a reflective film becomes meaningless. Therefore, the Ni film is formed as thin as possible so as to be equal to, for example, about 2 nm and it is sufficient that thickness of each the Ag film and the Au film is equal to, for example, about 100 nm. Preferably, the p-side electrode 19 is formed so as to avoid the portion over a corner portion between the upper surface and the side surface of the hexagonal cone frustum portion 25. This is because the crystalline performance of each of the active layer 15 and the p-type GaN layers 16 near the corner portion is often inferior to that of the other portion.

Figure 28A:
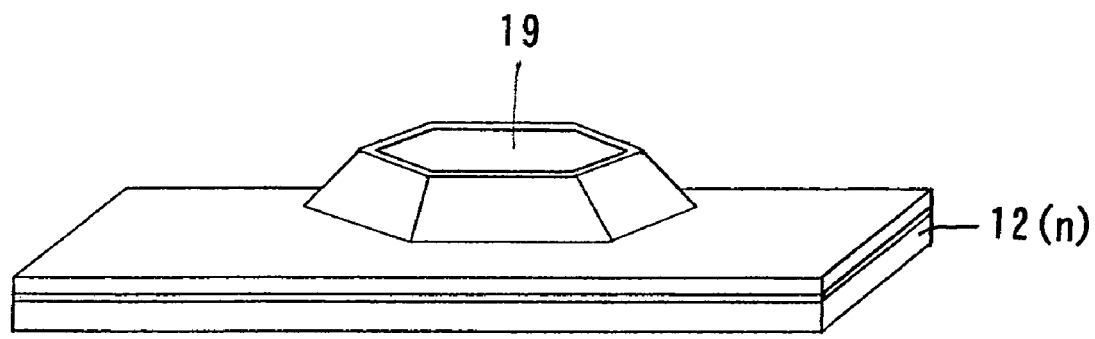
FIGS. 28A and 28B are a perspective view and a cross sectional view for explaining the manufacturing method of the GaN light emitting diode according to the 13th embodiment of the invention.
Figure 28B:
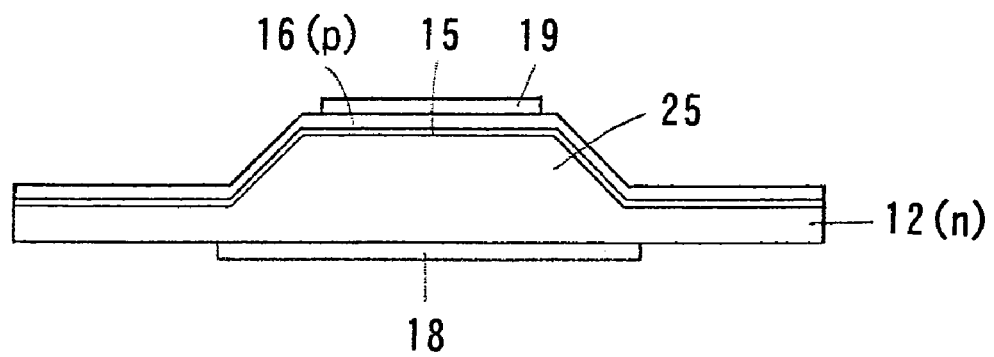

Subsequently, by irradiating the laser beam by, for example, the excimer laser or the like from the back surface side of the sapphire substrate 11, the n-type GaN layer 12 and the portions existing on/over it are peeled off from the sapphire substrate 11. After the back surface of the n-type GaN layer 12 peeled off as mentioned above was flattened by etching or the like, the n-side electrode 18 is formed onto the back surface of the n-type GaN layer 12 as shown in FIGS. 28A and 28B in a manner similar to the second embodiment. A transparent electrode that includes, for example, ITO or the like can be used as an n-side electrode 18. In order to enable the ohmic contact with the n-type GaN layer 12 to be more preferably obtained, a pad of, for example, the Ti/Au structure is formed in the portion of the back surface of the n-type GaN layer 12 where no problem occurs when the light is extracted, and thereafter, the transparent electrode is formed.

Figure 29A:
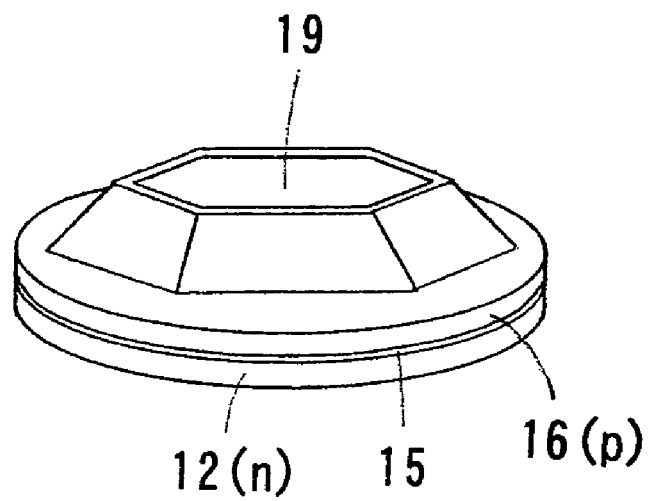
FIGS. 29A and 29B are a perspective view and a cross sectional view for explaining the manufacturing method of the GaN light emitting diode according to the 13th embodiment of the invention.
Figure 29B:
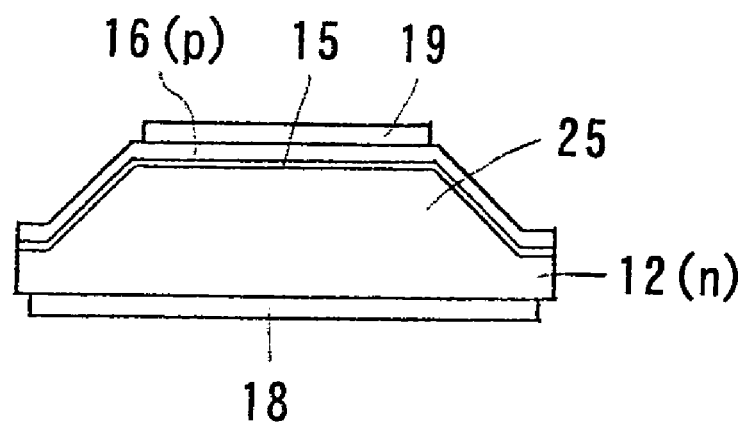

After that, the substrate on which the light emitting diode structure has been formed as mentioned above is constructed as a chip shape by the etching according to the RIE, a daisa, or the like. The chip-shaped GaN light emitting diode is shown in FIGS. 29A and 29B.

A construction other than the above construction is similar to those of the first and second embodiments.

According to the 13th embodiment, in addition to advantages similar to those in the first and second embodiments, the light emitted in the oblique downward direction from the active layer 15 formed in the upper surface portion of the hexagonal cone frustum portion 25 can be reflected downward by the side surface of the p-type GaN layer 16 formed over the inclined side surface of the hexagonal cone frustum portion 25. It is possible to obtain the advantages such that the extracting efficiency of the light can be raised and the light emitting efficiency can be further raised.

The 14th embodiment of the invention will now be described.

In the 14th embodiment, the hexagonal ring-shaped p-side electrode 19 is formed onto the upper surface of the active layer 15 and the p-type GaN layer 16 grown on the upper surface of the hexagonal cone frustum portion 25 of the n-type GaN layer 12 in the 13th embodiment.

A construction other than the above construction is similar to that of the 13th Embodiment.

According to the 14th embodiment, advantages similar to those of the 13th embodiment can be obtained.

The 15th embodiment of the invention will now be described.

In the 15th embodiment, the Ag film 24 is formed so as to cover the p-side electrode 19 formed over the upper surface of the hexagonal cone frustum portion 25 of the n-type GaN layer 12 and the p-type GaN layer 16 grown over the side surface of the hexagonal cone frustum portion 25 in the 13th embodiment in a manner similar to the ninth embodiment.

A construction other than the above construction is similar to those of the 13th and 9th embodiments.

According to the 15th embodiment, advantages similar to those of the 13th embodiment can be obtained.

The 16th embodiment of the invention will now be described.

In the 16th embodiment, in the GaN light emitting diode shown in FIGS. 29A and 29B in the 13th embodiment, a transparent electrode that includes, for example, ITO or the like is used as a p-side electrode 19 and an n-side electrode of, for example, the Ni/Pt/Au structure, the Pd/Pt/Au structure, the Ni/Ag/Au structure, the Re/Au structure, or the like is used as an n-side electrode 18 in a manner similar to the 10th embodiment. In this case, the light is extracted to the outside via the p-side electrode 19.

A construction other than the above construction is similar to those of the 13th and 10th embodiments.

According to the 16th embodiment, advantages similar to those of the 13th embodiment can be obtained.

The 17th embodiment of the invention will now be described.

In the 17th embodiment, after the steps were progressed and up to the process to form the p-side electrode 19 was executed in a manner similar to the 7th embodiment, the p-type GaN layer 16 and the active layer 15 are sequentially etched by, for example, the RIE method, for example, by using the p-side electrode 19 as a mask, and the p-type GaN layer 16 is separated between the adjacent hexagonal cone frustum portions 25. After that, the n-type GaN layer 12 and the portions existing on/over it are peeled off from the sapphire substrate 11 and the n-side electrode 18 is formed onto the back surface of the n-type GaN layer 12. As mentioned above, the n-type GaN layer 12 in which a number of hexagonal cone frustum portions 25 have been formed in an array shape in predetermined positions and at regular intervals is separated in the portion between the adjacent hexagonal cone frustum portions 25 and formed in a chip shape, thereby obtaining the GaN light emitting diode.

A construction other than the above construction is similar to those of the 13th and 11th embodiment.

According to the 17th embodiment, advantages similar to those of the 7th embodiment can be obtained.

The 18th embodiment of the invention will now be described.

In the 18th embodiment, a diameter of the upper surface of the hexagonal cone frustum portion 25 in the 13th embodiment is set to be sufficiently small, for example, about 5 µm or less (for example, about 2 to about 3 µm) and the p-side electrode 19 is also similarly set to be small.

A construction other than the above construction is similar to that of the 13th Embodiment.

According to the 18th embodiment, advantages similar to those of the 13th embodiment can be obtained. Further, since the size of light emitting surface is sufficiently small, for example, in the case of constructing the image display apparatus by using such a GaN light emitting diode, an advantage such that an area of the black portion other than the light emitting surface relatively increases and, in the case where the light emission is observed, the image can be displayed as if black became dark can be obtained.

The 19th embodiment of the invention will now be described.

In the 19th embodiment, the steps are progressed in a manner similar to the 13th embodiment and, as shown in FIGS. 25A and 25B, the hexagonal cone frustum portion 25 is formed in the n-type GaN layer 12. After that, the n-type GaN layer can be also thinly grown onto the GaN processed substrate as necessary.

Figure 30A:
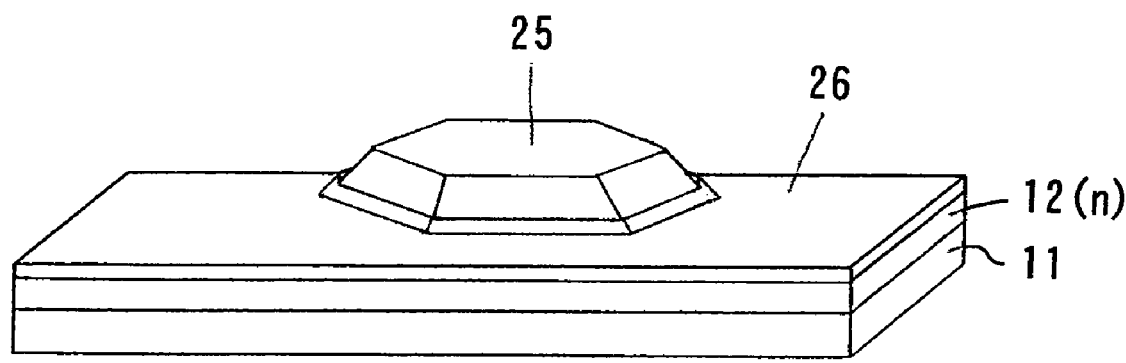
FIGS. 30A and 30B are a perspective view and a cross sectional view for explaining a manufacturing method of a GaN light emitting diode according to the 19th embodiment of the invention.
Figure 30B:
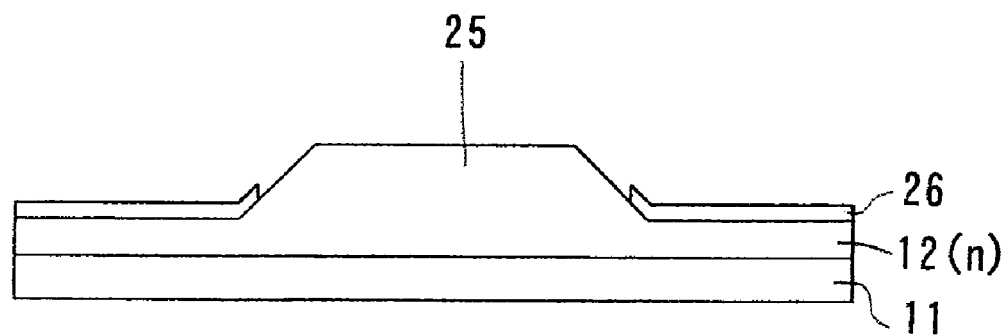

Subsequently, as shown in FIGS. 30A and 30B, a growing mask 26 that includes, for example, an $SiO_2$ film, an SiN film, or the like is formed so that the upper surface of the hexagonal cone frustum portion 25 and the portion excluding the lower portion of the side surface are exposed. Specifically speaking, the growing mask 26 is formed, for example, as follows. First, the $SiO_2$ film whose thickness is equal to, for example, about 100 nm is formed onto the whole surface of the n-type GaN layer 12 including the hexagonal cone frustum portion 25 by, for example, the CVD method, the vacuum evaporation depositing method, the sputtering method, or the like. After that, a resist pattern (not shown) in a predetermined shape is formed onto the $SiO_2$ film by lithography. By using the resist pattern as a mask, the $SiO_2$ film is etched by, for example, wet etching using a hydrofluoric acid etchant or the RIE method using an etching gas containing fluorine such as $CF_4$, $CHF_3$, or the like and patterned. The growing mask 26 is formed as mentioned above. It is desirable that the shape of the opening portion of the growing mask 26 is a hexagonal shape in which one side is parallel with the <11-20> direction.

Figure 31A:
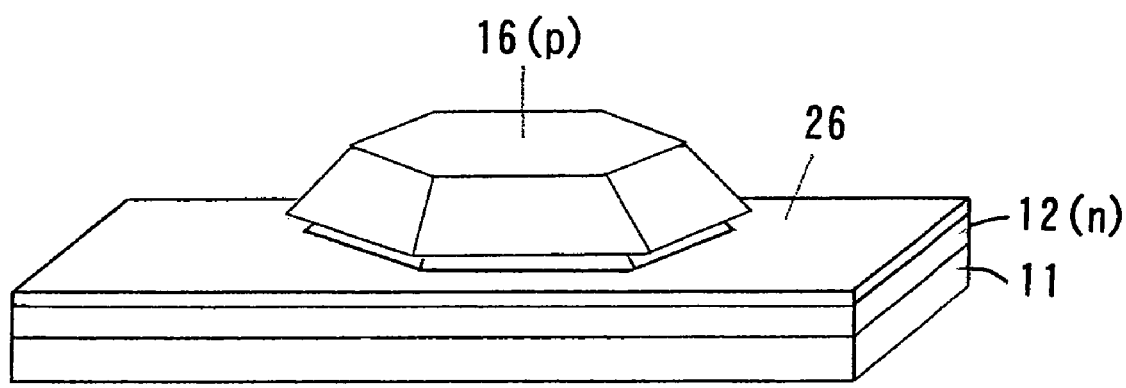
FIGS. 31A and 31B are a perspective view and a cross sectional view for explaining the manufacturing method of the GaN light emitting diode according to the 19th embodiment of the invention.
Figure 31B:
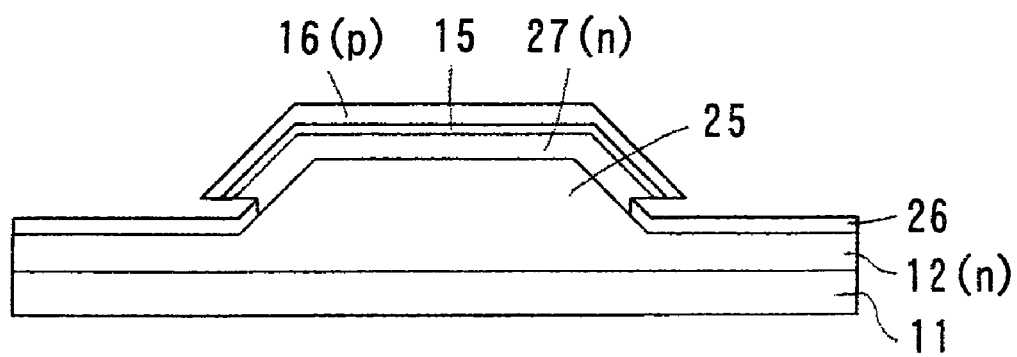

Subsequently, as shown in FIGS. 31A and 31B, an n-type GaN layer 27, the active layer 15, and the p-type GaN layer 16 are sequentially and selectively grown on the hexagonal cone frustum portion 25 in the opening portion by using the growing mask 26. In this case, since the active layer 15 can be grown onto the flat and clean surface of the n-type GaN layer 27, the active layer 15 of excellent crystalline performance can be certainly obtained. The preferable shape of the hexagonal cone frustum portion 25 can be obtained. The active layer 15 and the p-type GaN layer 16 can be desirably grown over the hexagonal cone frustum portion 25.

Figure 32A:
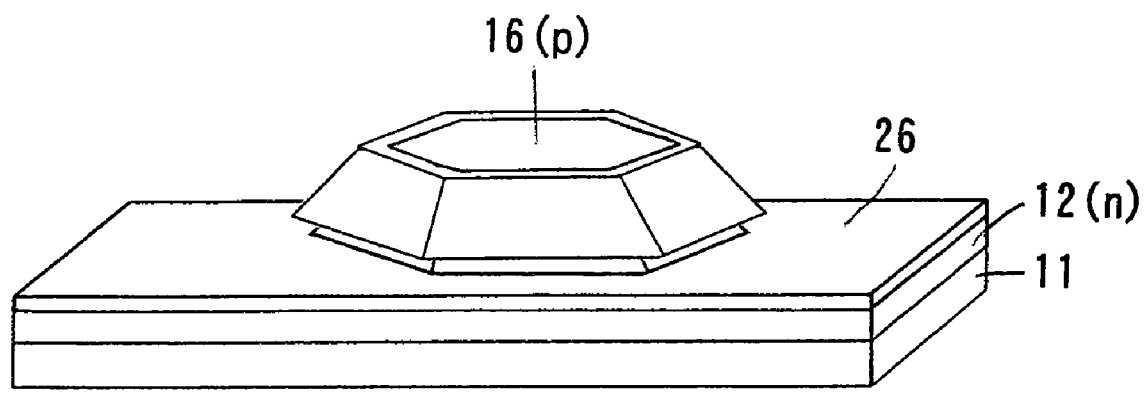
FIGS. 32A and 32B are a perspective view and a cross sectional view for explaining the manufacturing method of the GaN light emitting diode according to the 19th embodiment of the invention.
Figure 32B:
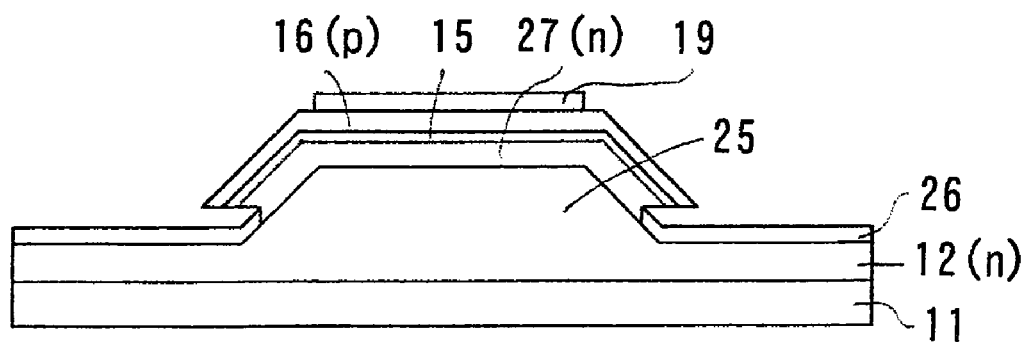

Subsequently, as shown in FIGS. 32A and 32B, the hexagonal p-side electrode 19 of, for example, the Ni/Pt/Au structure or the Pd/Pt/Au structure is formed onto the upper surface of the p-type GaN layer 16 grown over the upper surface that includes the C plane of the hexagonal cone frustum portion 25 of the n-type GaN layer 12 in a manner similar to the first embodiment. For example, a p-side electrode of the Ni/Ag/Au structure containing the Ag film whose reflectance is high or a p-side electrode of the Re/Au structure containing the Re film whose reflectance is likewise high can be used as a p-side electrode 19. By using those electrodes, the reflectance on the upper surface of the p-type GaN layer 17 over the hexagonal cone frustum portion 25 can be raised, the extracting efficiency of the light can be raised, and the light emitting efficiency can be raised. In the case of using the p-side electrode of the Ni/Ag/Au structure as a p-side electrode 19, if the Ni film is too thick, an amount of light which reaches the Ag film decreases and the purpose in which the Ag film is included as a reflective film becomes meaningless. Therefore, the Ni film is formed as thin as possible so as to be equal to, for example, about 2 nm and it is sufficient that thickness of each of the Ag film and the Au film is equal to, for example, about 100 nm. Preferably, the p-side electrode 19 is formed so as to avoid the portion over a corner portion between the upper surface and the side surface of the hexagonal cone frustum portion 25. This is because the crystalline performance of each of the active layer 15 and the p-type GaN layers 16 near the corner portion is often inferior to that of the other portion.

Figure 33A:
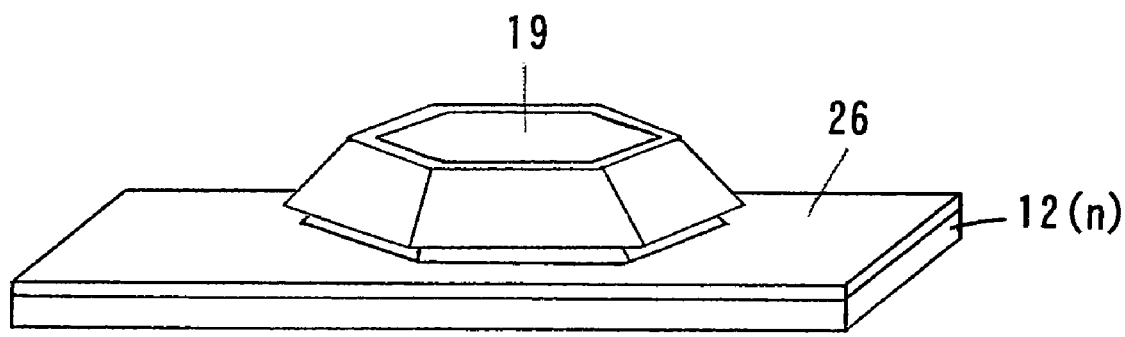
FIGS. 33A and 33B are a perspective view and a cross sectional view for explaining the manufacturing method of the GaN light emitting diode according to the 19th embodiment of the invention.
Figure 33B:
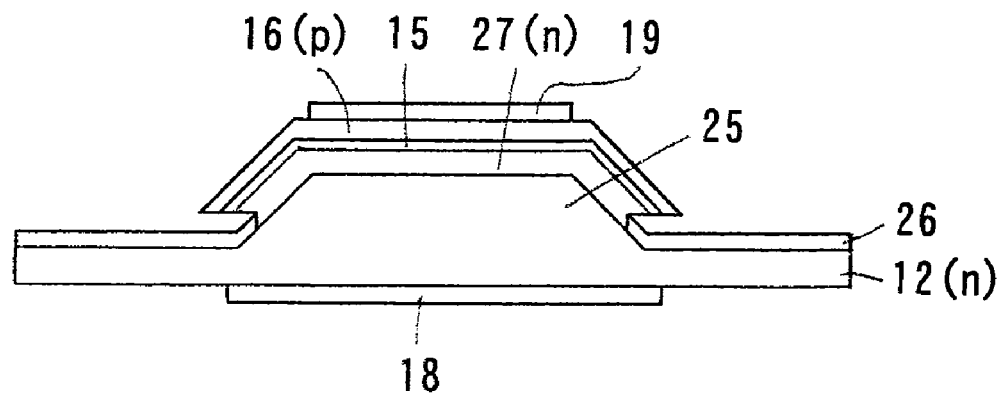

Subsequently, by irradiating the laser beam by, for example, the excimer laser or the like from the back surface side of the sapphire substrate 11, the n-type GaN layer 12 and the portions existing on/over it are peeled off from the sapphire substrate 11. Subsequently, the back surface of the n-type GaN layer 12 peeled off as mentioned above is flattened by etching or the like. After that, as shown in FIGS. 33A and 33B, the n-side electrode 18 is formed onto the back surface of the n-type GaN layer 12 in a manner similar to the second embodiment. In this case, a transparent electrode that includes, for example, ITO or the like is used as an n-side electrode 18 and, in order to enable the ohmic contact with the n-type GaN layer 12 to be more preferably obtained, a pad of, for example, the Ti/Au structure is formed into the portion of the back surface of the n-type GaN layer 12 where no problem occurs when the light is extracted. After that, the transparent electrode is formed.

After that, the substrate on which the light emitting diode structure has been formed as mentioned above is formed in a chip shape by etching by the RIE, daisa, or the like.

A construction other than the above construction is similar to those of the first and second embodiments.

According to the 19th embodiment, in addition to the advantages in the first and second embodiments, the light emitted in the oblique downward direction from the active layer 15 formed in the upper surface portion of the hexagonal cone frustum portion 25 can be reflected downward by the side surface of the p-type GaN layer 16 formed over the inclined side surface of the hexagonal cone frustum portion 25. It is possible to obtain the advantages such that the extracting efficiency of the light can be raised and the light emitting efficiency can be further raised.

The 20th embodiment of the invention will now be described.

In the 20th embodiment, the steps are progressed in a manner similar to the 13th embodiment and, as shown in FIGS. 25A and 25B, the hexagonal cone frustum portion 25 is formed in the n-type GaN layer 12. After that, an n-type GaN layer can be also thinly grown onto the GaN processed substrate as necessary.

Figure 34A:
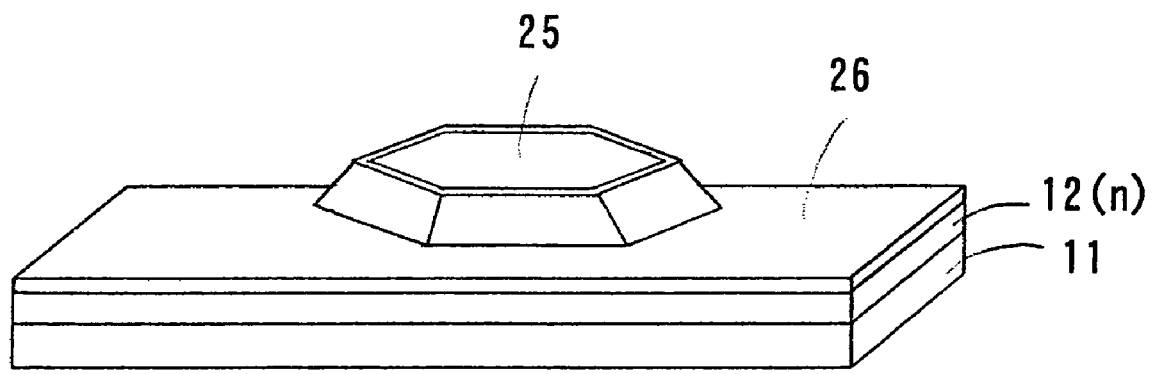
FIGS. 34A and 34B are a perspective view and a cross sectional view for explaining a manufacturing method of a GaN light emitting diode according to the 20th embodiment of the invention.
Figure 34B:
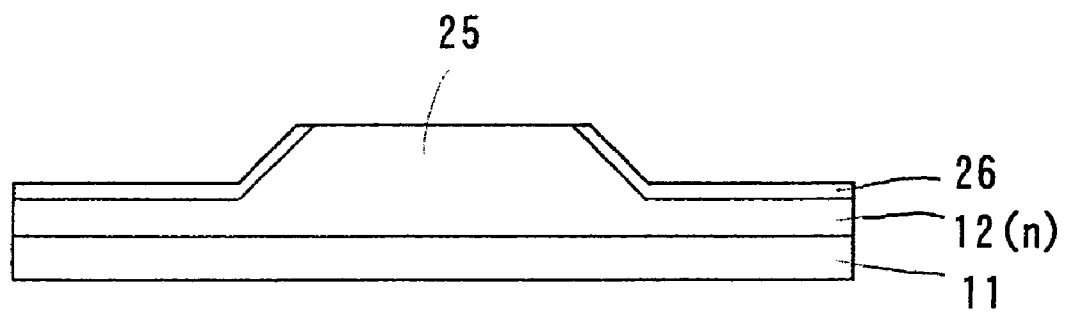

Subsequently, as shown in FIGS. 34A and 34B, the growing mask 26 that includes, for example, an SiO₂ film, an SiN film, or the like is formed so that only the upper surface of the hexagonal cone frustum portion 25 is exposed. A forming method of the growing mask 26 is similar to that in the 19th embodiment.

Figure 35A:
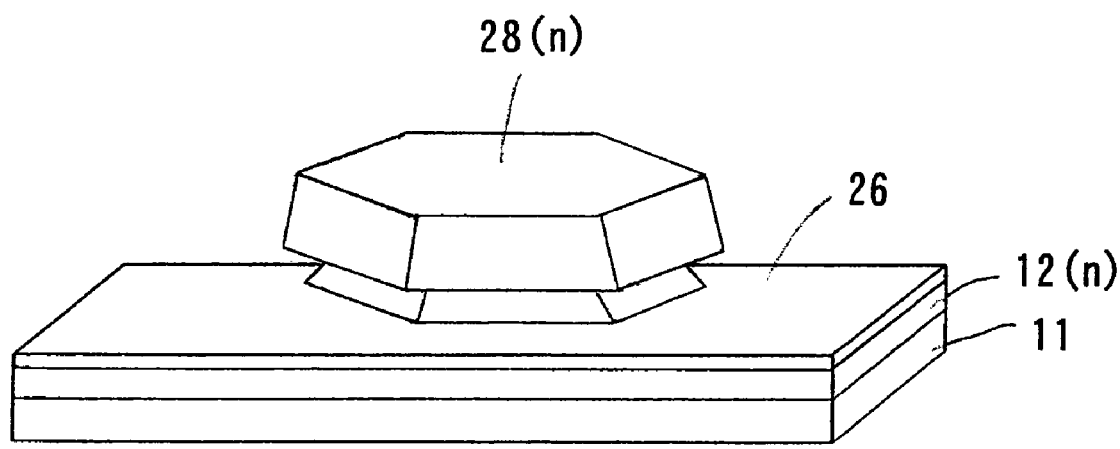
FIGS. 35A and 35B are a perspective view and a cross sectional view for explaining the manufacturing method of the GaN light emitting diode according to the 20th embodiment of the invention.
Figure 35B:
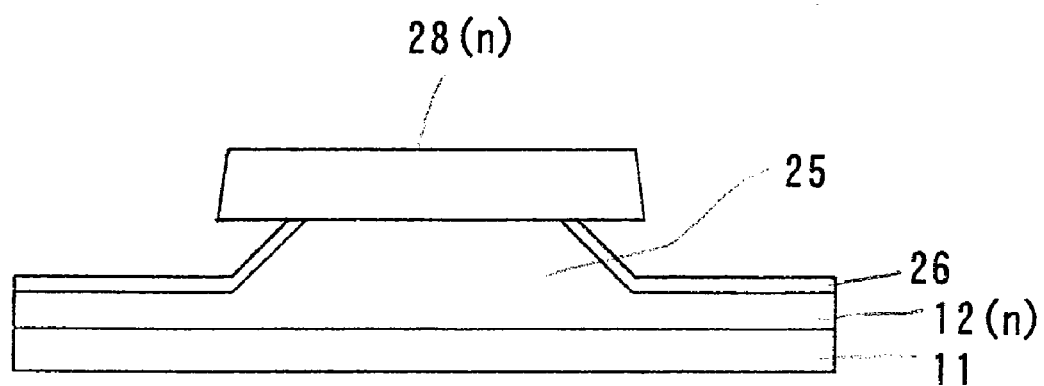

Subsequently, as shown in FIGS. 35A and 35B, first, an n-type GaN layer 28 in which, for example, Si has been doped as n-type impurities is selectively grown onto the upper surface of the hexagonal cone frustum portion 25 by using the growing mask 26 until it overflows from the upper surface of the hexagonal cone frustum portion 25.

Figure 36A:
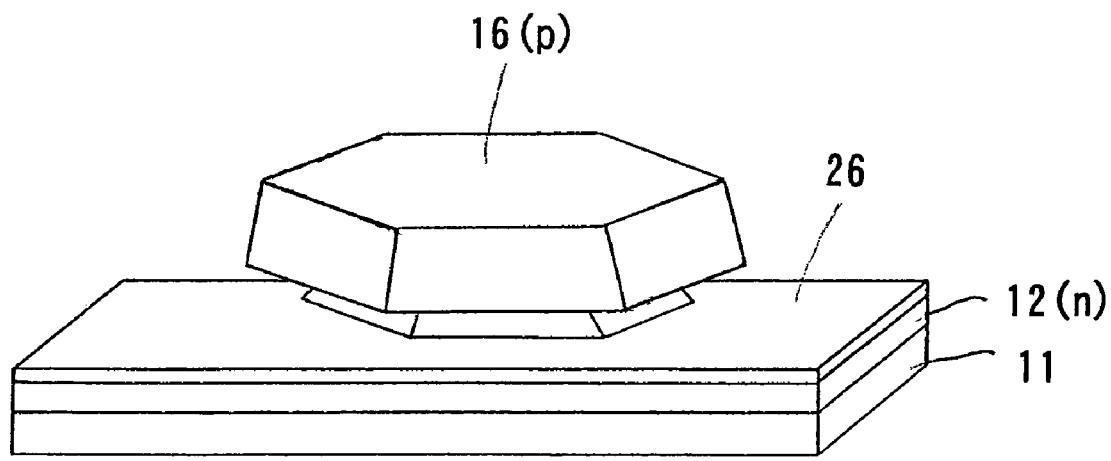
FIGS. 36A and 36B are a perspective view and a cross sectional view for explaining the manufacturing method of the GaN light emitting diode according to the 20th embodiment of the invention.
Figure 36B:
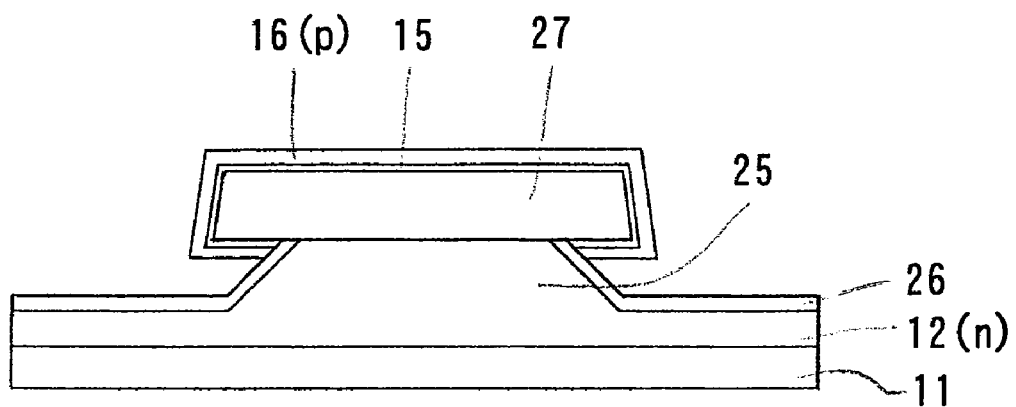

Subsequently, as shown in FIGS. 36A and 36B, the active layer 15 and the p-type GaN layer 16 are selectively grown onto the n-type GaN layer 28. In this case, it is also possible that, first, the n-type GaN layer is thinly grown onto the GaN processed substrate just before the active layer 15 is grown and the active layer 15 is subsequently grown onto the n-type GaN layer.

Figure 37A:
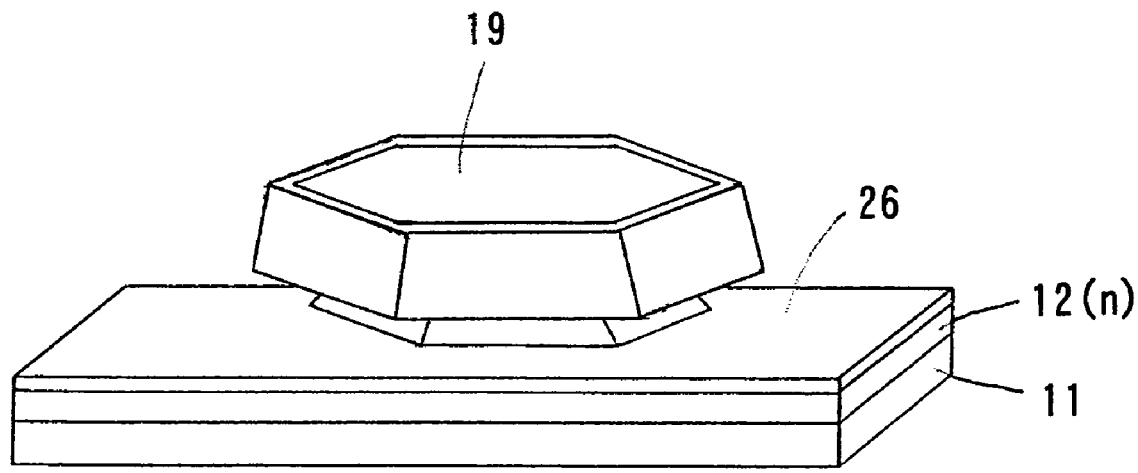
FIGS. 37A and 37B are a perspective view and a cross sectional view for explaining the manufacturing method of the GaN light emitting diode according to the 20th embodiment of the invention.
Figure 37B:
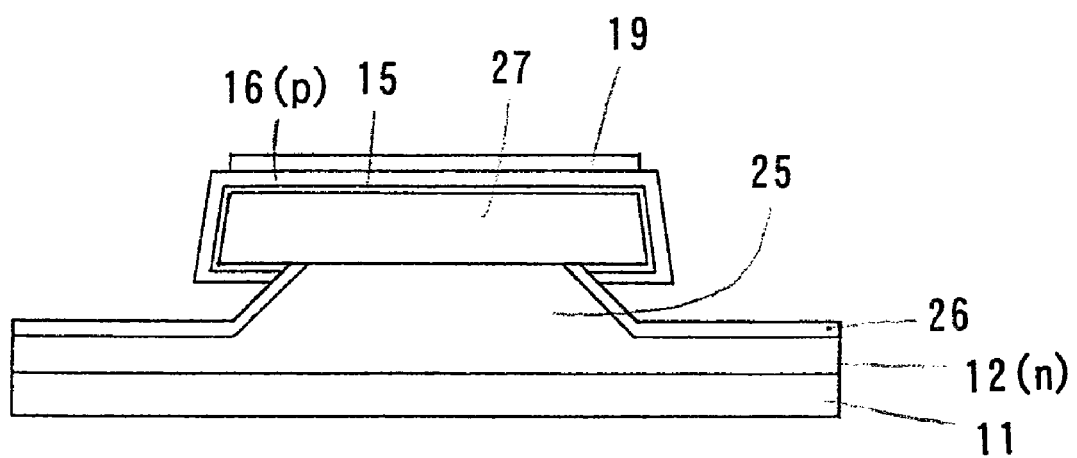

Subsequently, as shown in FIGS. 37A and 37B, the hexagonal p-side electrode 19 of, for example, the Ni/Pt/Au structure or the Pd/Pt/Au structure is formed onto the upper surface of the p-type GaN layer 16 grown over the upper surface that includes the C plane of the hexagonal cone frustum portion 25 of the n-type GaN layer 12 in a manner similar to the first embodiment. For example, a p-side electrode of the Ni/Ag/Au structure containing the Ag film whose reflectance is high or a p-side electrode of the Re/Au structure containing the Re film whose reflectance is likewise high is used as a p-side electrode 19. By using those electrodes, the reflectance on the upper surface of the p-type GaN layer 17 over the hexagonal cone frustum portion 25 can be raised, the extracting efficiency of the light can be raised, and the light emitting efficiency can be raised.

Figure 38A:
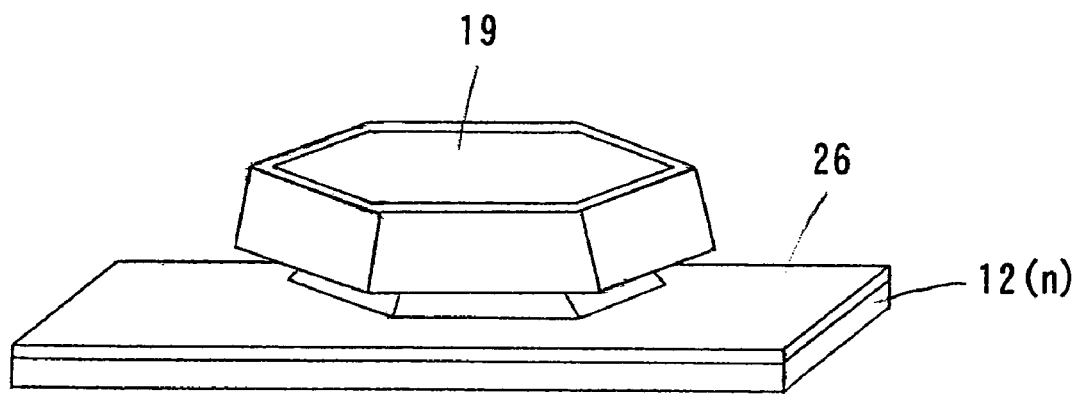
FIGS. 38A and 38B are a perspective view and a cross sectional view for explaining the manufacturing method of the GaN light emitting diode according to the 20th embodiment of the invention.
Figure 38B:
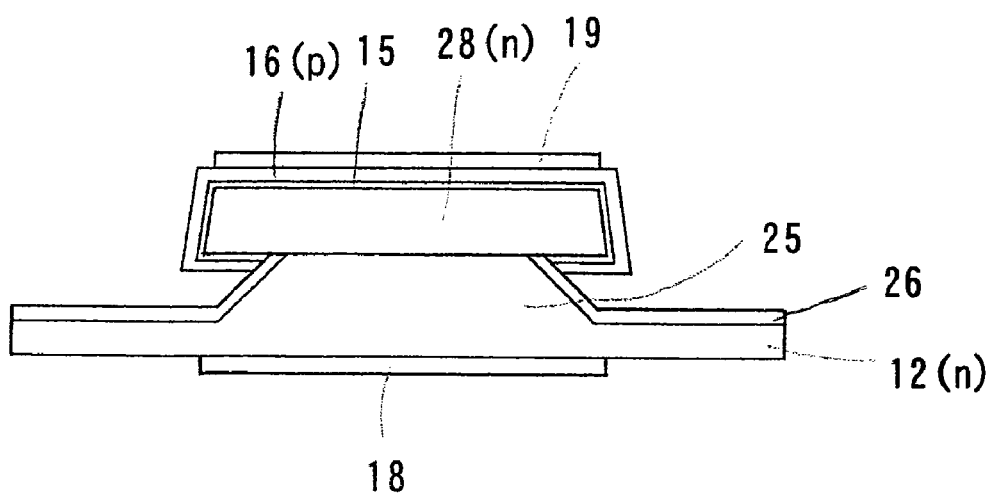

Subsequently, by irradiating the laser beam by, for example, the excimer laser or the like from the back surface side of the sapphire substrate 11, the n-type GaN layer 12 and the portions existing on/over it are peeled off from the sapphire substrate 11. Subsequently, the back surface of the n-type GaN layer 12 peeled off as mentioned above is flattened by etching or the like. After that, as shown in FIGS. 38A and 38B, the n-side electrode 18 is formed onto the back surface of the n-type GaN layer 12 in a manner similar to the second embodiment. In this case, a transparent electrode that includes, for example, ITO or the like is used as an n-side electrode 18 and, in order to enable the ohmic contact with the n-type GaN layer 12 to be more preferably obtained, a pad of, for example, the Ti/Au structure is formed into the portion of the back surface of the n-type GaN layer 12 where no problem occurs when the light is extracted. After that, the transparent electrode is formed.

After that, the substrate on which the light emitting diode structure has been formed as mentioned above is formed in a chip shape by etching by the RIE, daisa, or the like.

A construction other than the above construction is similar to those of the first and second embodiments.

According to the 20th embodiment, advantages similar to those in the first and second embodiments can be obtained.

Figure 39:
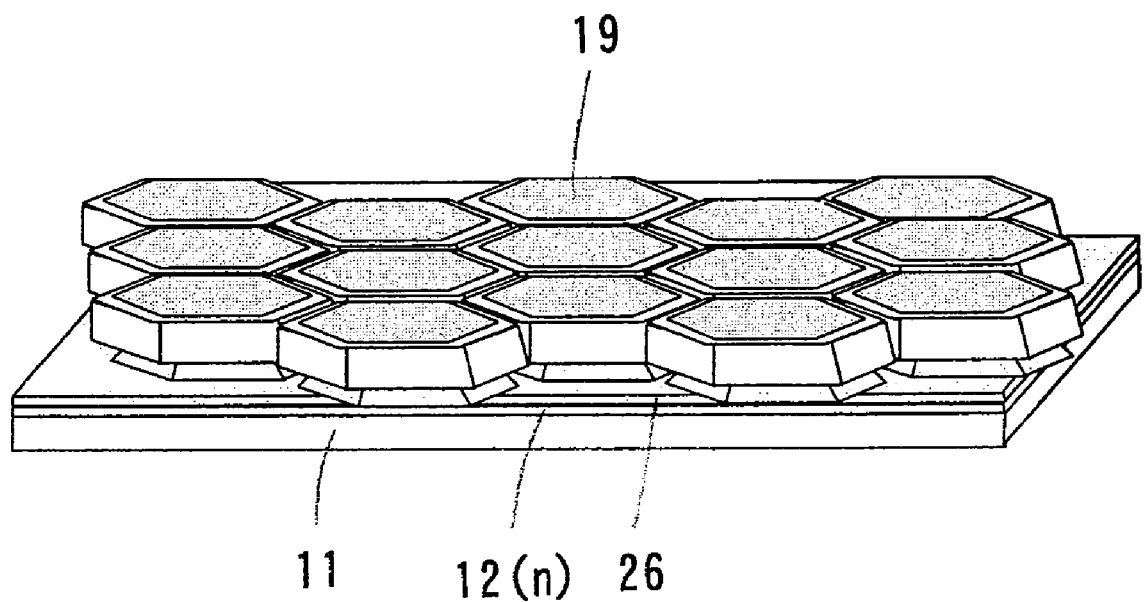
FIG. 39 is a perspective view for explaining the manufacturing method of the GaN light emitting diode according to the 20th embodiment of the invention.

In the 20th embodiment, as shown in FIG. 39, in dependence of the intervals, layout, or the like at the time of forming the hexagonal cone frustum portions 25, when the n-type GaN layer 28 is selectively grown, due to the competition between the n-type GaN layers 28 which are grown from the adjacent hexagonal cone frustum portions 25 in the lateral direction, the growth is finished at a point of time when both of them meet and a boundary is formed. In this case, since mechanical strength of the boundary portion of the n-type GaN layers 28 is generally small, when the n-type GaN layer 12 and the portions existing on/over it are peeled off from the sapphire substrate 11, the devices are naturally separated and the GaN light emitting diode chip can be obtained.

The 21st embodiment of the invention will now be described.

Figure 40A:
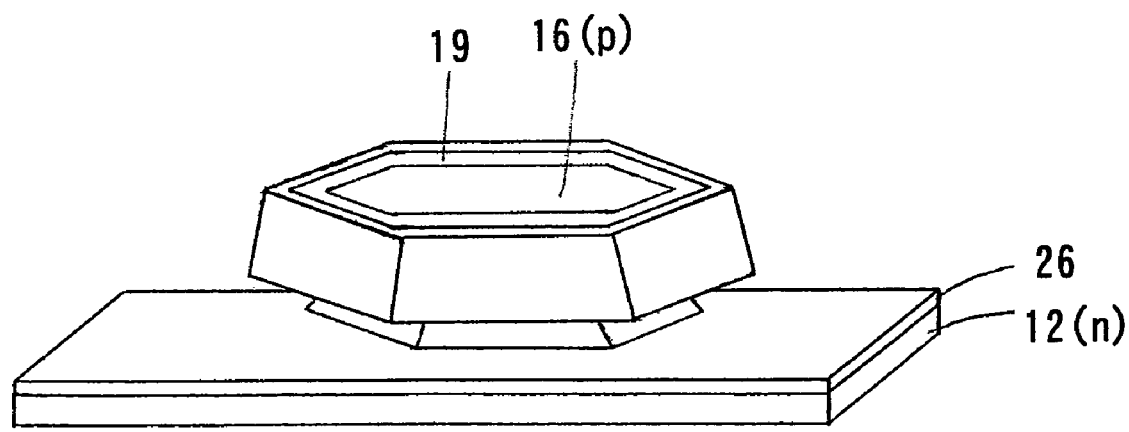
FIGS. 40A and 40B are a perspective view and a cross sectional view for explaining a manufacturing method of a GaN light emitting diode according to the 21st embodiment of the invention.
Figure 40B:
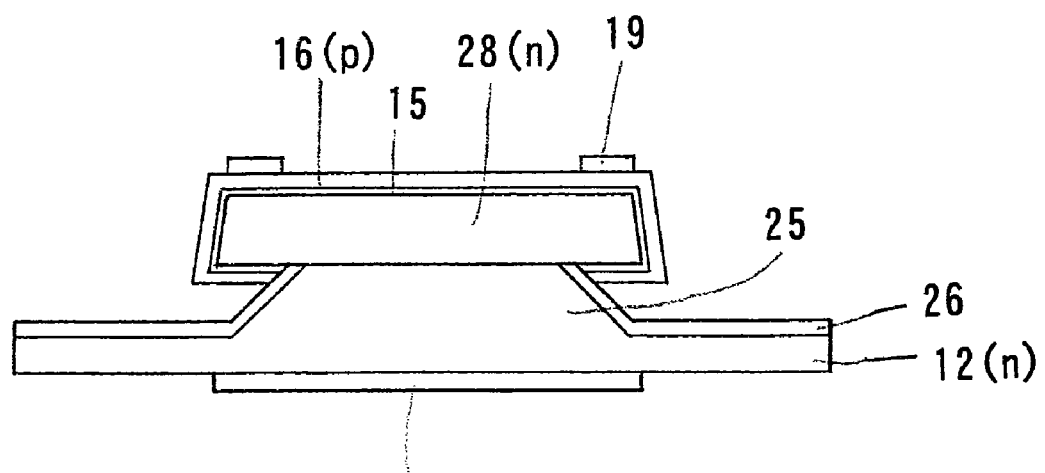

In the 21st embodiment, after the steps were progressed and up to the process to form the etching mask 13 was executed in a manner similar to the seventh embodiment, as shown in FIGS. 40A and 40B, the hexagonal ring-shaped p-side electrode 19 is formed onto the upper surface of the p-type GaN layer 16 grown over the n-type GaN layer 28 grown onto the upper surface that includes the C plane of the hexagonal cone frustum portion 25 of the n-type GaN layer 12. In this case, it is designed that the inner rim of the p-side electrode 19 is located outside of the outer rim of the upper surface of the hexagonal cone frustum portion 25. This is because although the dislocation of the hexagonal cone frustum portion 25 as an underground is propagated to the n-type GaN layer 28 in the portion just on the hexagonal cone frustum portion 25 upon selective growth, since the dislocation is hardly propagated to the n-type GaN layer 28 in the portion grown in the lateral direction so as to overflow from the hexagonal cone frustum portion 25 and the good crystalline performance is obtained, the crystalline performance of each of the active layer 15 and the p-type GaN layer 16 grown on the n-type GaN layer 28 having the excellent crystalline performance is also excellent, so that it is desirable to form the p-side electrode 19 by limiting its forming position to the positions on/over the active layer 15 and the p-type GaN layer 16.

A construction other than the above construction is similar to those of the 13th and 20th embodiments.

According to the 21st embodiment, advantages similar to those in the 13th embodiment can be obtained.

The 22nd embodiment of the invention will now be described.

Figure 41A:
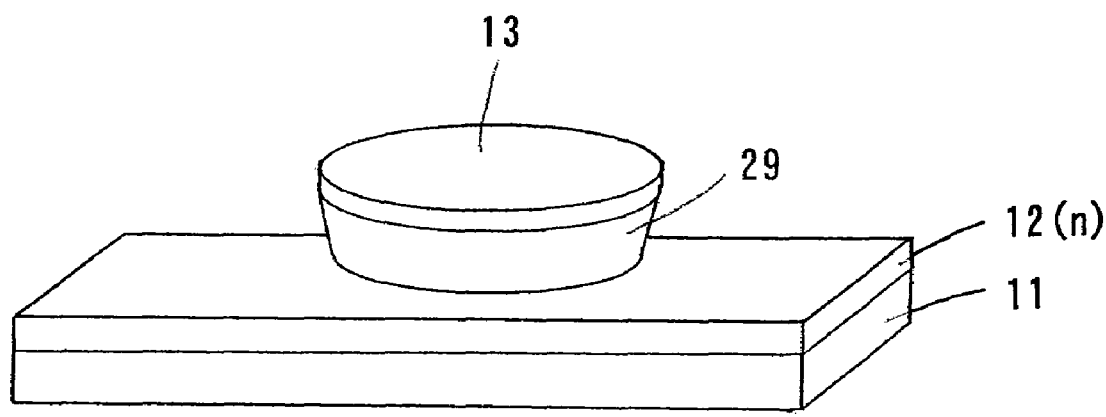
FIGS. 41A and 41B are a perspective view and a cross sectional view for explaining a manufacturing method of a GaN light emitting diode according to the 22nd embodiment of the invention.
Figure 41B:
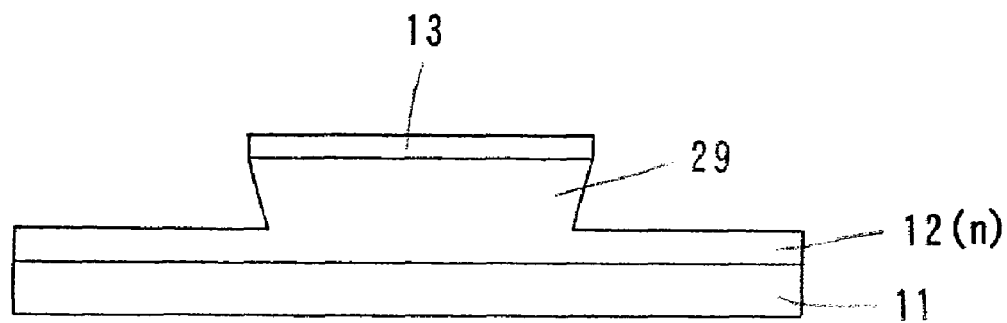

In the 22nd embodiment, after the steps were progressed and up to the process to form the etching mask 13 was executed in a manner similar to the seventh embodiment, as shown in FIGS. 41A and 41B, the n-type GaN layer 12 is etched to a predetermined depth by the RIE method using a predetermined etching gas by using the etching mask 13, so that an inverse circular cone frustum portion 29 in an inverse taper shape is formed.

Figure 42A:
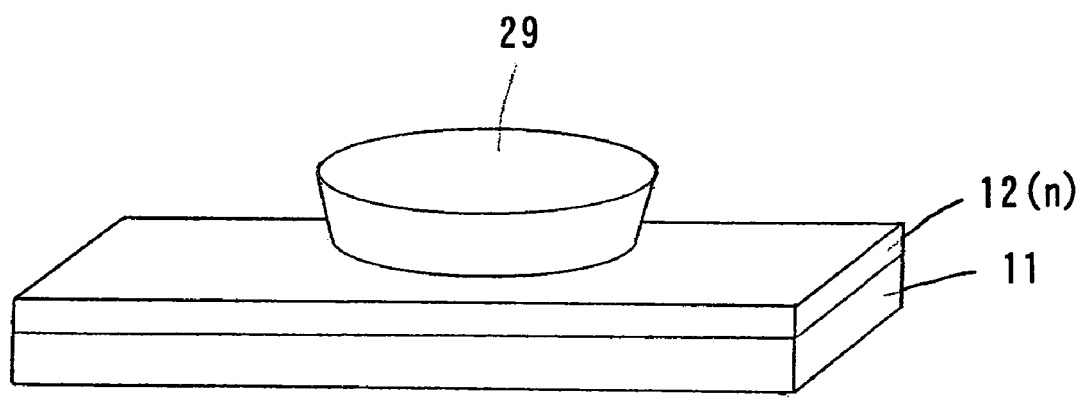
FIGS. 42A and 42B are a perspective view and a cross sectional view for explaining the manufacturing method of the GaN light emitting diode according to the 22nd embodiment of the invention.
Figure 42B:
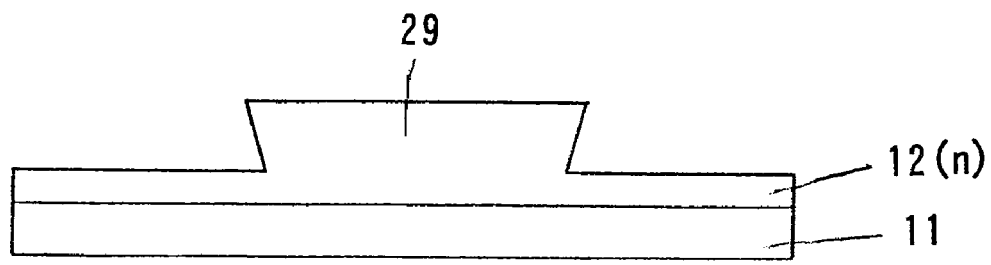

Subsequently, the etching mask 13 is removed by, for example, the plasma ashing or the like. Thus, as shown in FIGS. 42A and 42B, a GaN processed substrate on which the inverse circular cone frustum portion 29 whose upper surface consists of the C plane has been formed is obtained on the surface of the n-type GaN layer 12.

Figure 43A:
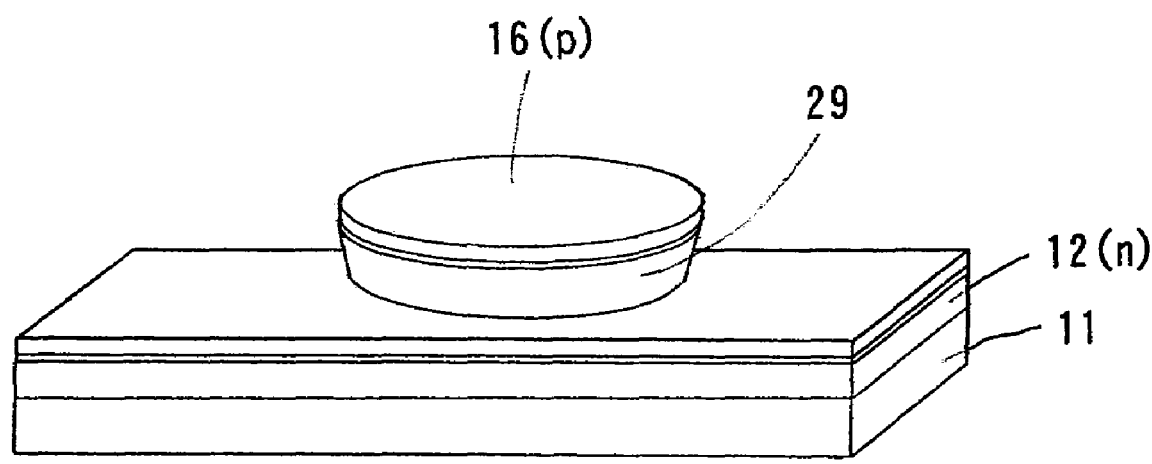
FIGS. 43A and 43B are a perspective view and a cross sectional view for explaining the manufacturing method of the GaN light emitting diode according to the 22nd embodiment of the invention.
Figure 43B:
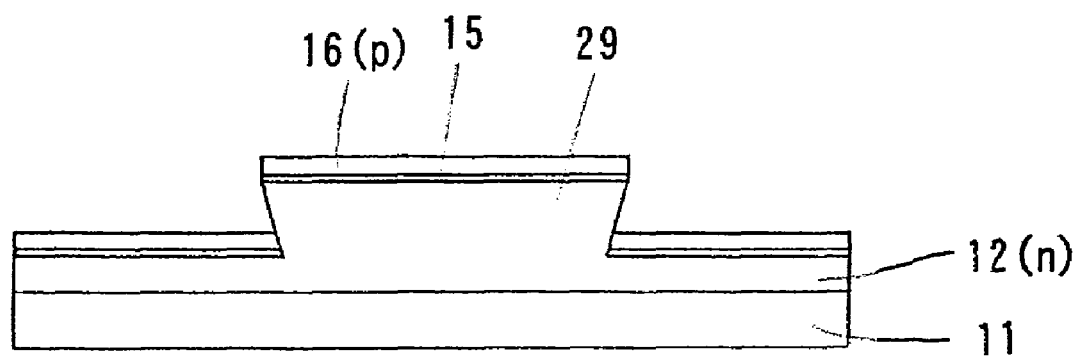

Subsequently, as shown in FIGS. 43A and 43B, the active layer 15 and the p-type GaN layer 16 are sequentially grown in a manner similar to the first embodiment. In this case, it is possible to design so that the active layer 15 and the p-type GaN layer 16 are not grown on the side surface of the inverse circular cone frustum portion 29. It is also possible that, first, an n-type GaN layer is thinly grown onto the GaN processed substrate just before the active layer 15 is grown and, subsequently, the active layer 15 is grown onto the n-type GaN layer.

Figure 44A:
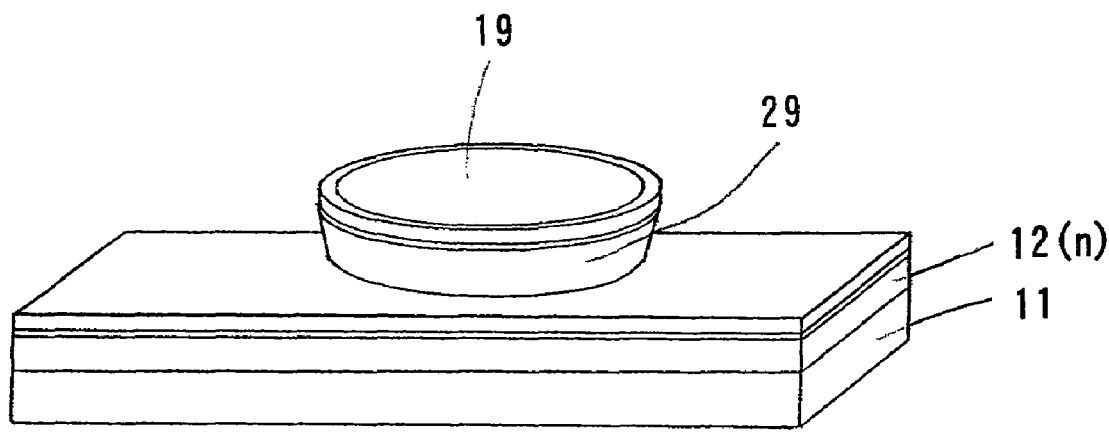
FIGS. 44A and 44B are a perspective view and a cross sectional view for explaining the manufacturing method of the GaN light emitting diode according to the 22nd embodiment of the invention.
Figure 44B:
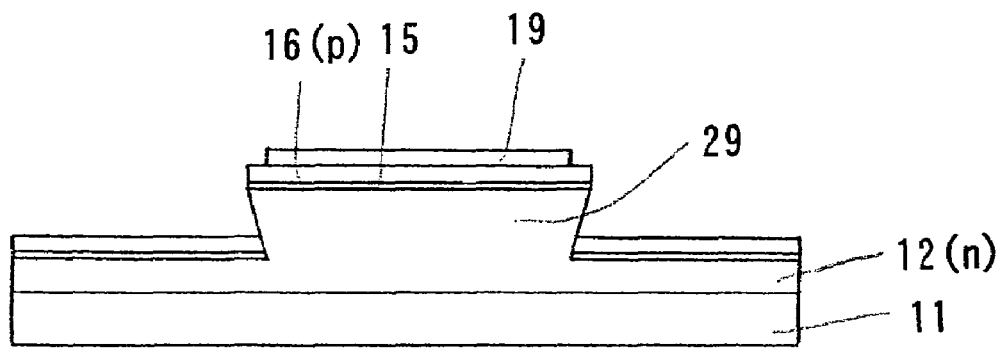

Subsequently, as shown in FIGS. 44A and 44B, the circular p-side electrode 19 of, for example, the Ni/Pt/Au structure or the Pd/Pt/Au structure is formed onto the upper surface of the p-type GaN layers 16 grown over the upper surface that includes the C plane of the inverse circular cone frustum portion 29 of the n-type GaN layer 12 in a manner similar to the first embodiment. A p-side electrode of, for example, the Ni/Ag/Au structure containing the Ag film whose reflectance is high or a p-side electrode of the Re/Au structure containing the Re film whose reflectance is likewise high can be used as a p-side electrode 19.

Figure 45A:
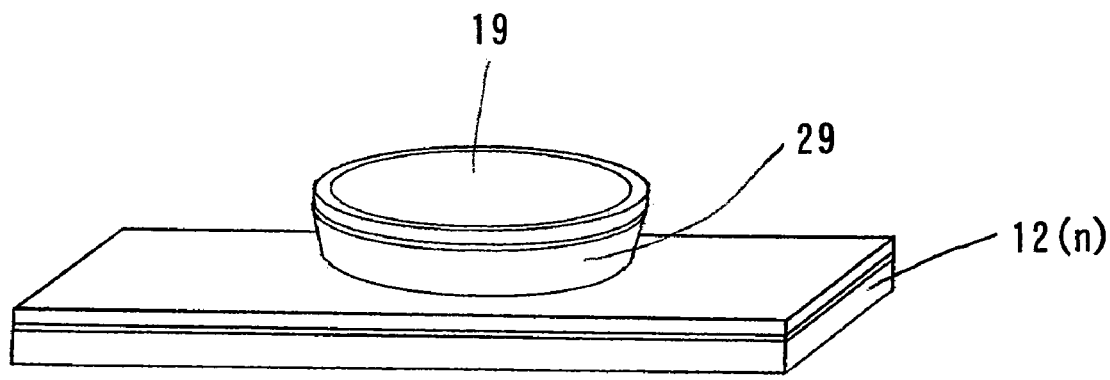
FIGS. 45A and 45B are a perspective view and a cross sectional view for explaining a manufacturing method of a GaN light emitting diode according to the 23rd embodiment of the invention.
Figure 45B:
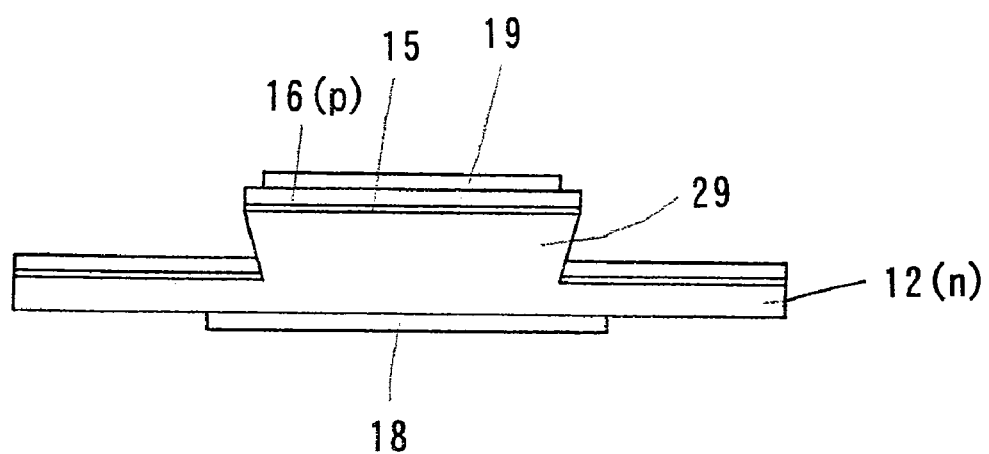

Subsequently, by irradiating the laser beam by, for example, the excimer laser or the like from the back surface side of the sapphire substrate 11, the n-type GaN layer 12 and the portions existing on/over it are peeled off from the sapphire substrate 11. After the back surface of the n-type GaN layer 12 peeled off as mentioned above was flattened by etching or the like, the n-side electrode 18 is formed onto the back surface of the n-type GaN layer 12 as shown in FIGS. 45A and 45B in a manner similar to the second embodiment. In this case, a transparent electrode that includes, for example, ITO or the like is used as an n-side electrode 18. In order to enable the ohmic contact with the n-type GaN layer 12 to be more preferably obtained, a pad of, for example, the Ti/Au structure is formed into the portion of the back surface of the n-type GaN layer 12 where no problem occurs when the light is extracted. After that, the transparent electrode is formed.

After that, the substrate on which the light emitting diode structure has been formed as mentioned above is formed in a chip shape by etching by the RIE, daisa, or the like.

A construction other than the above construction is similar to those of the first and second embodiments.

According to the 22nd embodiment, advantages similar to those of the first and second embodiments can be obtained.

The 23rd embodiment of the invention will now be described.

In the 23rd embodiment, in a GaN light emitting diode shown in FIGS. 45A and 45B, a transparent electrode that includes, for example, ITO or the like is used as a p-side electrode 19. An n-side electrode of, for example, the Ni/Pt/Au structure, Pd/Pt/Au structure, Ni/Ag/Au structure, Re/Au structure, or the like is used as an n-side electrode 18. In this case, the light is extracted to the outside via the p-side electrode 19.

A construction other than the above construction is similar to that of the 22nd embodiment.

According to the 23rd embodiment, advantages similar to those in the seventh embodiment can be obtained.

The 24th embodiment of the invention will now be described.

Figure 46A:
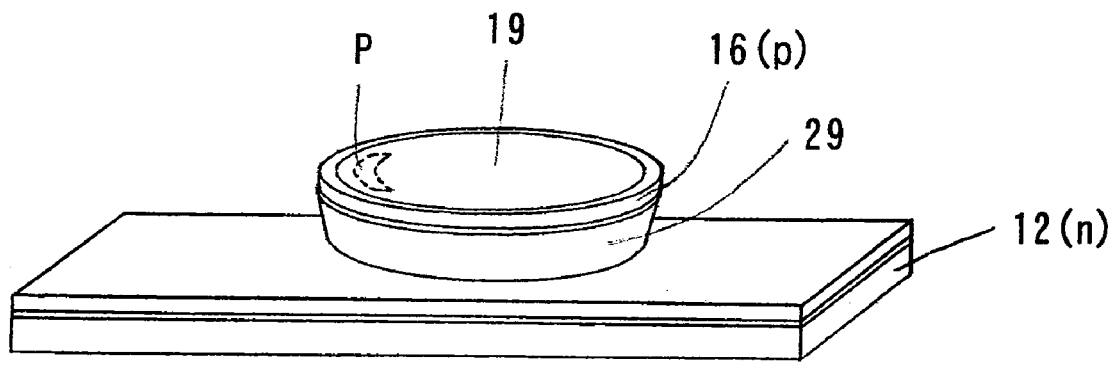
FIGS. 46A and 46B are a perspective view and a cross sectional view for explaining a manufacturing method of a GaN light emitting diode according to the 24th embodiment of the invention.
Figure 46B:
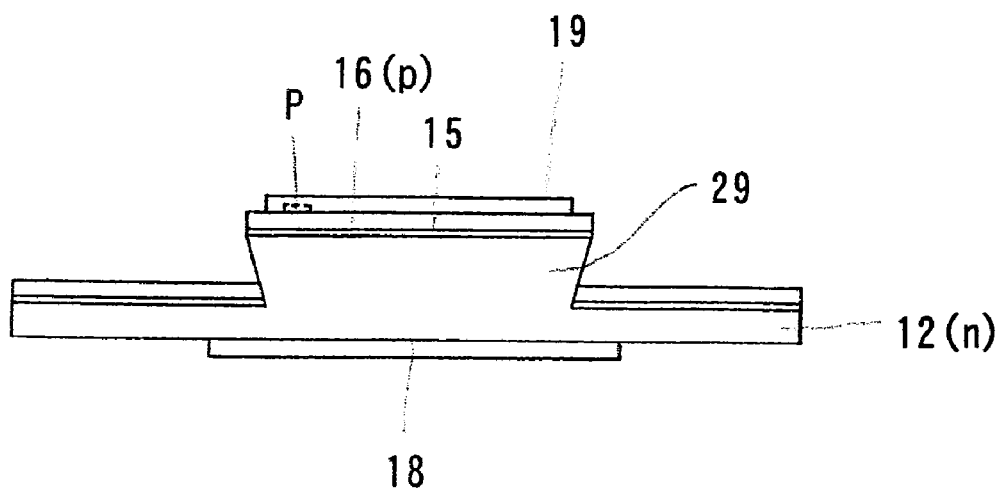

In the 24th embodiment, in the GaN light emitting diode shown in FIGS. 45A and 45B, as shown in FIGS. 46A and 46B, first, the pad P of a small area that includes Ti/Pt/Au having excellent ohmic contact characteristics is formed as a p-side electrode 19 into a part of the corner portion of the upper surface of the inverse circular cone frustum portion 29. After that, the p-side electrode 19 that includes an Ni/Au metal laminated film extending to substantially the whole upper surface of the inverse circular cone frustum portion 29 is formed onto the p-type GaN layer 16 so as to cover the pad P. In the Ni/Au metal laminated film, Ni film is thinly formed so that the thickness is equal to, for example, about 2 nm and the Au film is thinly formed so that the thickness is equal to, for example, about 10 nm, thereby setting a light transmittance of the Ni/Au metal laminated film to be sufficiently high. An n-side electrode of, for example, the Ni/Pt/Au structure, Pd/Pt/Au structure, Ni/Ag/Au structure, Re/Au structure, or the like is used as an n-side electrode 18. In this case, the light is extracted to the outside via the p-side electrode 19.

A construction other than the above construction is similar to that of the seventh embodiment.

According to the 24th embodiment, advantages similar to those of the seventh embodiment can be obtained.

The 25th embodiment of the invention will now be described.

Figure 47A:
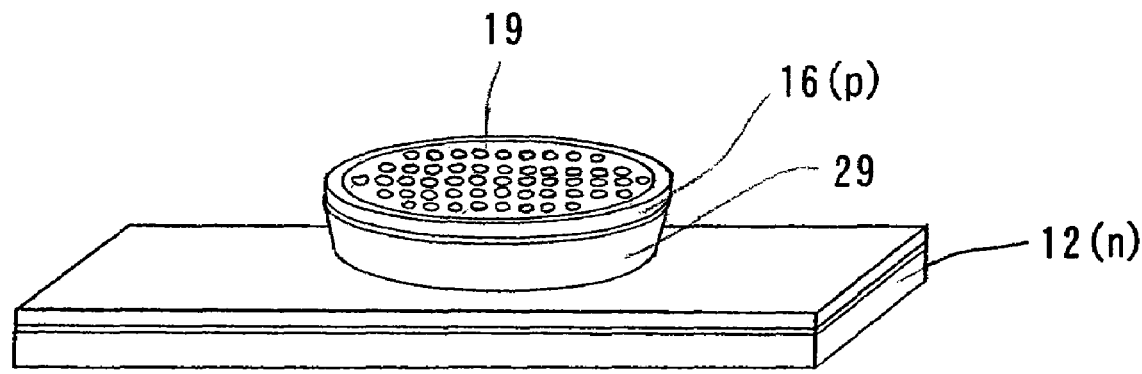
FIGS. 47A and 47B are a perspective view and a cross sectional view for explaining a manufacturing method of a GaN light emitting diode according to the 25th embodiment of the invention.
Figure 47B:
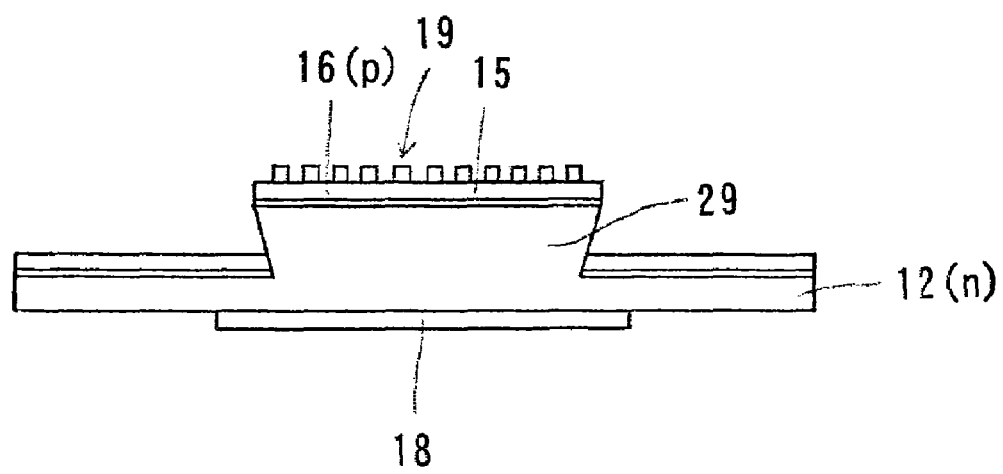

In the 25th embodiment, in the GaN light emitting diode shown in FIGS. 45A and 45B, the p-side electrode 19 is formed like a mesh as shown in FIGS. 47A and 47B. An n-side electrode of, for example, the Ni/Pt/Au structure, Pd/Pt/Au structure, Ni/Ag/Au structure, Re/Au structure, or the like is used as an n-side electrode 18. By forming the p-side electrode 19 like a mesh as mentioned above, the light can be preferably extracted via gaps of the p-side electrode 19.

A construction other than the above construction is similar to that of the 22nd embodiment.

According to the 25th embodiment, advantages similar to those in the seventh embodiment can be obtained.

The 26th embodiment of the invention will now be described.

In the 26th embodiment, the steps are progressed and up to the process to grow the p-type GaN layer 16 is executed in a manner similar to the 22nd embodiment. This state is similar to that shown in FIGS. 43A and 43B.

Figure 48:
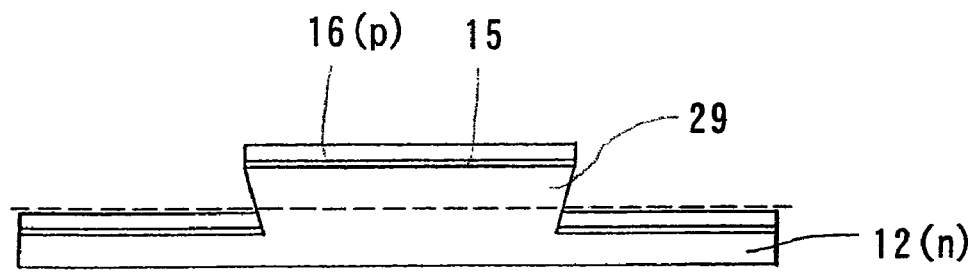
FIGS. 48 to 50 are cross sectional views for explaining a manufacturing method of a GaN light emitting diode according to the 26th embodiment of the invention.

Subsequently, by irradiating the laser beam by, for example, the excimer laser or the like from the back surface side of the sapphire substrate 11, the n-type GaN layer 12 and the portions existing on/over it are peeled off from the sapphire substrate 11. This state is shown in FIGS. 48A and 48B.

Figure 49:
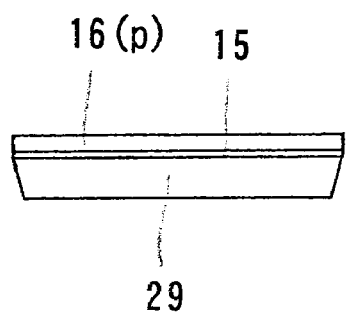

Subsequently, in a state where the front surface side of the n-type GaN layer 12 where the active layer 15 and the p-type GaN layer 16 have been formed is covered and protected with, for example, a resist (not shown) or the like, the back surface of the n-type GaN layer 12 is etched by, for example, the RIE method to a position shown by a broken line. Thus, as shown in FIG. 49, the inverse circular cone frustum portion 29 is extracted and the devices are separated.

Figure 50:
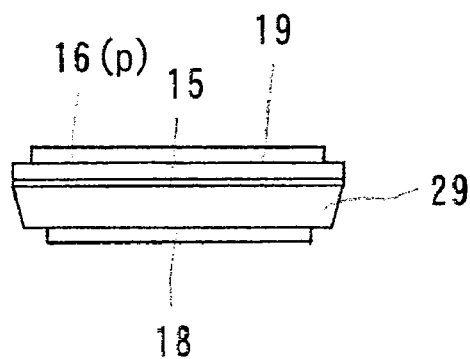

After that, as shown in FIG. 50, the p-side electrode 19 that includes the transparent electrode is formed onto the p-type GaN layer 16 and the n-side electrode 18 is formed onto the back surface of the n-type GaN layer 12, thereby completing the target GaN light emitting diode.

A construction other than the above construction is similar to that of the 22nd embodiment.

According to the 26th embodiment, advantages similar to those in the seventh embodiment can be obtained.

The 27th embodiment of the invention will now be described.

In the 27th embodiment, the steps are progressed and up to the process to form the p-side electrode 19 is executed in a manner similar to the seventh embodiment. Further, by irradiating the laser beam by, for example, the excimer laser or the like from the back surface side of the sapphire substrate 11, the n-type GaN layer 12 and the portions existing on/over it are peeled off from the sapphire substrate 11.

Figure 51:
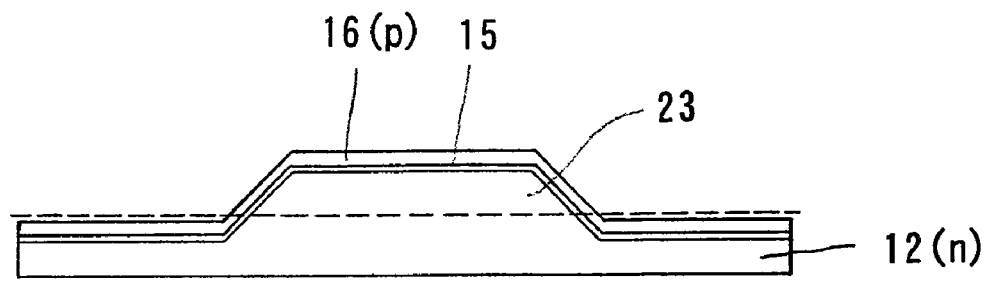
FIGS. 51 to 53 are cross sectional views for explaining a manufacturing method of a GaN light emitting diode according to the 27th embodiment of the invention.
Figure 52:
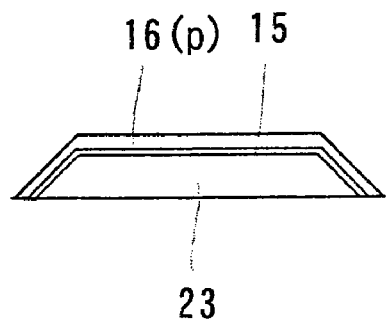

Subsequently, in a state where the front surface side of the n-type GaN layer 12 where the p-side electrode 19 has been formed is covered and protected by, for example, the resist (not shown) as shown in FIG. 51, the back surface of the n-type GaN layer 12 is etched by, for example, the RIE method to a position shown by a broken line. Thus, as shown in FIG. 52, the circular cone frustum portion 23 is extracted and the devices are separated.

Figure 53:
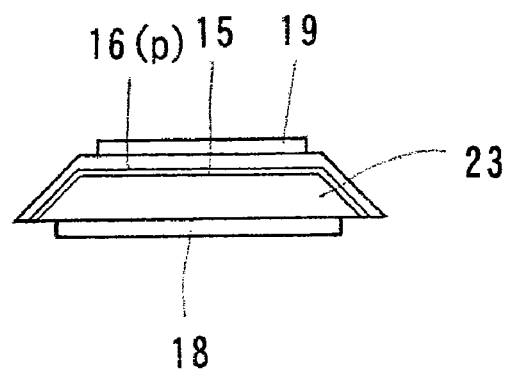

After that, as shown in FIG. 53, the n-side electrode 18 is formed onto the back surface of the n-type GaN layer 12, thereby completing the target GaN light emitting diode.

A construction other than the above construction is similar to that of the 22nd embodiment.

According to the 27th embodiment, advantages similar to those in the seventh embodiment can be obtained.

The 28th embodiment of the invention will now be described.

Figure 54:
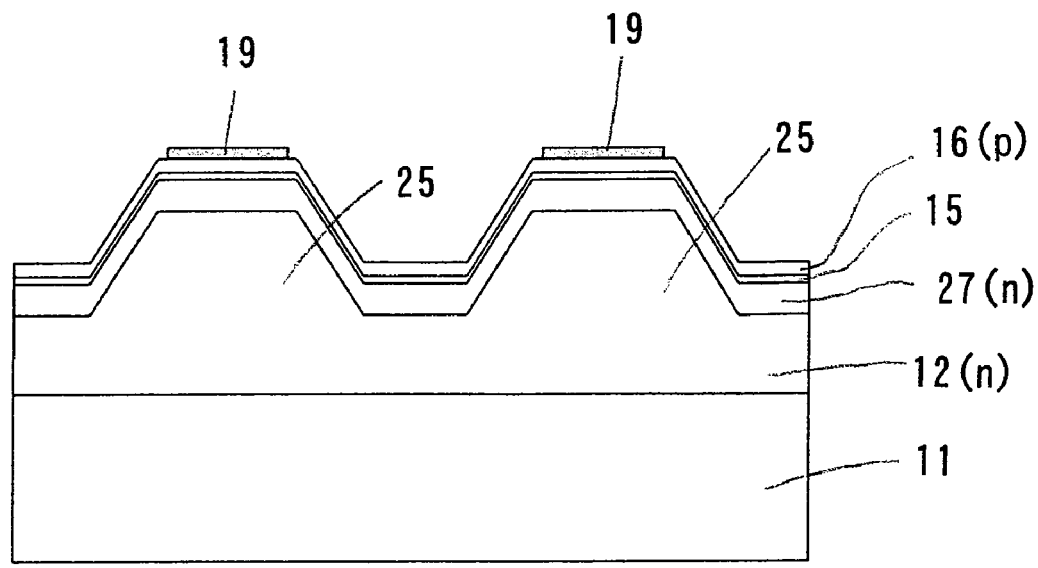
FIGS. 54 to 57 are cross sectional views for explaining a manufacturing method of a GaN light emitting diode according to the 28th embodiment of the invention.

In the 28th embodiment, as shown in FIG. 54, first, after the n-type GaN layer 12 was grown onto the sapphire substrate 11, by partially etching the surface of the n-type GaN layer 12, the tapered hexagonal cone frustum portion 25 is formed. The upper surface of the hexagonal cone frustum portion 25 consists of the C plane and, preferably, the side surface is formed so as to become an oblique surface near the S plane. A width of hexagonal cone frustum portion 25 is set to, for example, 1 to 50 μm and a height is set to, for example, 1 to 10 μm. Subsequently, the n-type GaN layer 27, the active layer 15, and the p-type GaN layer 16 are sequentially grown on the n-type GaN layer 12 in which the hexagonal cone frustum portions 25 have been formed. After that, the p-side electrode 19 is formed onto the p-type GaN layer 16 in the upper portion of each hexagonal cone frustum portion 25.

Figure 55:
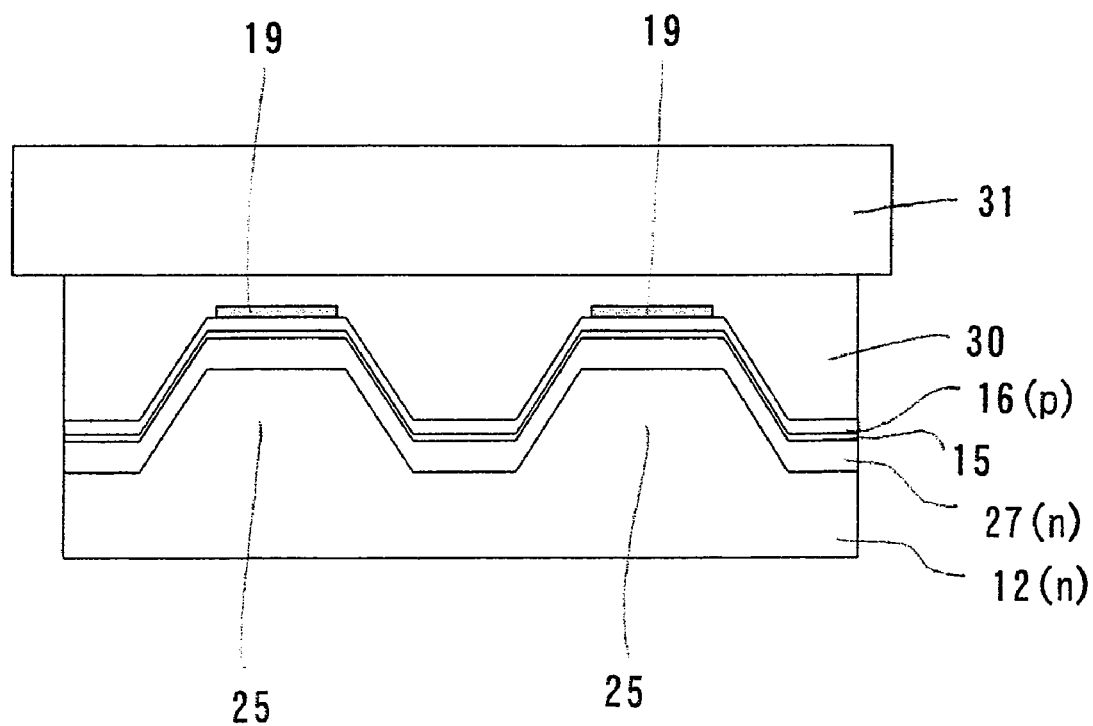

Subsequently, as shown in FIG. 55, an adhesive agent layer 30 is formed onto the surface of the p-type GaN layer 16 side where the p-side electrode 19 has been formed. After that, a supporting substrate 31 is adhered by the adhesive agent layer 30, the n-type GaN layer 27 and the portions existing on/over it are peeled off from the sapphire substrate 11.

Figure 56:
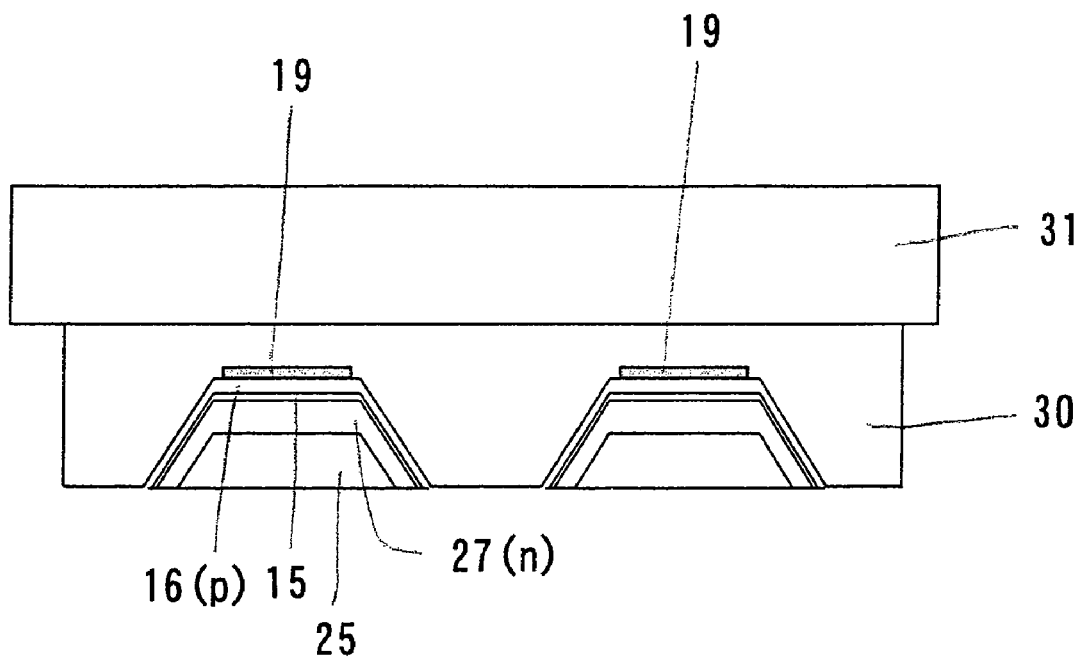

Subsequently, as shown in FIG. 56, by etching the whole surface of the n-type GaN layer 12 from the back surface side thereof, the hexagonal cone frustum portions 25 are separated from each other.

Figure 57:
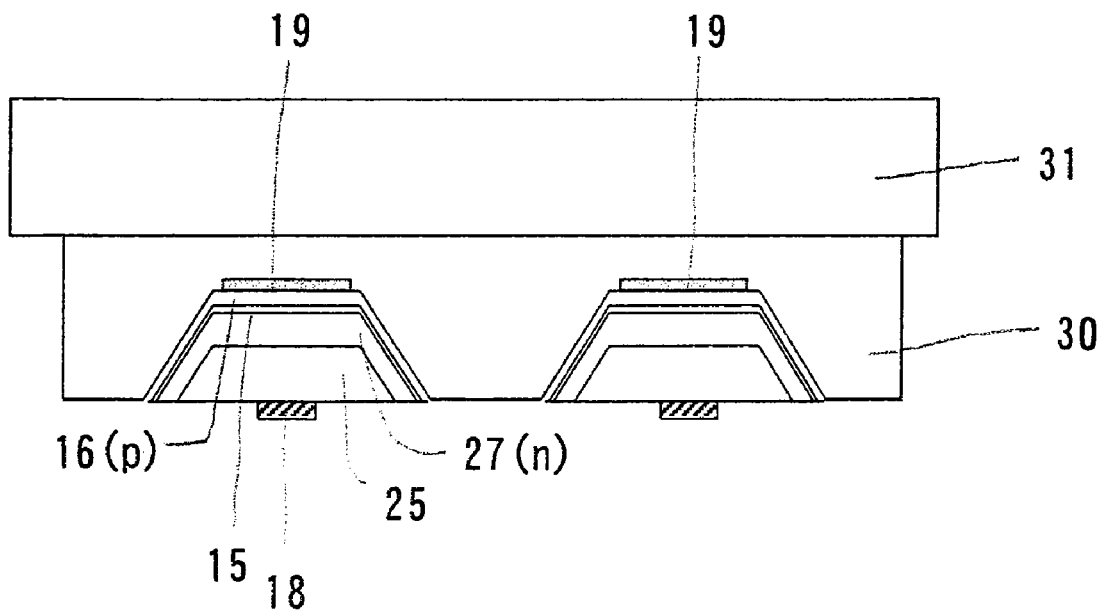

Subsequently, as shown in FIG. 57, the n-side electrode 18 is formed onto the bottom surface of the hexagonal cone frustum portion 25.

After that, by removing the adhesive agent layer 30 by etching, the hexagonal cone frustum portions 25 are perfectly separated. Thus, the GaN light emitting diode is obtained.

According to the 28th embodiment, advantages similar to those in the seventh embodiment can be obtained.

The 29th embodiment of the invention will now be described.

Figure 58:
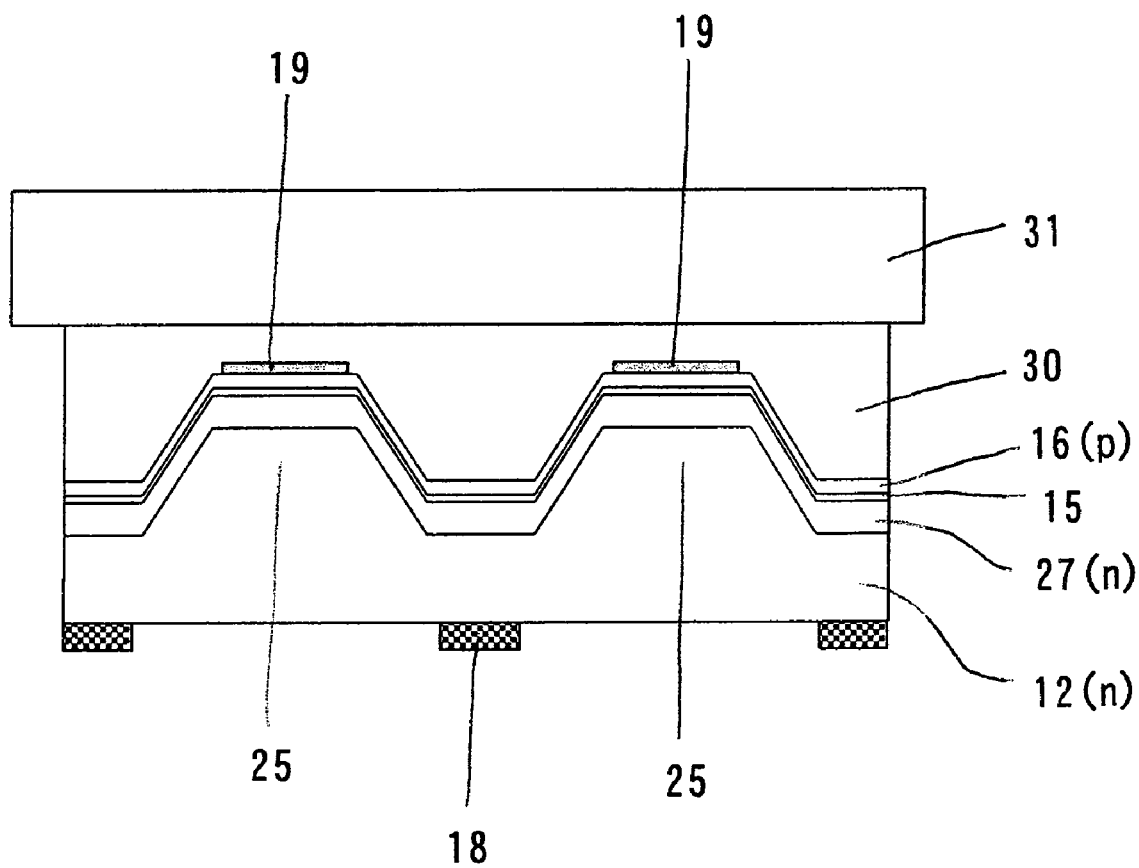
FIG. 58 is a cross sectional view for explaining a manufacturing method of a GaN light emitting diode array according to the 29th embodiment of the invention.

In the 29th embodiment, the steps are progressed in a manner similar to the 28th embodiment and the n-type GaN layer 12 and the portions existing on/over it were peeled off from the sapphire substrate 11. After that, the n-side electrode 18 is formed onto the back surface of the n-type GaN layer 12 as shown in FIG. 58. Since the light emission is caused from the active layer 15 in the portion of the upper surface of each hexagonal cone frustum portion 25 upon operation, the n-side electrode 18 is formed like a mesh onto the n-type GaN layer 12 in the portion corresponding to the portion between the hexagonal cone frustum portions 25 so as not to obstruct the light extraction. Thus, the GaN light emitting diode is obtained.

According to the 29th embodiment, advantages similar to those in the seventh embodiment can be obtained. Moreover, an advantage such that a large output can be obtained by simultaneously lighting on the GaN light emitting diodes can be obtained.

The 30th embodiment of the invention will now be described with respect to a manufacturing method of the GaN light emitting diode according to the 30th embodiment of the invention will now be described.

In the 30th embodiment, the steps are progressed in a manner similar to the 28th embodiment and the n-type GaN layer 12 and the portions existing on/over it are peeled off from the sapphire substrate 11.

Figure 59:
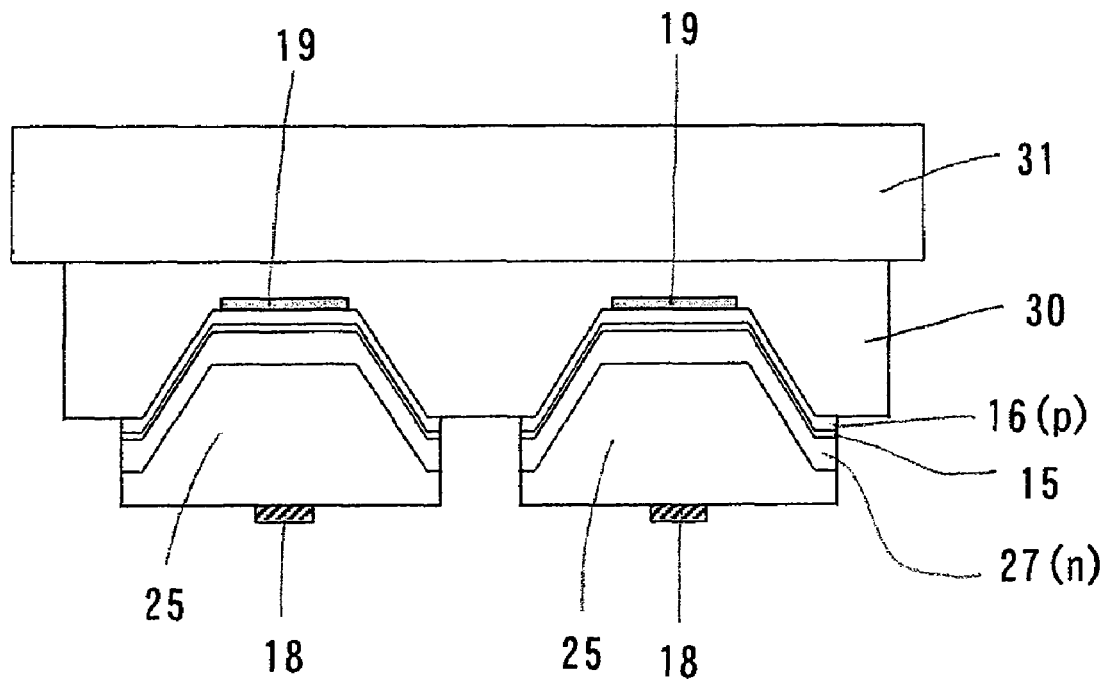
FIG. 59 is a cross sectional view for explaining a manufacturing method of a GaN light emitting diode according to the 30th embodiment of the invention.

Subsequently, by selectively etching the n-type GaN layer 12 from the back surface thereof by, for example, the RIE method, the hexagonal cone frustum portions 25 are separated from each other as shown in FIG. 59.

Subsequently, the n-side electrode 18 is formed onto the bottom surface of the hexagonal cone frustum portion 25.

After that, by removing the adhesive agent layer 30 by etching, the hexagonal cone frustum portions 25 are perfectly separated. Thus, the GaN light emitting diode is obtained.

According to the 30th embodiment, advantages similar to those in the seventh embodiment can be obtained.

The 31st embodiment of the invention will now be described.

Figure 60:
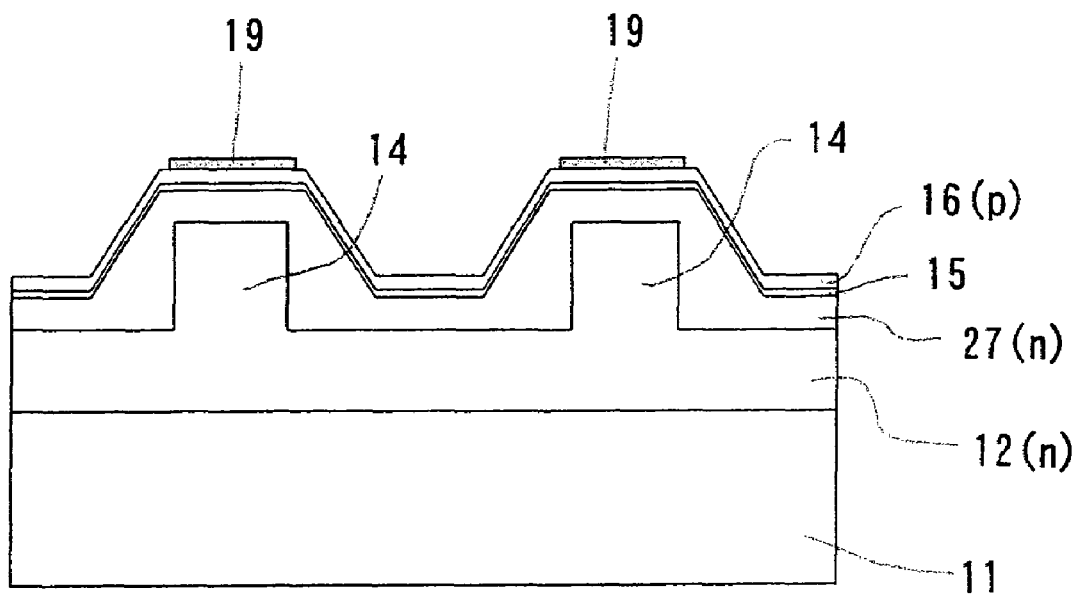
FIG. 60 is a cross sectional view for explaining a manufacturing method of a GaN light emitting diode according to the 31 st embodiment of the invention.

In the 31st embodiment, the steps are progressed in a manner similar to the 28th embodiment and the n-type GaN layer 12 is grown. After that, as shown in FIG. 60, the hexagonal prism portion 14 is formed by selectively etching the front surface of the n-type GaN layer 12 in the direction perpendicular to the substrate surface by the RIE method or the like. Subsequently, the n-type GaN layer 27, the active layer 15, and the p-type GaN layer 16 are sequentially grown on the n-type GaN layer 12 in which the hexagonal prism portion 14 has been formed. The n-type GaN layer 27 is grown so that the surface which is inclined to the substrate surface is formed in the portion of the side wall of the hexagonal prism portion 14 and the hexagonal cone frustum portion is formed as a whole.

A construction other than the above construction is similar to that of the 28th Embodiment.

According to the 31st embodiment, advantages similar to those in the seventh embodiment can be obtained.

A manufacturing method of a simple matrix driving type display according to the 32nd embodiment of the invention will now be described.

The simple matrix driving type display is shown in FIGS. 61A and 61B. FIG. 61A is a plan view and FIG. 61B is a cross sectional view taken along the line B-B in FIG. 61A.

As shown in FIGS. 61A and 61B, in the simple matrix driving type display, for example, the GaN light emitting diodes manufactured by the foregoing 28th embodiment are fixed in an array shape in predetermined positions and at regular intervals by a fixing layer 32 made of an adhesive agent or the like. Data lines 33 made of, for example, metal wirings are formed so as to mutually connect the p-side electrodes 19 of the GaN light emitting diodes arranged in one direction on the back surface of the fixing layer 32. A transparent conductive film 34 that includes ITO or the like is formed on the surface of the fixing layer 32 so as to mutually connect the n-side electrodes 18 of the GaN light emitting diodes arranged in the direction which crosses perpendicularly to the data line 33. Address lines 35 made of, for example, metal wirings are further formed on the surface of the fixing layer 32 in parallel with the transparent conductive film 34. The transparent conductive film 34 partially overlaps the address line 35 and is come into electrical contact therewith.

According to the 32nd embodiment, since the light emitting efficiency of each GaN light emitting diode is high, the simple matrix driving type display of high luminance can be realized.

A manufacturing method of the parallel simultaneous driving GaN light emitting diode array according to the 33rd embodiment of the invention will now be described.

In the 33rd embodiment, the steps are progressed and up to the process to form the mesh-shaped n-side electrode 18 is executed in a manner similar to the 28th embodiment, the GaN light emitting diode array is manufactured, and thereafter, the adhesive agent layer 30 is removed by etching, thereby peeling off the n-type GaN layer 12 and the portions existing on/over it from the supporting substrate 31.

Figure 62A:
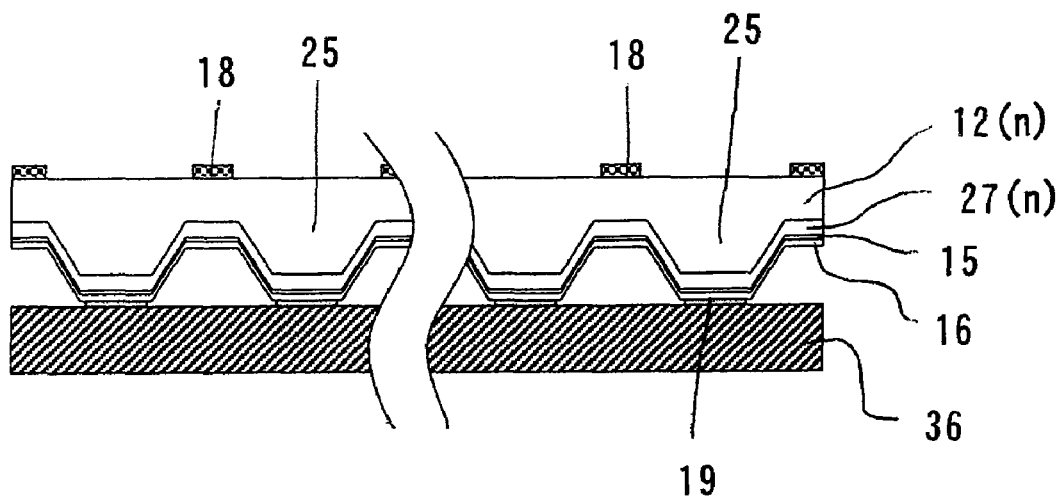
FIGS. 62A and 62B are a cross sectional view and a plan view for explaining a manufacturing method of a parallel simultaneous driving GaN light emitting diode array according to the 33rd embodiment of the invention.
Figure 62B:
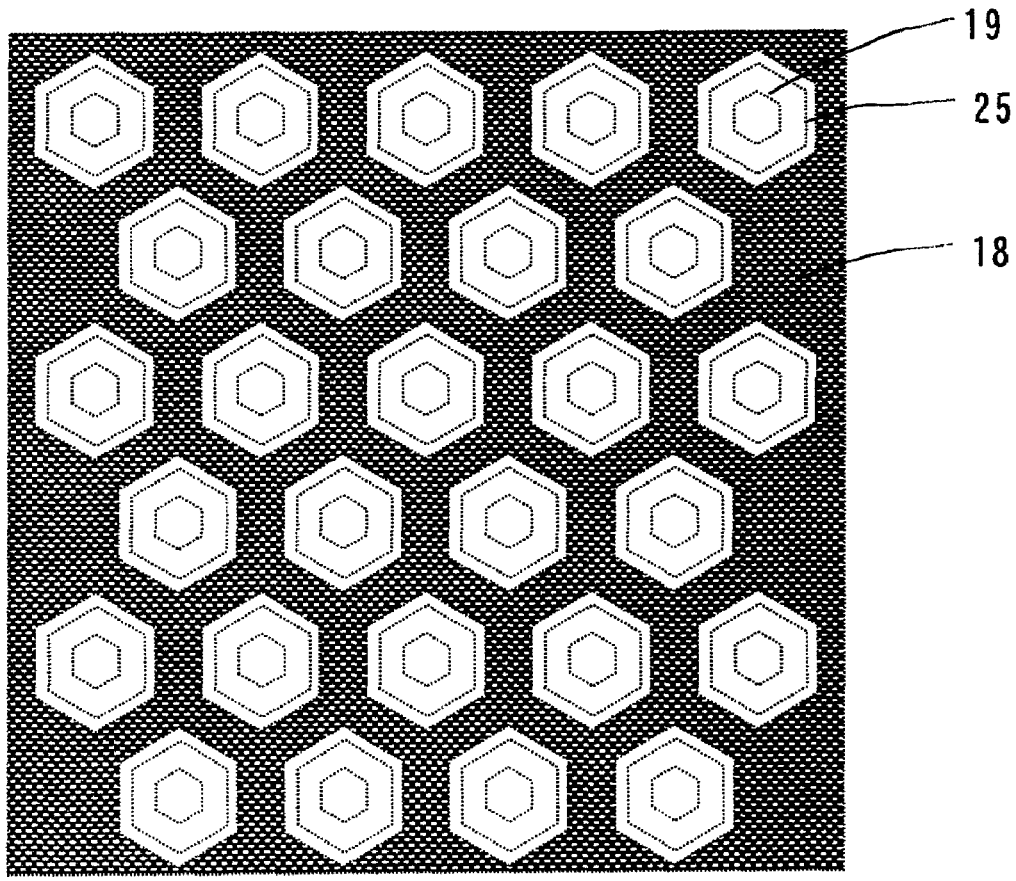

Subsequently, as shown in FIG. 62A, the p-side electrode 19 of each GaN light emitting diode of the GaN light emitting diode array is joined onto an anode electrode 36 also serving as a heat sink by soldering or the like. Thus, the parallel simultaneous driving GaN light emitting diode array is manufactured. A plan view of the parallel simultaneous driving GaN light emitting diode array is shown in FIG. 62B.

According to the 33rd embodiment, a high output light source can be realized.

Although the embodiments of the invention have specifically been described above, the invention is not limited to the foregoing embodiments but various modifications based on the technical idea of the invention are possible.

For example, the numerical values, materials, structures, shapes, substrates, raw materials, processes, and the like mentioned in the foregoing 1st to 33rd embodiments are merely shown as examples but numerical values, materials, structures, shapes, substrates, raw materials, processes, and the like which are different from them can be also used.

For example, in the foregoing 1st to 33rd embodiments, in order to improve the characteristics of the active layer 15, an AlGaN layer having excellent light containment characteristics can be provided near the active layer 15 or an InGaN layer of a small In composition or the like can be also provided. In order to obtain a reducing effect of a band gap by what is called bowing, AlGaInN can be also used by adding Al to InGaN as necessary. Further, an optical waveguide layer can be also provided between the active layer 15 and the n-type GaN layer 12 or between the active layer 15 and the p-type GaN layer 16 as necessary.

Although the sapphire substrate has been used in the foregoing 1st to 33rd embodiments, another substrate such as SiC substrate, Si substrate, or the like which has already been mentioned can be also used as necessary. Further, a GaN substrate of low dislocation density obtained by using a lateral direction crystal growing technique such as ELO (Epitaxial Lateral Overgrowth), Pendio, or the like can be also used.

Further, in the foregoing 1st to 33rd embodiments, for example, Au, Ag, or the like can be used as a material of the p-side electrode 19 and a contact metal layer having a thickness that is equal to or less than an approach length of the light emitted in the active layer 15 and that includes Ni, Pd, Co, Sb, or the like can be also formed between the p-type GaN layer 16 and the p-side electrode 19. By such a structure, the light emitting efficiency of the GaN light emitting diode can be further improved owing to the reflection enhancement effect according to the contact metal layer.

Two or more of the foregoing 1st to 33rd embodiments can be also properly combined without departing from the technical idea of the invention.

As described above, according to the invention, since the active layer and the semiconductor layer of the second conductivity type are grown onto the upper portion, particularly, the C plane of the prismatic or conical crystal portion of the semiconductor layer of the first conductivity type, the light emission can be caused only from the active layer of the excellent crystalline performance at the time of the operation of the semiconductor light emitting device. Therefore, the semiconductor light emitting device, integrated semiconductor light emitting apparatus, image display apparatus, and illuminating apparatus in which the light emitting efficiency is remarkably improved can be obtained. Since the crystal growth on the inclined crystal plane as in the conventional one is not used, the semiconductor light emitting device, integrated semiconductor light emitting apparatus, image display apparatus, and illuminating apparatus can be manufactured by simple steps.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

DESCRIPTION OF REFERENCE NUMERALS

11 SAPPHIRE SUBSTRATE
12 n-TYPE GaN LAYER
13 ETCHING MASK
14 HEXAGONAL PRISM PORTION
15 ACTIVE LAYER
16 p-TYPE GaN LAYER
17 OPENING PORTION
18 n-SIDE ELECTRODE
19 p-SIDE ELECTRODE
P PAD
20, 21, 22 WIRINGS
23 CIRCULAR CONE FRUSTUM PORTION
24 Ag FILM
25 HEXAGONAL CONE FRUSTUM PORTION
26 GROWING MASK
27, 28 n-TYPE GaN LAYER
29 INVERSE CIRCULAR CONE FRUSTUM PORTION
30 ADHESIVE AGENT LAYER
31 SUPPORTING SUBSTRATE
32 FIXING LAYER
33 DATA LINE
34 TRANSPARENT CONDUCTIVE FILM
35 ADDRESS LINE
36 ANODE ELECTRODE

The invention is claimed as follows:
1. A semiconductor light emitting device comprising:
a semiconductor layer of a first conductivity type in which one principal plane has a circular conical frustum crystal portion having a circular base and a circular upper surface that is substantially parallel with the principal plane and a side surface that is inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

2. The semiconductor light emitting device according to claim 1, wherein the crystal portion has a crystal structure of a wurtzite type.

3. The semiconductor light emitting device according to claim 1, wherein the crystal portion includes a nitride III-V group compound semiconductor.

4. The semiconductor light emitting device according to claim 1, wherein each of the semiconductor layer of the first conductivity type, the active layer, and the semiconductor layer of the second conductivity type consists of a nitride III-V group compound semiconductor.

5. The semiconductor light emitting device according to claim 2, wherein the upper surface is a C plane.

6. The semiconductor light emitting device according to claim 1, wherein the crystal portion has a circular cone frustum shape of any one of a forward taper type or an inverse taper type.

7. The semiconductor light emitting device according to claim 1, wherein the second electrode is formed in a portion excluding a peripheral corner portion of an upper surface of the semiconductor layer of the second conductivity type over the upper surface of the crystal portion.

8. An integrated semiconductor light emitting apparatus obtained by integrating a plurality of semiconductor light emitting devices each comprising:

a semiconductor layer of a first conductivity type in which one principal plane has a circular conical frustum crystal portion having a circular base and a circular upper surface that is substantially parallel with the principal plane and a side surface that is inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

9. An image display apparatus obtained by integrating a plurality of semiconductor light emitting devices each comprising:

a semiconductor layer of a first conductivity type in which one principal plane has a circular conical frustum crystal portion having a circular base and a circular upper surface that is substantially parallel with the principal place and a side surface that is inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

10. An illuminating apparatus obtained by integrating a plurality of semiconductor light emitting devices each comprising:

a semiconductor layer of a first conductivity type in which one principal plane has a circular conical frustum crystal portion having a circular base and a circular upper surface that is substantially parallel with the principal plane and a side surface that is inclined to the principal plane;

at least an active layer and a semiconductor layer of a second conductivity type which are sequentially laminated onto at least the upper surface of the crystal portion;

a first electrode electrically connected to the semiconductor layer of the first conductivity type; and a second electrode which is formed on the semiconductor layer of the second conductivity type over the upper surface of the crystal portion and electrically connected to the semiconductor layer of the second conductivity type.

* * * * *